(12) United States Patent
Verbeck, IV et al.

(10) Patent No.: US 10,876,202 B2
(45) Date of Patent: ***Dec. 29, 2020

(54) CONTROLLED DEPOSITION OF METAL AND METAL CLUSTER IONS BY SURFACE FIELD PATTERNING IN SOFT-LANDING DEVICES

(71) Applicant: University of North Texas, Denton, TX (US)

(72) Inventors: Guido Fridolin Verbeck, IV, Lewisville, TX (US); Stephen Davila, Odessa, TX (US)

(73) Assignee: University of North Texas, Denton, TX (US)

( * ) Notice: Subject to any disclaimer, the term of this patent is extended or adjusted under 35 U.S.C. 154(b) by 427 days.

This patent is subject to a terminal disclaimer.

(21) Appl. No.: 15/686,864

(22) Filed: Aug. 25, 2017

(65) Prior Publication Data

US 2018/0002806 A1    Jan. 4, 2018

Related U.S. Application Data

(63) Continuation-in-part of application No. 15/437,299, filed on Feb. 20, 2017, now abandoned, which is a
(Continued)

(51) Int. Cl.
*C23C 14/22* (2006.01)
*C23C 14/04* (2006.01)
(Continued)

(52) U.S. Cl.
CPC .............. *C23C 14/221* (2013.01); *B82B 3/00* (2013.01); *B82Y 30/00* (2013.01); *C23C 14/04* (2013.01);
(Continued)

(58) Field of Classification Search
CPC ..... B81C 2201/112; B82B 3/00; B82Y 30/00; B82Y 40/00; C23C 14/04; C23C 14/12;
(Continued)

(56) References Cited

U.S. PATENT DOCUMENTS 5,563,410 A    10/1996   Mullock
5,948,703 A    9/1999    Shen et al.
(Continued)

OTHER PUBLICATIONS

Abbet, Stephane, et al., "Synthesis of Monodispersed Model Catalysts Using Softlanding Cluster Deposition," Pure Appl. Chem., (2002), vol. 74, No. 9, pp. 1527-1535.
(Continued)

*Primary Examiner* — Anthony J Zimmer
*Assistant Examiner* — Syed T Iqbal
(74) *Attorney, Agent, or Firm* — Edwin S. Flores; Daniel J. Chalker; Chalker Flores, LLP

(57) ABSTRACT

A soft-landing (SL) instrument for depositing ions onto substrates using a laser ablation source is described herein. The instrument of the instant invention is designed with a custom drift tube and a split-ring ion optic for the isolation of selected ions and is capable of operating at atmospheric pressure. The drift tube allows for the separation and thermalization of ions formed after laser ablation through collisions with an inert bath gas that allow the ions to be landed at energies below 1 eV onto substrates. The split-ring ion optic is capable of directing ions toward the detector or a landing substrate for selected components.

18 Claims, 22 Drawing Sheets

Related U.S. Application Data continuation-in-part of application No. 14/077,911, filed on Nov. 12, 2013, now Pat. No. 9,574,263, which is a continuation of application No. 13/090,123, filed on Apr. 19, 2011, now Pat. No. 8,651,048.

(60) Provisional application No. 61/326,431, filed on Apr. 21, 2010.

(51) Int. Cl.

| | |
|---|---|
| B82B 3/00 | (2006.01) |
| C23C 14/54 | (2006.01) |
| C23C 14/12 | (2006.01) |
| B82Y 30/00 | (2011.01) |
| C23C 14/28 | (2006.01) |
| C23C 14/52 | (2006.01) |
| H01J 37/30 | (2006.01) |
| C23C 14/14 | (2006.01) |
| B82Y 40/00 | (2011.01) |

(52) U.S. Cl.
CPC .............. *C23C 14/12* (2013.01); *C23C 14/14* (2013.01); *C23C 14/28* (2013.01); *C23C 14/52* (2013.01); *C23C 14/54* (2013.01); *H01J 37/30* (2013.01); *B81C 2201/112* (2013.01); *B82Y 40/00* (2013.01)

(58) Field of Classification Search
CPC ....... C23C 14/14; C23C 14/221; C23C 14/28; C23C 14/52; C23C 14/54; H01J 2237/0812; H01J 2237/0815; H01J 2237/3142; H01J 2237/31732; H01J 37/08; H01J 37/30; H01J 37/3178
See application file for complete search history.

(56) References Cited

U.S. PATENT DOCUMENTS

| | | | | |
|---|---|---|---|---|
| 6,504,150 | B1 * | 1/2003 | Verentchikov | H01J 49/164 250/281 |
| 7,081,617 | B2 | 7/2006 | McLean et al. | |
| 8,610,058 | B2 * | 12/2013 | Verbeck, IV | H01J 49/0418 250/281 |
| 8,651,048 | B2 * | 2/2014 | Verbeck | B82B 3/00 118/715 |
| 9,574,263 | B2 * | 2/2017 | Verbeck, IV | B82B 3/00 |
| 2005/0189485 | A1 | 9/2005 | McLean | |
| 2007/0059928 | A1 | 3/2007 | Harutyunyan | |
| 2009/0011953 | A1 | 1/2009 | Cooks et al. | |
| 2009/0224147 | A1 * | 9/2009 | Mie | C07B 63/00 250/282 |

OTHER PUBLICATIONS

Alvarez, Jormarie, et al., "Preparation and in Situ Characterization of Surfaces Using Soft Landing in a Fourier Transform Ion Cyclotron Resonance mass Spectrometer," Anal. Chem., (2005), 77:3452-3460.
Asbury, G. Reid, et al., "Evaluation of Ultrahigh Resolution Ion Mobility Spectrometry as an Analytical Separatin Device in Chromatographic Terms," J. Microcolumn Separations, (2000), 12(3):172-178.
Blake, Thomas A., et al., "Preparative Linear Ion Trap Mass Spectrometer for Separation and Collection of Purified Proteins and Peptides in Arrays Using Ion Soft Landing," Anal. Chem., (2004), 76:6293-6305.
Cheng, et al., "Controlled Deposition and Glassification of Copper Nanoclusters," J Phys Chem (1994) 98:3527-3537.
Cooks, R. Graham, et al., "Collisions of Organix Ions at Surfaces," Applied Surface Science 231-232, (2004), pp. 13-21.
Davila, S. J., et al., "Drift tube soft-landing for the production and characterization of materials: Applied to Cu clusters," Review of Scientific Instruments (Feb. 22, 2010) 81:1-6.
Doye, Jonathan P.K., et al., "Magic Numbers and Growth Sequences of Small Face-Centered Cubic and Decahedral Clusters," Chemical Physics Letters, (1995), 247:339-347.
Dugourd, Philippe, et al., "High-Resolution Ion Mobility Studies of Sodium Chloride Nanocrystals," Chemical Physics Letters, (1997), 267:186-192.
Feng, B, et al., "Retrieval of DNA Using Soft-Landing after Mass Analysis by ESI-FTICR for Enzymatic Manipulation," J. Am. Chem. Soc. (1999) 121: 8961-8962.
Franchetti, V., et al., "Soft Landing of Ions as a Means of Surface Modification," International Journal of Mass Spectrometry and Ion Physics, (1977), 23:29-35.
Gafner, S.L., et al., "Formation of Structural Modifications in Copper Nanoclusters," Physics of the Solid State, (2007), vol. 49, No. 8, pp. 1558-1562.
Geohegan, David B., "Fast Intensified-CCD Photography of YBa2Cu3O7-x Laster Ablation in Vacuum and Ambient Oxygen," Appl. Phys. Letters, Jun. 1992, 60 (22):2732-2734.
Gologan, B., et al., "Ion/surface reactions and ion soft-landing," Phys. Chem. Chem. Phys., (2005), vol. 7, pp. 1490-1500.
Grigoryan, Valeri G., et al., "Structure and Energetics of Cun Clusters with (2<:N<150): An Embedded-Atom-Method Study," Physical Review, (2006), pp. 115415-0-115415-13.
Hadjar, Omar, et al., "Design and Performance of an Instrument for Soft Landing of Biomolecular Ions on Surfaces," Anal. Chem., (2007), 79:6566-6574.
Henley, Like, et al., "The Growth and Modification of Materials via Ion-Surface Processing," Surface Science, (2002), pp. 500-522.
Hill, Jr., et al., "Ion Mobility Spectrometry," Analytical Chemistry, Dec. 1, 2990, vol. 62, No. 23, 9 pages.
Hornbeck, John A., et al., "Cross Sections for Ion-Atom Collisions in He, Ne, and A," Phys. Rev., (1951), 82:458.
Jacobson, D.B., et al., "Heteronuclear Diatomic Transition—Metal Cluster Ions in the Gas Phase. The Bond Energy of FeCo+," J. Am. Chem. Soc., (1984), vol. 106, pp. 4623-4624.
Kemper, Paul R., et al., "Electronic-State Chromatography: Application to First-Row Transition-Metal Ions," J. Phys. Chem., (1991), vol. 95, pp. 5134-5146.
Leuchtner, R.E., et al., "Metal Cluster Cation Reactions: Carbon Monoxide Associated to Cu+n. Ions," The Journal of Chemical Physics, (1990), vol. 92, No. 11, pp. 6527-6537.
Levy, R. B., et al., "Platinum-Like Behavior of Tungsen Carbide in Surface Catalysis," Science (Aug. 10, 1973) 181:547-548.
Love, L.O., "Electromagnetic Separation of Isotopes at Oak Ridge" Science (Oct. 26, 1973) 182:4110, pp. 343-352.
Matsuki, Nobuyuki, et al., "Heteroepitaxial Growth of Gallium Nitride on Muscovite Mica Plates by Pulsed Laser Deposition," Solid State Communications, (2005), vol. 136, pp. 338-341.
Mayer, Philip S., et al., "Preparative Separation of Mixtures by Mass Spectrometry," Anal. Chem, (2005), vol. 77, pp. 4378-4384.
McDaniel, E.W., et al., "Tests of the Wannier Expressions for Diffusion Coefficients of Gaseous Ions in Electric Fields," Physical Review A, Mar. 1971, vol. 3, No. 3, 5 pages.
Miller,S.A., et al., "Soft-Landing of Polyatomic Ions at Fluorinated Self-Assembled Monolayer Surfaces," Science (Mar. 7, 1997) 275:1147-1150.
Nagaoka, S., et al., "Soft-Landing Isolation of Multidecker v2(benzene)3 Complexes in an Organic Monolayer Matrix: An Infrared Spectroscopy and Thermal Desorption Study," J. Am. Chem. Soc. (2007) vol. 129, pp. 1528-1529.
Ouyang, Zheng, et al., "Preparing Protein Microarrays by Soft-Landing of Mass-Selected Ions," Science, (2003), vol. 301, pp. 1351-1354.
Paszti, Z., et al., "Pressure Dependent Formation of Small Cu and Ag Particles During Laser Ablation," Applied Surface Science, (1997), vol. 109, pp. 67-73.
Peng, Wen-Ping, et al., "Ion Soft Landing Using a Rectilinear Ion Trap Mass Spectrometer," Anal. Chem., (2008), vol. 80, pp. 6640-6649.

(56) References Cited

OTHER PUBLICATIONS

Powers, D.E., et al., "Supersonic Copper Clusters," The Journal of Chemical Physics, (1983), vol. 78, pp. 2866-2881.

Rauschenbach, S., et al., "Electrospray Ion Beam Deposition of Clusters and Biomolecules," Small (2006) 2:4, pp. 540-547.

Revercomb, H.E., et al., "Theory of Plasma Chromatography/Gaseous Electrophoresis—A Review," Analytical Chemistry, Jun. 1975, vol. 47, No. 7, pp. 970-983.

Rokushika, Souji, et al., "Resolution Measurement for Ion Mobility Spectrometry," Anal. Chem., (1985), vol. 57, pp. 1902-1907.

Siudak, G, et al., "JMS Letters: Preparative Mass Spectromety with Electrospray Ionization," J. Mass Spectrom. (1999) 34:1087-1088.

Smith, Lloyd P. et al., "On the Separation of Isotopes in Quantity by Electromagnetic Means," The Physical Review, Second Series, Dec. 1, 1947, vol. 72, No. 11, pp. 989-1002.

Van Oosterhout, G.W., "Morphology of Synthetic Submicroscopic Crystals of x and y FeOOH and of yFE2O3 Prepared from FeOOH," Acta Cryst., (1960), vol. 13, pp. 932.

Verbeck, Guido F., et al., "Resolution Equations for High-Field Ion Mobility," J. A. Soc. Mass. Spectrom, (2004), vol. 15, pp. 1320-1324.

Volny, M., et al., "Surface-Enhanced Raman Spectroscopy of Soft;-Landed Polyatomic Ions and Molecules," Anal. Chem. (Jun. 15, 2007) 79:4543-4551.

Volny, Michael, et al., "Preparative Soft and Reactive Landing of Multiply Charged Protein Ions on a Plasma-Treated Metal Surface," Anal. Chem., (2005), vol. 77, pp. 4890-4896.

Wang, P., et al., "Covalent Immobilization of Peptides on Self-Assembled Monolayer Surfaces Using Soft-Landing of Mass-Selected Ions," J. Am. Chem. Soc. (Jun. 23, 2007) 129:8682-8683.

Wannier, G.H., The Bell System Technical Journal, Jan. 1953, pp. 190-210, 212-224, 226-238, 240-254.

Wannier, Gregory H., "Motion of Gaseous Ions in Strong Electric Fields," Bell Syst. Tech., (1953), 32, 85, pp. 170-188.

Watts, P., et al., "On the Resolution Obtainable in Practical Ion Mobility Systems," International Journal of Mass Spectrometry and Ion Processes, (1992), vol. 112, pp. 179-190.

Wijesundara, Muthu B.J., et al., "Preparation of Chemical Gradient Surfaces by Hyperthermal Polyatomic Ion Deposition: A New Method for Combinatorial Materials Science," Langmuir, (2001), vol. 17, pp. 5721-5726.

Yang, X., et al., "Preparative separation of multicomponent peptide mixture by mass spectrometry," J. Mass. Spectum, (2006), vol. 41, pp. 256-262.

Yergey, Alfred L., et al., "Preparative Scale Mass Spectrometry: A Brief History of the Calutron," American Society for Mass Spectrometry, (1997), vol. 8, pp. 943-953.

Yoshida, Takehito, et al., "Nanometer-Sized Silicon Crystallites Prepared by Excimer Laser Ablation inConstant Pressure Inert Gas," Appl. Phys. Letters, (Mar. 25, 1996, vol. 13, pp. 1772-1774.

\* cited by examiner

CONTROLLED DEPOSITION OF METAL AND METAL CLUSTER IONS BY SURFACE FIELD PATTERNING IN SOFT-LANDING DEVICES

CROSS-REFERENCE TO RELATED APPLICATIONS

This application claims the benefit of and is a Continuation-in-Part of U.S. patent application Ser. No. 15/437,299, filed Feb. 20, 2017, it is also a Continuation-in-Part of U.S. patent application Ser. No. 14/077,911, filed Nov. 12, 2013, a Continuation application of co-pending U.S. patent application Ser. No. 13/090,123 filed on Apr. 19, 2011, now U.S. Pat. No. 8,651,048 issued on Feb. 18, 2014, and of U.S. Provisional Patent Application Ser. No. 61/326,431, filed Apr. 21, 2010, each of which are hereby incorporated by reference in their entirety.

STATEMENT OF FEDERALLY FUNDED RESEARCH

This invention was made with U.S. Government support under Contract No. FA9550-08-1-0153 awarded by the Air Force Office of Scientific Research (AFOSR). The government has certain rights in this invention.

TECHNICAL FIELD OF THE INVENTION

The present invention relates in general to the field of ion deposition, and more particularly to "soft-landing" ions onto a suitable surface for isolation by using a low kinetic-energy ion beam.

BACKGROUND OF THE INVENTION

Without limiting the scope of the invention, its background is described in connection with ion deposition on a surface or a substrate.

U.S. Pat. No. 5,948,703 issued to Shen and Yang, 1999 describes a soft-landing etch process to form an oxide layer with uniform thickness on an open area between flash memory transistors on a substrate. A dielectric oxide layer, such as silicon dioxide, is formed on a semiconductor substrate. A polysilicon layer used to form gates of flash memory transistors is then formed on the oxide layer. The polysilicon layer is covered with a layer of conductive material, such as tungsten silicide (WSi). A cap polysilicon layer is deposited on the conductive layer. An anti-reflecting coating, such as SiON, is formed on the cap polysilicon layer. A photo-resist mask comprising a pattern defining a gate is formed on the surface of the anti-reflecting coating. The soft-landing etch process performed to expose oxide layer on the substrate area between flash memory transistors includes three etch steps. The first etch step is carried out to remove materials covering the gate polysilicon layer on the area between flash memory transistors. Then, the second etch step having high polysilicon-to-oxide selectivity is performed to remove polysilicon covering the oxide layer on the open area. The third etch step is conducted to clean polysilicon residues from the oxide layer surface on the open area.

U.S. Patent Application Publication No. 2009/0011953 (Cooks et al. 2009) discloses methods and apparatuses that utilize mass spectrometry for preparation of a surface to have catalytic activity through molecular soft-landing of mass selected ions. Mass spectrometry is used to generate combinations of atoms in a particular geometrical arrangement, and ion soft-landing selects this molecular entity or combination of entities and gently deposits the entity or combination intact onto a surface.

U.S. Pat. No. 7,081,617 issued to Mclean et al. 2006 discloses a method and device for the gas-phase separation of ionic biomolecules including peptide, and protein or inorganic cluster ions or nanoparticles by ion mobility and for depositing them intact on a surface in a spatially addressable manner. The surface onto which the proteins are deposited can be modified for the purpose of constructing microarrays of biologically relevant materials or for promoting the growth of highly ordered protein crystals.

SUMMARY OF THE INVENTION

In one embodiment, the present invention includes an apparatus comprising: an ionization region comprising a laser capable of releasing at least one of: metal ions, metal ion clusters, or metal nanoparticles, from a metal; an ion mobility region in communication with the metal comprising a plurality of electrically conductive concentric rings; a movable soft landing area comprising a surface; and a detector capable of detecting molecules, clusters or nanoparticles that land on the surface of the soft landing area. In one aspect, the apparatus further comprises a safety housing to contain the laser or ions. In another aspect, the apparatus is capable of operating at atmospheric pressure. In another aspect, the ionization region comprises a laser is an incident beam laser, a pulsed laser, a Nd:YAG laser. In another aspect, the metal is silver, gold, molybdenum, or nickel. In another aspect, the apparatus is equipped to deposit the metal generated by laser ablation, vacuum hardware, and a manipulator for detector coverage. In another aspect, a noble gas is introduced into at least one of: the ionization region, the ion mobility region or the movable soft landing area. In another aspect, the detector is at least one of: secondary ion mass spectrometry (SIMS), infrared spectroscopy (IR), x-ray photoelectron spectroscopy (XPS), gas-chromatography (GC-MS), high-performance liquid chromatography (HPLC), or matrix-assisted laser desorption/ionization mass spectrometry (MALDI-MS). In another aspect, the ion mobility region comprises a plurality of metal rings that are resistively coupled. In another aspect, the movable soft landing area comprises a soft-landing ion mobility (SLIM) instrument.

In another embodiment, the present invention includes a method for detecting particles comprising: ionizing at least one of: metal ions, metal ion clusters, or metal nanoparticles, from a metal with a laser capable of releasing the metal ions, metal ion clusters, or metal nanoparticles, from the metal; introducing the metal ions, metal ion clusters, or metal nanoparticles into an ion mobility region in communication with the metal comprising a plurality of electrically conductive concentric rings; separating the metal ions, metal ion clusters, or metal nanoparticles by charge and size onto a movable soft landing area comprising a surface; and detecting the molecules with a detector capable of detecting, clusters or nanoparticles that land on the surface of the soft landing area. In one aspect, the apparatus is capable of operating at atmospheric pressure. In another aspect, the ionization region comprises a laser that is an incident beam laser, a pulsed laser, a Nd:YAG laser. In another aspect, the metal is silver, gold, molybdenum, or nickel. In another aspect, the apparatus is equipped to deposit the metal generated by laser ablation, vacuum hardware, and a manipulator for detector coverage. In another aspect, the method further comprises introducing a noble gas that is introduced into at least one of: the ionization region, the ion mobility region or the movable soft landing area. In another aspect, the method further comprises detecting with at least one of: secondary ion mass spectrometry (SIMS), infrared spectroscopy (IR), x-ray photoelectron spectroscopy (XPS), gas-chromatography (GC-MS), high-performance liquid chromatography (HPLC), or matrix-assisted laser desorption/ionization mass spectrometry (MALDI-MS). In another aspect, the ion mobility region comprises a plurality of metal rings that are resistively coupled. In another aspect, the movable soft landing area comprises a soft-landing ion mobility (SLIM) instrument.

The present invention describes a soft-landing (SL) instrument that is capable of depositing ions onto substrates for preparative and developmental research of new materials using a laser ablation source. This instrument of the instant invention was designed with a custom drift tube and a split-ring ion optic for the isolation of selected ions. The drift tube allows for the separation and thermalization of ions formed after laser ablation through collisions with an inert bath gas allowing the ions to be landed at energies below 1 eV onto substrates. The split-ring ion optic directs the ions toward the detector or a landing substrate for selected components.

In one embodiment the present invention discloses a soft-landing (SL) method for depositing or patterning one or more ions, ionized nanoclusters, metal-ligand complexes, polymers, biopolymers or combinations thereof, for liquid crystal formation, for controlled deposition of lubricants into MEMS devices, and for preparing catalytic surfaces comprising the steps of: (i) providing a SL instrument comprising a drift tube and a split-ring ion optic, (ii) ionizing a target, a sample, a composition or combinations thereof comprising at least one component capable of generating one or more ions by laser ablation in the SL instrument, (iii) separating and thermalizing the one or more ions in the drift tube of the SL instrument by collision with a high pressure inert bath gas or gas mixture contained in the drift tube, (iv) directing the thermalized ions using the split-ring ion optic from the drift tube to a detector or to a landing surface, and (v) soft-landing the ions on the landing surface.

The SL instrument as described in the method of the instant invention comprises: a four-way and reducing cross housing with one or more standard conflate (CF) flanges, a SL chamber housed in the four-way and reducing cross housing wherein the chamber comprises: an opening or a quartz view-port attached to the four-way cross, wherein a laser pulse or radiation enters the chamber through the opening or the view-port and a linear/rotational feed through line directly opposite the opening or the view-port, wherein the feed through line is inline with the incident radiation or pulse and may optionally be attached directly to the sample, a sample holder or a target, a drift tube comprising: a plurality of steel rings coupled by a series of vacuum resistors, a plurality of thread rods isolated by spacers attached to two outer guard rings, and one or more spacers placed in between the steel rings, wherein the spacers comprise sapphire spheres, two split rings placed at the two ends of the drift tube, wherein the split rings direct an ion cluster beam emanating from the drift tube, a rail system to hold and adjust a detector that monitors the ion beam and collects a drift tube spectra and a landing surface for depositing or patterning the one or more ions, and a quick door (CF) flange to remove or replace the detector, the landing surface, and the sample.

In one aspect of the method disclosed hereinabove the instrument operates at pressures ranging from 1 to 100 Torr. The method of the instant invention further comprising the step of characterizing the prepared surface by one or more physical characterization techniques. Selected from the group consisting of Secondary Ion Mass Spectrometry (SIMS), X-ray photoelectron spectroscopy (XPS), Atomic Force Microscopy (AFM), X-Ray Diffraction, Optical Interference Measurements (OIM), and scanning electron microscopy (SEM). In another aspect the high pressure inert gas comprises helium, argon, nitrogen, and mixtures and combinations thereof, wherein the high pressure gas thermalizes the ions to energies ranging between 0.01 and 1.0 eV. In yet another aspect the landing surface is selected from the group consisting of Fe, Cr, Cu, Si, Mica, Au, $TiO_2$, a diamond surface, Ni, and $BaSO_4$. In specific aspects the surface is a Mica surface and the target is a Copper target.

In another embodiment the instant invention provides a system for depositing or patterning one or more ions, ionized nanoclusters, metal-ligand complexes, polymers, biopolymers or combinations thereof by soft-landing (SL) comprising: (i) a four-way and reducing cross housing with one or more standard conflate (CF) flanges, (ii) a laser source capable of generating a laser pulse or radiation for an ionization of a target, a sample, a composition or a combination thereof, (iii) a SL chamber housed in the four-way and reducing cross housing wherein the chamber comprises: an opening or a quartz view-port attached to the four-way cross, wherein the laser pulse or the radiation enters the chamber through the opening or the view-port and a linear/rotational feed through line directly opposite the opening or the view-port, wherein the feed through is in line with the incident radiation or pulse and is attached directly to the sample, a sample holder or a target, wherein an electric potential can be optionally applied to the sample or the target supported by a fabricated porcelain or a machinable glass ceramic, (iv) a drift tube for separating and thermalizing the one or more ions by collisions with a high pressure inert bath gas or gas mixture contained in the drift tube, wherein an electric potential can be applied to the drift tube, wherein the drift tube comprises: a plurality of steel rings coupled by a series of vacuum resistors, a plurality of thread rods isolated by spacers attached to two outer guard rings, and one or more spacers placed in between the steel rings, wherein the spacers comprise sapphire spheres, (v) two split rings placed at the two ends of the drift tube, for directing an ion cluster beam emanating from the drift tube, wherein a pulsed voltage can be applied to the split rings, (vi) a high voltage power supply for powering the drift tube, generating an electric field for the migration of the one or more ions, and providing a voltage to a first half of the split rings at one end of the drift tube, wherein the voltage is either a positive voltage or a negative voltage selected depending on a type of ion being analyzed, (vii) a pulsing circuit for providing either a lower positive or a lower negative pulsed voltage in comparison to the drift tube voltage to a second half of split rings at the other end of the drift tube for a specified period of time, wherein the period of time encompasses a desired ion peak, wherein the pulsing circuit comprises: an optocoupler switch activated by one or more light emitting diodes (LEDs) and an integrated circuit (IC) metaloxide-semiconductor field effect transistor driver, (viii) a rail system to hold and adjust a detector that comprises a Faraday plate connected to a preamp and an oscilloscope, wherein the detector monitors the ion beam and collects a drift tube spectra and a landing surface for depositing or patterning the one or more ions, (ix) a quick door (CF) flange to remove or replace the detector, the landing surface, and the sample, and (x) a rotary vane rough pump for allowing the system to attain a low pressure in a relatively short time.

The system as described herein further comprises one or more instruments for physical characterization selected from the group consisting of Secondary Ion Mass Spectrometry (SIMS), X-ray photoelectron spectroscopy (XPS), Atomic Force Microscopy (AFM), X-Ray Diffraction, Optical Interference Measurements (OIM), and scanning electron microscopy (SEM). In one aspect the system operates at pressures ranging from 1 to 100 Torr. In another aspect the high pressure inert gas comprises helium, argon, nitrogen, and mixtures and combinations thereof. In yet another aspect the high pressure gas thermalizes the ions to energies ranging between 0.01 and 1.0 eV.

In one aspect the power supply provides a voltage ranging between 100 and 3000 V. In another aspect the power supply creates an uniform electric field ranging between 5 and 150 V/cm. In yet another aspect the landing surface is selected from the group consisting of Fe, Cr, Cu, Si, Mica, Au, $TiO_2$, a diamond surface, Ni, and $BaSO_4$. In a specific aspect the surface is a Mica surface and the target is a Copper target.

Yet another embodiment of the present invention provides for a soft-landing method for depositing one or more copper ions on a mica surface comprising the steps of: providing a copper target, a copper sample, a copper composition or combinations thereof comprising at least one component capable of generating one or more copper ions by laser ablation in a SL instrument system, ionizing the copper target by laser ablation in the SL instrument system, separating and thermalizing the one or more ions in the drift tube of the SL instrument system by collision with a high pressure helium gas in a drift tube of the SL instrument system, directing the thermalized ions using a split-ring ion optic from the drift tube to a mica landing surface, and soft-landing the copper ions on the mica surface.

The SL instrument system as described hereinabove comprises: a four-way and reducing cross housing with one or more standard conflate (CF) flanges, a pulsed Nd:YAG laser 1064 and 532 nm laser source operating at 2 Hz for the ionization of the copper target, a SL chamber housed in the four-way and reducing cross housing wherein the chamber comprises: an opening or a quartz view-port attached to the four-way cross, wherein the laser pulse enters the chamber through the opening or the view-port and a linear/rotational feed through line directly opposite the opening or the view-port, wherein the feed through is in line with the incident radiation or pulse and is attached directly to the copper target, wherein an electric potential can be optionally applied to the copper target supported by a fabricated machinable glass ceramic, a high voltage power source for powering the drift tube and generating an electric field for the movement of the copper ions, wherein the high voltage power source is also used to apply a potential to a first half of the split-ring attached to one end of the drift tube, a drift tube comprising: a plurality of steel rings coupled by a series of vacuum resistors, a plurality of thread rods isolated by spacers attached to two outer guard rings, and one or more sapphire sphere spacers placed in between the steel rings, two split rings placed at the two ends of the drift tube, for directing a copper ion cluster beam emanating from the drift tube, a pulsing circuit for providing a lower negative pulsed voltage in comparison to the drift tube voltage to a second half of split rings at an other end of the drift tube for a specified period of time, wherein the period of time encompasses a desired copper ion peak, wherein the pulsing circuit comprises: an optocoupler switch activated by one or light emitting diodes (LEDs) and an integrated circuit (IC) metaloxide-semiconductor field effect transistor driver, a rail system to hold and adjust a Faraday detector and a mica landing surface in the housing, wherein the Faraday plate detector is connected to a preamp and an oscilloscope, wherein the detector monitors the copper ion beam and collects a drift tube spectra, wherein the mica landing surface is positioned for depositing or patterning the one or more ions, and a quick door (CF) flange to remove or replace the detector, the landing surface, and the sample, and a rotary vane rough pump for allowing the system to attain a low pressure in a relatively short time.

The method as described above further comprises a blanking procedure comprises the step of: providing a mica landing surface, powering on the SL instrument system, with the exception of the laser source, running the SL instrument system for a time period equivalent to the time required to perform the soft landing method of the instant invention, removing the mica landing surface at the end of the time period, and characterizing the mica surface by one or more surface characterization techniques selected from the group consisting of Secondary Ion Mass Spectrometry (SIMS), X-ray photoelectron spectroscopy (XPS), Atomic Force Microscopy (AFM), X-Ray Diffraction, Optical Interference Measurements (OIM), and scanning electron microscopy (SEM).

The method of the instant invention further comprises the step of characterizing the mica deposited copper surface by one or more physical characterization techniques selected from the group consisting of Secondary Ion Mass Spectrometry (SIMS), X-ray photoelectron spectroscopy (XPS), Atomic Force Microscopy (AFM), X-Ray Diffraction, Optical Interference Measurements (OIM), and scanning electron microscopy (SEM). The method of the instant invention generates one or more $Cu_n^+$ ions, $CuO^+$ ions, $Cu_nO_m^+$ ion clusters, and combinations and modifications thereof.

BRIEF DESCRIPTION OF THE DRAWINGS

For a more complete understanding of the features and advantages of the present invention, reference is now made to the detailed description of the invention along with the accompanying figures and in which:

(FIG. 6A) image of a blank mica surface showing the 001 surface. FIGS. 6B-6D are images of the surface after 3 h of deposition using 1064 nm Nd:YAG. FIG. 6B shows a 3D representation of the surface, with Cu bridging a defect in the lower left corner. The striation pattern can be seen in this image as well. FIG. 6C is a high resolution image of the surface 600 DPI at 0.5 Hz scan shows the striation pattern of the surface. FIG. 6D shows striations on the surface after landing and a defect on the surface that was not filled in during deposition emphasizing a low deposition energy of 1 eV.

FIG. 10A is a micrograph of a fingermark treated with a common organic matrix through the spray method, FIG. 10B is a zoomed micrograph of spray-treated fingermark, FIG. 10C is a zoomed micrograph of spray-treated fingermark showing the agglomeration of matrix crystals on ridges, FIG. 10D is a micrograph of a "dry-wet" matrix deposition method on a fingermark, FIG. 10E is a micrograph spotted with a matrix solution, FIG. 10F is a scanning electron micrograph (SEM) image showing the undisturbed fingermark post deposition of AgNPs via soft-landing, FIG. 10G is a micrograph showing a zoomed SEM image showing the wide distribution of NPs evenly distributed between ridges and valleys of the fingermark, FIG. 10H is a micrograph of a zoomed section from FIG. 10G, where a distribution of various sized NPs can be seen.

FIG. 15A shows the visible ridges of a fingerprint post SLIM deposition of silver. FIG. 15B shows a zoomed image where collections of chemicals and nanoparticles alike can be detected.

FIG. 16A shows a zoomed SEM image of soft-landed AgNPs on silicone substrates. FIG. 16B shows an EDX spectrum of soft landed AgNPs.

DETAILED DESCRIPTION OF THE INVENTION

Figure 1A:
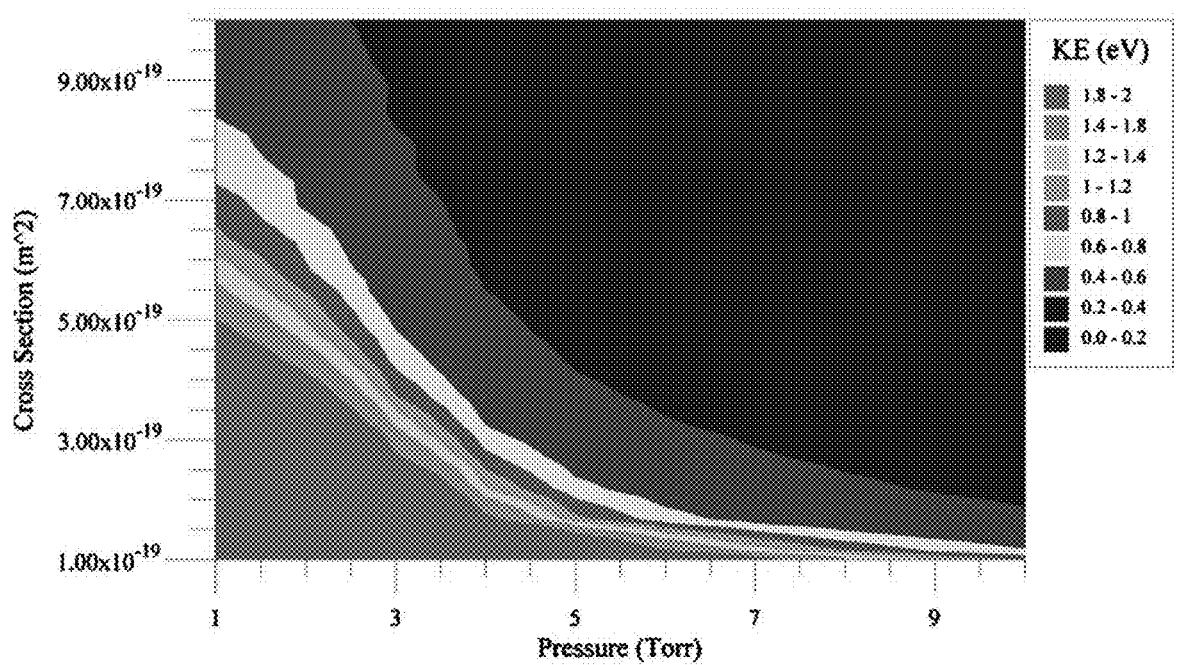
FIGS. 1A and 1B show KE contour plot graphs based on calculations from Eq. 3 by using study parameters and by varying collisional cross section ($m^2$) vs pressure (E=9.0 V/cm) (FIG. 1A) and electric field (V/cm) vs pressure ($\Omega=3.55\times10^{-19}$ $m^2$) (FIG. 1B)

While the making and using of various embodiments of the present invention are discussed in detail below, it should be appreciated that the present invention provides many applicable inventive concepts that can be embodied in a wide variety of specific contexts. The specific embodiments discussed herein are merely illustrative of specific ways to make and use the invention and do not delimit the scope of the invention.

To facilitate the understanding of this invention, a number of terms are defined below. Terms defined herein have meanings as commonly understood by a person of ordinary skill in the areas relevant to the present invention. Terms such as "a", "an" and "the" are not intended to refer to only a singular entity, but include the general class of which a specific example may be used for illustration. The terminology herein is used to describe specific embodiments of the invention, but their usage does not delimit the invention, except as outlined in the claims.

The term "soft-landing" in its broadest sense usually refers to and is used herein to refer to, non-destructive capture of a gas-phase ion on a target, such that it can be retrieved from the vacuum system of the mass spectrometer and identified or otherwise analyzed or used.

As used herein the term "ion" refers to an atom or molecule in which the total number of electrons is not equal to the total number of protons, giving it a net positive or negative electrical charge.

The term "flange" as used herein is generally understood as a separable connecting element and is defined in The American Heritage Dictionary, Second College Edition, 1991, as "a protruding rim, edge, rib or collar", as on a wheel or a pipe shaft, used to strengthen an object, hold it in place, or attach it to another object.

The term "X-ray diffraction" (XRD) refers to the reflection of definite and characteristic angles from space lattices of crystal of X-rays which have been caused to bombard them, thus giving data for identification of characteristics lattice structure of a given species of material. The X-ray diffraction technique is well known to those skilled in the art. See, e.g., pages 652-658 of Volume 14 of the McGraw-Hill Encyclopedia of Science & Technology (McGraw-Hill Book Company, New York, 1977).

The present invention describes the application and design of an instrument for Soft-landing mass spectrometry for deposition and patterning of metal and metal cluster ions onto a suitable surface for isolation. The present inventors' pattern these ions on the surface using a very controlled ion beam from a 1000 eV to 0.001 eV ion beam produced from an ion selection device (i.e. Drift Tube, Quadrupole Mass Spectrometer, Time-of-Flight Analyzer, and Sector Devices). Because of the low kinetic energy of the ion beam, it is possible to introduce a small field at the landing surface to help control ion deposition. By patterning conductive electrodes in an insulator, and applying small voltages (1 uV to 1 kV), penetrating fields come through the insulative or semi-insulative landing surface to steer the incoming ion beam. Circular, linear, single-point, and electrodes can all create a desired landing pattern. The present invention can be used to pattern any ion onto a surface. This could be used in semiconductor, new electronic devices, liquid crystal formation or controlled deposition of lubricants into MEMS devices.

The invention further discloses the design and fabrication of a drift tube SL instrument that is unique from mass spectrometer SL instruments in that it operates at pressures ranging from 1 to 100 Torr rather than the usual high vacuum conditions. The instrument of the instant invention is capable of specifically selecting and soft landing a cluster of a particular mobility that would greatly reduce the time it takes to characterize a specific cluster system from current traditional deposition methods and allow for the characterization of separated ions within the drift tube. Also, with the increases in pressure, a list of more suitable substrates could be attained.

The concept of producing and controlling structures on an unprecedented small scale was proposed by Richard Feynman at the annual meeting of the American Physical Society in 1959. Since that time research and development has revealed that nanoscale structures can have novel optical, magnetic, electronic, and mechanical properties. Indeed, significant changes in chemical reactivities have been observed when adding only a single atom to a certain cluster size. However, such studies are still rare mainly because of the lack of suitable instrumentation and methodology. Further understanding and exploitation of the physical and chemical properties of nanometer-scale structures would benefit greatly from the capacity to tailor their synthesis in a well-controlled manner. Such capability requires the development of methodologies for synthesis and separation of monodisperse nanoconstructs of desired composition and size, management of their delivery to well-defined substrates, and preservation of their structure and functionality subsequent to deposition. Unprecedented flexibility in fabrication of novel nanostructures would result from such a capability.

Mass spectrometry (MS), a technique traditionally used for mass determination and structural characterization, is inherently suited for use in nanoscale research. That is, it is more generally a gas-phase chemical laboratory enabling the sorting, manipulation, and reaction of charged gas-phase species via their mass-to-charge ratio, with isotopic specificity, from elemental to molecular to macromolecular constructs of thousands of atoms. For example, although after MS separation the purified ionic materials normally are lost during the detection process, it is instead possible to collect them intact. The collection of mass-separated isotopes of uranium ions following collisions with surfaces is well known from operations carried out at Oak Ridge during the Manhattan project.[1] Mass-isolated metal cluster ions have been deposited on magnesium oxide to prepare specific catalysts, and the exact sizes of Au, Pd, and Ni clusters that produce the highest catalytic activity for CO oxidation were determined.[2] More recently, preparative methods and instrumentation have been developed that enable measurable quantities of mass-selected, gas-phase organic and protein ions to be recaptured in the condensed-phase.[3] In these examples, it is important to note that the desired species were not formed by reaction in the mass spectrometer, but were simply introduced into the instrument as part of a complex mixture of similar components. That is, MS was used only as a means for separation and subsequent collection of monodisperse nanostructures from the heterogeneous population of preformed clusters. Conversely, the capabilities of MS for scaled cluster synthesis via gas-phase ion processes have been exploited as well. For example, using ion/molecule reactions (scaling-up) followed by collision-induced dissociation (scaling-down), small heterodimer metal clusters have been assembled in the gas phase.[4] Of considerable potential as well, ion/ion reactions of mass-selected precursors have been demonstrated for generation of large, multi-unit molecular systems. In both instances, however, the mass spectrometer served only as a confining device for investigation of the synthesis, reactivity, and characteristics of gas-phase ions.

Given the above, the concept of using the capabilities of mass spectrometry to form a comprehensive strategy for nanofabrication appears to have enormous potential for nanoscience. The present invention discloses a novel strategy for nanofabrication: the use of MS for tailored molecular-level synthesis of gas-phase building blocks via a step-by-step "bottom-up" approach combined with the capacity for mass-selective segregation and deposition of condensed-phase, monodisperse nanostructures. Knowledge and insight gained from the studies of the present invention can be used to determine in which situations the identity of resultant monodisperse clusters can be controlled, optimized, and exploited to manage synthetic outcomes for nanoscale structures. At the same time, the advanced instrumentation described herein will afford nanoscience the capability of providing new types of fundamental information, thus benefiting the general scientific community.

Example 1. Soft-Landing (SL) of Ionized Nanoclusters, Metal-Ligand Complexes, Polymers, and Biopolymers The soft-landing (SL) of ionized nanoclusters, metal-ligand complexes,[5] polymers,[6] and biopolymers[7] intact on a hard surface is not a trivial task, but not novel either, in the sense that it was developed over a quarter century ago.[8] SL is used for the isolation, purification, and characterization of ionized compounds (proteins, catalyst, clusters, etc.), and research in this area has become more active within the past decade.[9-11] SL instruments typically utilize mass spectrometers to isolate and land compounds with quadrupoles,[11,12] rectilinear ion traps,[10] sectors,[13] and ion cyclotron resonance.[14,15] The amount of kinetic energy (KE) (10-100 eV) used to land ions in current instrumentation can be high in order to study the self assembly of ions on certain substrates, as the translational energy associated with this KE would allow the ions to move around and aggregate on the substrate surface. The design and fabrication of the drift tube SL instrument as described herein is unique from mass spectrometer SL instruments in that it operates at pressures ranging from 1 to 100 Torr rather than the usual high vacuum conditions. High pressure gas within the drift tube thermalizes the ions to between 0.01 and 1.0 eV, allowing further characterization of deposited materials. The ability of the instrument to specifically select and soft land a cluster of a particular mobility would greatly reduce the time it takes to characterize a specific cluster system from current traditional deposition methods and allow for the characterization of separated ions within the drift tube. Also, with the increase in pressure, a list of more suitable substrates could be attained.

The operating principle of the SL instrument described herein is the narrowing of the KE distribution of the ions traveling through a drift tube filled with a neutral buffer gas. The conditions at which the drift tube operates are important parameters to consider during a SL experiment as changes in pressure (P), temperature (T), field strength (E), and ion's collisional cross section with a buffer gas ($\Omega$) affect its mobility within the drift tube. Separation is based on probing the differences in ion migration. The mobility of the ion (K) can be calculated [Eq. 1], with (m) ion mass, (M) mass of the buffer gas, (z) charge of the ion, (e) elementary charge, (kb) Boltzmann's constant, (T) buffer gas temperature, (N) number density of the gas inside the instrument, and (E0) field strength. The average KE is calculated using classical mechanics assuming the internal temperature of the ion is the same as the buffer gas and that interactions between the ion and neutral molecules are negligible. In order to determine SL energy of the ion,[16-18]

$$K = \frac{3}{16} \frac{ze}{N} \left(\frac{1}{m} + \frac{1}{M}\right)^{1/2} \left(\frac{2\pi}{k_b T}\right)^{1/2} \frac{1}{\Omega}, \quad (1)$$

$$v_d = \frac{L}{t_d} = KE_0. \quad (2)$$

The KE of the ion within the drift tube is calculated by substituting the velocity in the KE equation with mobility. The value of the energy of the ion can be determined from [Eq. 3].

$$K_E = \frac{18\pi z^2 e^2 R^2}{512 k_b N_A} \times \frac{E^2 T}{P^2 \Omega^2} \times \left(1 + \frac{m}{M}\right). \quad (3)$$

Figure 1B:
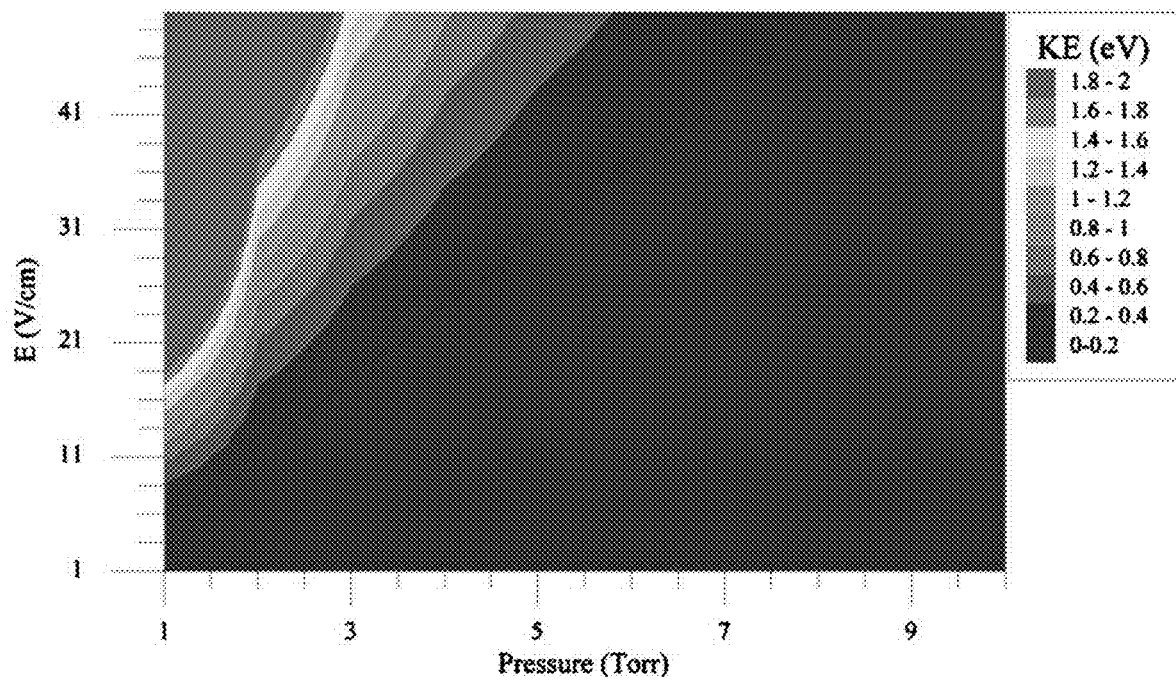

This relation allows the calculation of the KE of the ion based on the operational parameters of the study. The contour plots in FIGS. 1A and 1B show the decrease in KE as a function of the cross section and pressure while KE increases as a function of temperature and field. This trend is expected [Eq. 3] as the temperature and field terms are proportional to the energy of the ion while the pressure and cross-section terms are inversely proportional. Based on these plots, the operator can set the parameters of the drift tube to create the sub-eV landing conditions of the ions onto the substrate. Topics such as diffusional broadening of the ion packet in the x, y plane, high-field and low-field mobility, resolution based on the high and low field mobility, and an in depth description of theory and calculations have been previously described.[16,19-25]

Figure 2:
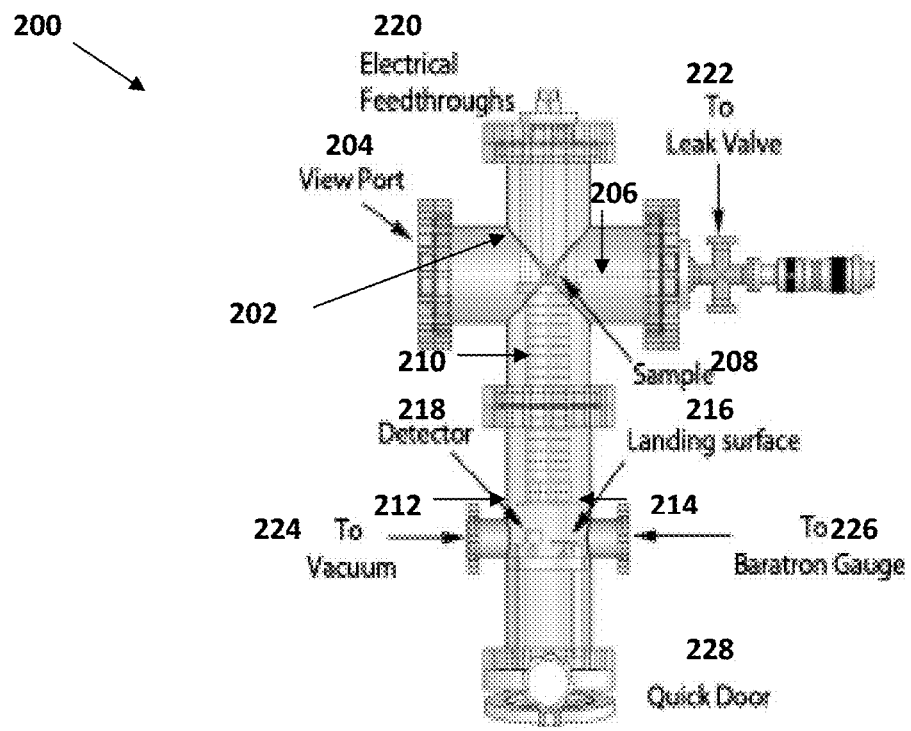
FIG. 2 is a schematic CAD of the SL instrument.

Instrument Design: A multitude of commercially available and customized components have been utilized in the design and construction of the instrument of the present invention. FIG. 2 depicts the SL chamber 200 and a number of its components, which are housed in a four-way and a reducing cross 202 along with standard conflat (CF) flanges (MDC Vacuum, Hayward, Calif.). This SL instrument 200 utilizes laser ablation, drift tube separation, and a Faraday plate as detector. The laser ablation and cluster formation is explained in greater detail in a different section of the disclosure. A pulsed Nd:YAG (Minilite, Continuum, Santa Clara, Calif.) beam enters the chamber via a quartz viewport 204 attached to the four-way cross 202. Directly opposite the viewport 204 is a linear/rotational feedthrough in line 206 with the incident radiation. The sample 208 is attached directly to the feedthrough 206 but is isolated from ground by a 0.25 in. diameter, 6 in. long piece of Macor® (Corning, Corning, N.Y.). A metal sample, or sample of the users choosing, is placed 0.25 in. from and at an angle of 55° relative to the entrance of the drift tube 210. The advantages of this sample system are that multiple sample sizes and shapes can be accommodated to fit within the chamber, along with the possibility of applying an electric potential to these samples during ablation. The drift tube 210 is comprised of 20 stainless steel rings 2 in. outer diameter 1.25 in. inner diameter resistively coupled together by a series of 5 M$\Omega$ vacuum resistors (Caddock Electronics, Riverside, Calif.), and compressed by three pieces of all thread rods isolated by alumina spacers through two outer guard rings. A spacing of 0.05 in. is created between each ring by sapphire spheres. The drift tube 210 has a unique design of 18 concentric rings accompanied by two split rings 212 and 214. The two split rings are placed at the end of drift tube 210 and direct the ion cluster beam either to the landing surface 216 or to the detector 218. A pair of high voltage power supplies (PS300/PS350, Stanford Research System, Sunnyvale, Calif.) (Electrical Feedthroughs 220) provide a voltage between 100 and 3000 V (either positive or negative depending on the type of ion that is to be analyzed) that is applied to the drift tube 210, creating a uniform field between 5 and 150 V/cm and is defined by Eq. (1).[26] The ion optic split-ring assembly at the end of the drift tube has a potential that is in line with that of the drift tube; where the other halves of the two rings are pulsed down to a lower voltage either negative or positive for a set time period corresponding to a peak based on the drift tube spectra.[27] This gating allows to select the specific size cluster and deposit it on the substrate. The gating task is accomplished through a home built pulsing circuit, which will pulse down the voltage on one side of the split rings causing the ions to be directed toward the higher potential side of the rings moving the ions toward the landing surface 216 and away from the detector 218.

Figure 3:
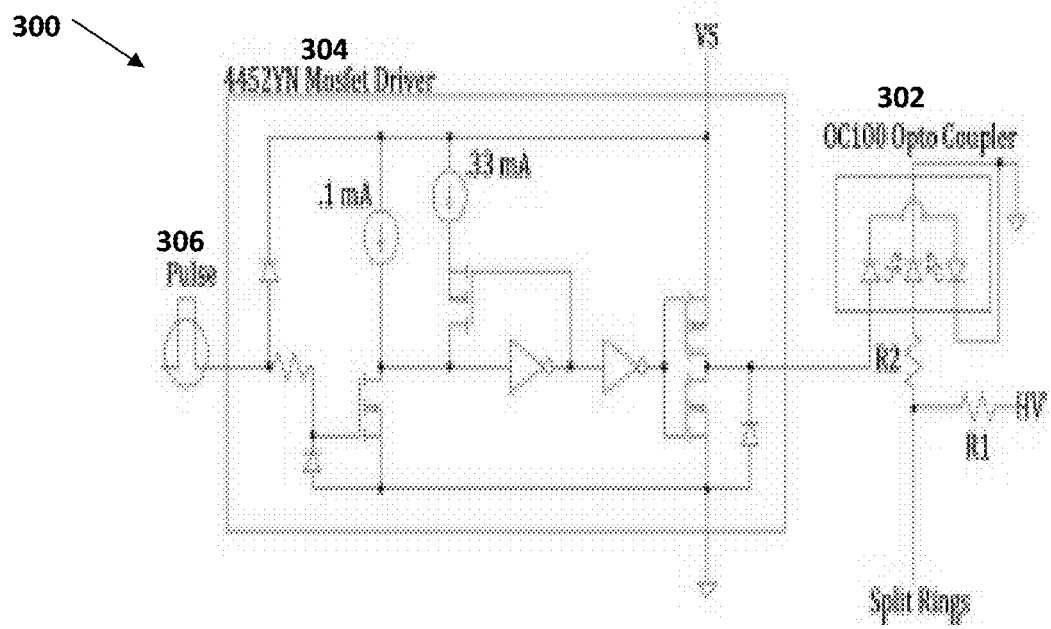
FIG. 3 is a circuit schematic of the split ring pulsing circuit. The OC100 optocoupler is an optical switch (Voltage Multiplier, Inc.) that when pulsed closes the photodiode and allows the circuit to be completed. The 4452YN IC Driver (Micrel, Inc.) boosts the pulse's current to enough to drive the optocoupler completing the voltage divider for the pulse down.

The circuit schematic is given in FIG. 3, which shows the pulsing circuit 300 and its components that utilizes an optocoupler, (OC100, Voltage Multiplier Inc., Visalia, Calif.) 302 and an Integrated Circuit (IC) metaloxide-semiconductor field effect transistor driver (4452YN, Micrel Inc., San Jose, Calif.) 304. The optocoupler 302 is a switch that operates when the light emitting diodes are activated by the pulse 306. This pulse 306 opens the switch to ground and divides the voltage creating a pulse down effect. The drift tube 210 is mounted to a 6 in. CF zero-length reducing flange by two pieces of 0.5 in. stainless steel hexagonal stock held in place with cap head screws. Collisions with the buffer gas thermalize the ions and separate the clusters formed via the laser ablation, based on their collisional cross sections. He gas is introduced through a leak valve 222 and the instrument 200 operates at a pressure between 1 and 100 Torr. Various buffer gases ($H_2$, Ar, and $N_2$) may be used in the drift tube studies. A custom rail system, along with a quick door CF flange, is incorporated into the instrument 200 as a means to hold, adjust, and remove the landing surface 216 and detectors 218 without having to disassemble the instrument 200, reducing the number of gaskets used. The SL detector deployed in the instrument 200 is a simple Faraday plate 218 connected to a preamp (SR570, Stanford Research Systems, Sunnyvale, Calif.) and then to an oscilloscope (TDS3034B, Tektronix, Beaverton, Oreg.) to monitor the ion beam and collect the drift tube spectra. The detector was chosen for its ease of construction, operability, and robustness in low vacuum applications. Landing surfaces were chosen based on their relative flatness. Ideally a 001 surface is preferred, but a wide array of surfaces may be used. A 15 mm [atomic force microscopy (AFM)] grade V-1 Muscovite mica disk (SPI Supplies, West Chester, Pa.) was employed the landing surface by the present inventors. This instrument 200 is capable of handling various modified landing surfaces 216 and sizes by simply changing the sample mount through the quick door 228. An accompanying 8.2 cubic feet per minute (cfm) rotary vane rough pump (DS 302, Varian, Palo Alto, Calif.) allows the instrument to reach the low millitorr region (4-8 mTorr) in a relatively short time (less than 10 min).

Experimental Method: Data obtained using the drift tube SL instrument 200 of the present invention consists of the laser ablation of a Cu target by a pulsed Nd:YAG 1064 and 532 nm laser operating at 2 Hz. A buffer gas (99.999% He) is introduced into the chamber via a variable leak valve 222 until a pressure of 8 Torr is achieved (measurement of pressure is done with a baratron pressure gauge 226, MKS, Andover, Mass.). A high voltage variable power supply set to (200 V dc) is used to power the drift tube 210 and create the required field for ion travel through the drift tube 210. Amplification and detection of the Faraday plate detector 218 signal is accomplished via a preamp and an oscilloscope averaging the signal over 16 intervals to obtain the spectra. Cluster isolation and selectivity is done through the pulsing of the split rings 214 and 214 at the end of the drift tube 210. A higher voltage between −250 and −238 V (−238 V used during studies) is applied to the other half of the split rings during this time. Then the split rings are pulsed down to −80 V using the home built pulsing circuit for a duration that encompasses the desired peak. During this pulse, the ions drift toward the stronger field and land on the surface. The landing surface 216 utilized for these studies was an AFM grade V-1 muscovite mica surface characterized by x-ray diffraction (XRD) (not shown) and chosen due to its preferred orientation in the 001 direction. The mica surface is cleaved and positioned 0.125 in. away from the end of the drift tube 210. A metal plate biased at −250 V behind the sample keeps the ions moving toward the landing surface 216. Characterization of the instrument 200 was developed through a series of studies which had the instrument 200 operating for a period of 1-3 h in 1 h intervals allowing the laser to cool for a 30 min period before resuming operation. The study begins by taking an initial blank of a freshly cleaved mica surface and placing it into the instrument. All study parameters are set to the values mentioned above and turned on, except for the laser. The purpose of this blanking procedure is to ensure that the mica surface is smooth and that no foreign objects or deposition is taking place due to the instrument or pump oil being introduced back into the instrument. The blank time is set for the same amount as the actual SL run (3 h). The sample is then removed via the quick door 228 for characterization via AFM to ensure that nothing has been deposited on the surface 216 and that it is relatively smooth from the cleaving process. After AFM confirmation of the surface 216 has been completed, the inventors then proceed to place the surface back into the chamber and repeat the above mentioned steps this time with the laser activated and aligned to the target surface. After the study is complete, the sample 216 is removed for characterization using AFM.

Figure 4:
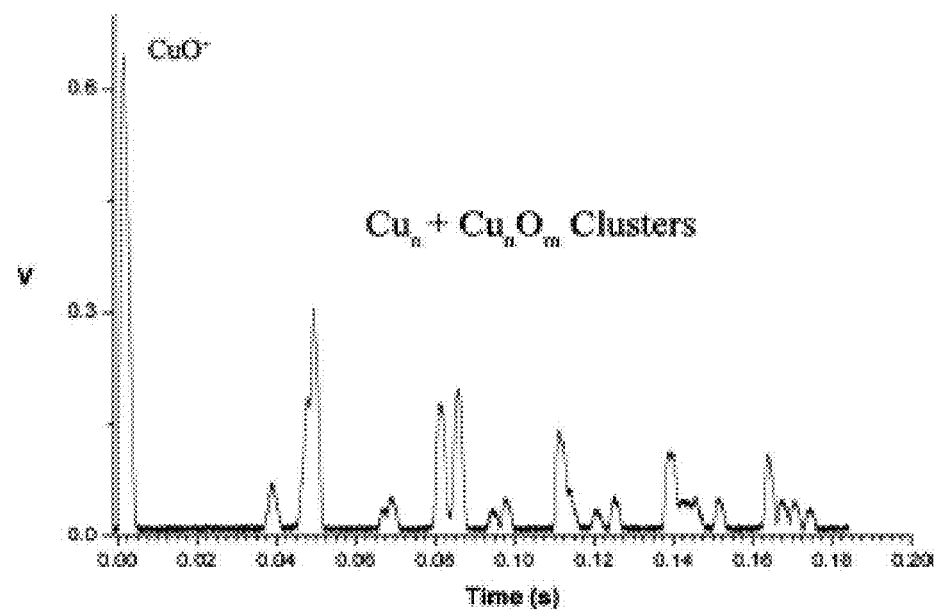
FIG. 4 shows the drift tube spectra of laser ablated Cu with a 1064 nm Nd:YAG at a pressure of 8 Torr. Peak assignments correspond to $CuO^+$ with the remaining $Cu_n$, $Cu_nO_n$ clusters corresponding to stable magic number (n=13, 55, 75 . . . ) clusters.

Results: A. Identification of peaks: The laser ablation of the Cu target at 8 Torr of He gas exhibits a spectrum (FIG. 4) that contains multiple peaks (22 counted in the spectra). Calculations for cross sections, mobilities, and reduced mobilities were carried out for the corresponding $Cu_n+$ and $Cu_nO_m+$ clusters along with their respective isomers. The current theory for the formation of $Cu_nO_m$ clusters is the presence of surface oxides within the drift tube, due to oxygen contamination of metal and the chamber. Similar $O_2$ contamination was observed in previous Cu cluster work at high vacuum conditions.[28,29] The first peak of the spectra corresponds to CuO+ based on drift velocity (vd) and mobility (K) the reduced mobility was calculated to be 15.56 cm2 $V^{-1}$ $s^{-1}$. The reduced mobility of Cu+ given by Kemper/Bowers is 15.7 $cm^2$ $V^{-1}$ $s^{-1}$ and was used as the basis to ensure the calculations for CuO+ were within a reasonable value.[30] The reduced mobility of CuO+ is expected to be less than that of Cu+ due to the larger cross section of the ion. Based on calculations of the first peak, the remaining peaks in FIG. 4 correspond to magic number stable structures (n=13, 38, 55, 75, . . . ) and their isomers.[31-34] Formation of these large nanoclusters is due in part to the laser ablation of metal in the presence of an inert gas. When ablation occurs in an inert atmosphere, cluster size becomes dictated by the pressure at which the event occurs.[35,36] Previous studies based on this pressure dependence have shown that at low pressure (1 Torr) smaller sized clusters tend to be dominant, but as the pressure increases larger sized clusters begin to form within the ion plume.[35-37] A time of flight mass spectrometer is currently in development, which would allow for high resolution identification each cluster structure.

Figure 5:
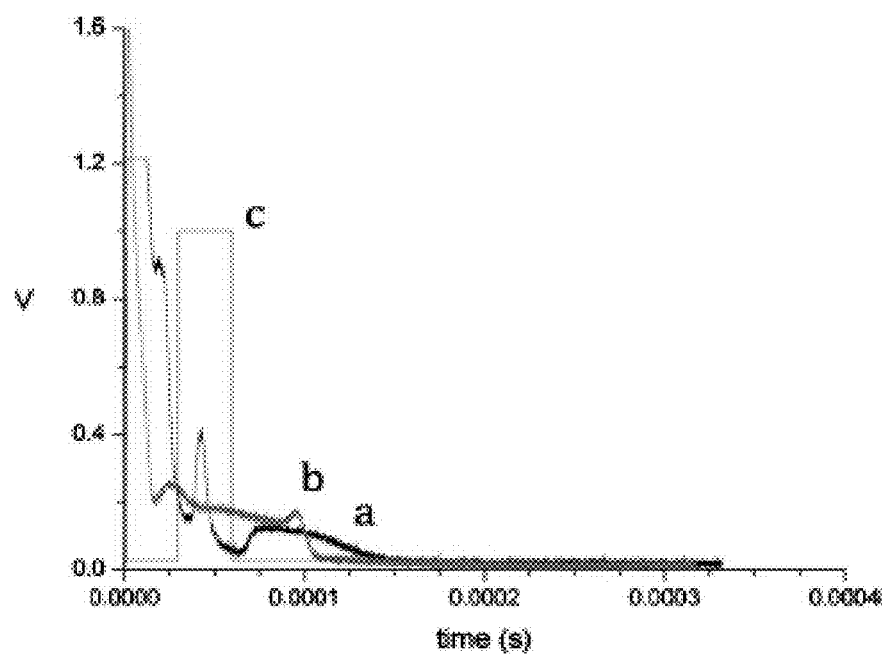
FIG. 5 shows the overlaid spectra of split-ring operation. (a) spectra of Cu clusters with split-ring voltage uniform with that of the drift tube (−240 V), (b) spectra with split-ring pulsed down to (−80 V) the spectra changes and peak 3 drops out of the spectra for the duration of the pulse, (c) square pulse.

B. Cluster isolation using split rings: Isolation of a specific cluster is accomplished using the split rings and a custom built circuit (FIG. 3) to obtain the spectrum in FIG. 5. The split ring is pulsed and the spectrum of $Cu_n$ (n=1-4) changes as $Cu_3$ moves away from the detector. The $Cu_3$ peak is dropped out using a pulse delay generator timed for the selected cluster. FIG. 5 shows the overlaid spectra, which consists of the square wave pulse, unpulsed complete spectrum, and the pulsed spectrum minus the selected peak. The split ring ion optic device at the end of the drift tube gives us a dynamic range to select clusters with a limitation based only on the electronic's slew rate.

Figure 6A:
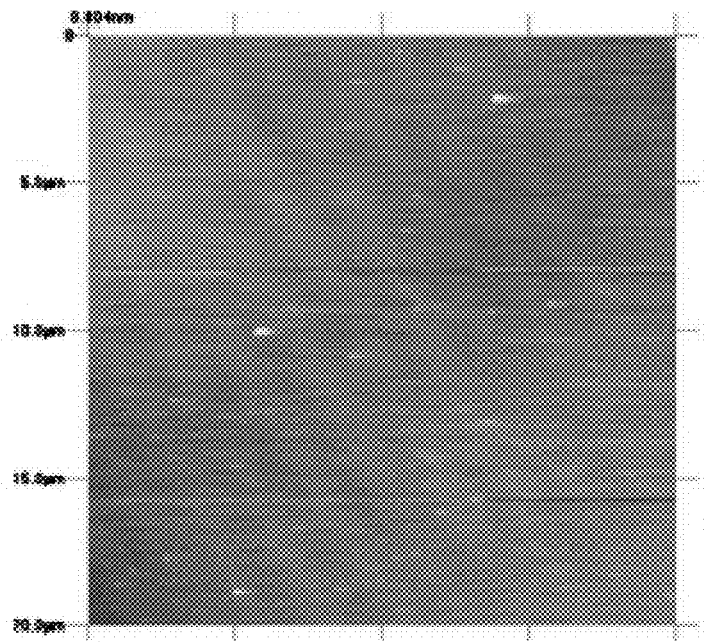
FIGS. 6A-6D show the AFM images of the muscovite mica surface.
Figure 6B:
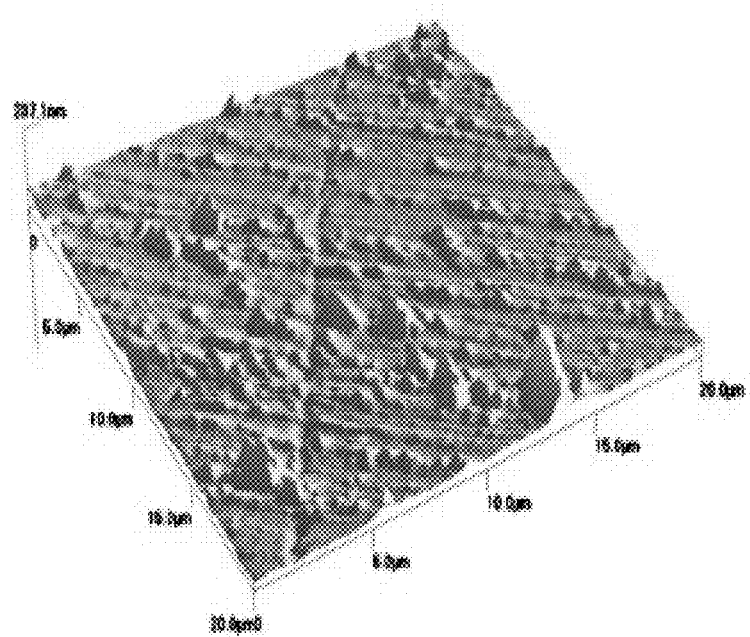
Figure 6C:
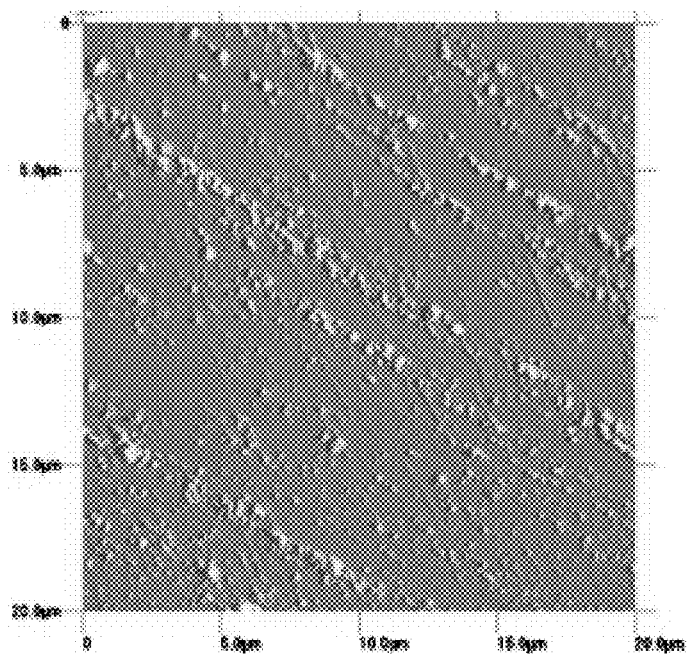
Figure 6D:
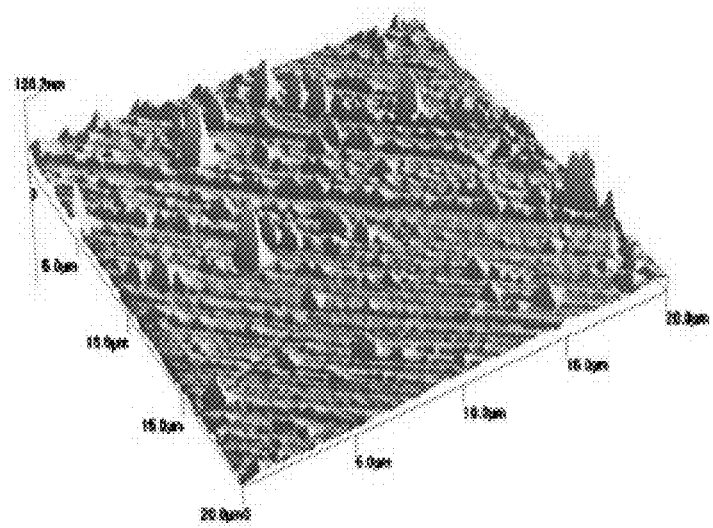
Figure 7A:
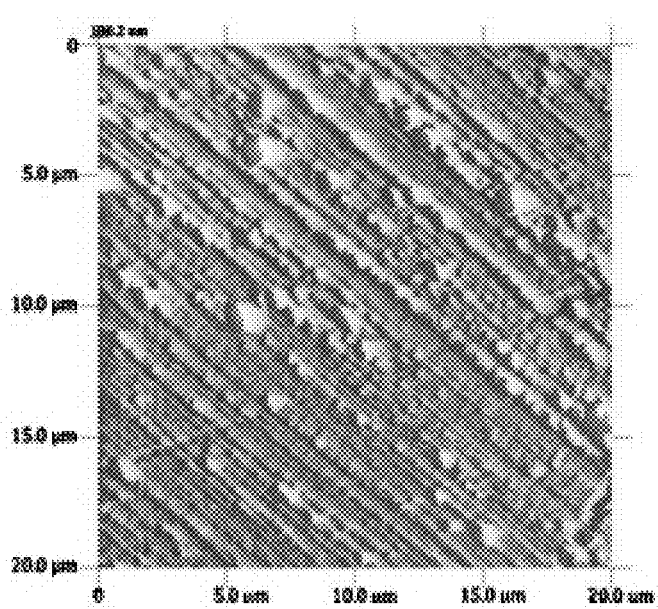
FIGS. 7A and 7B are images showing the SL vs PVD comparison. The SL deposited surface (FIG. 7A) shows surface buildup in striation/columnar fashion; and the PVD surface (FIG. 7B) shows a uniform deposition taking place instead of an alignment in one direction like SL.
Figure 7B:
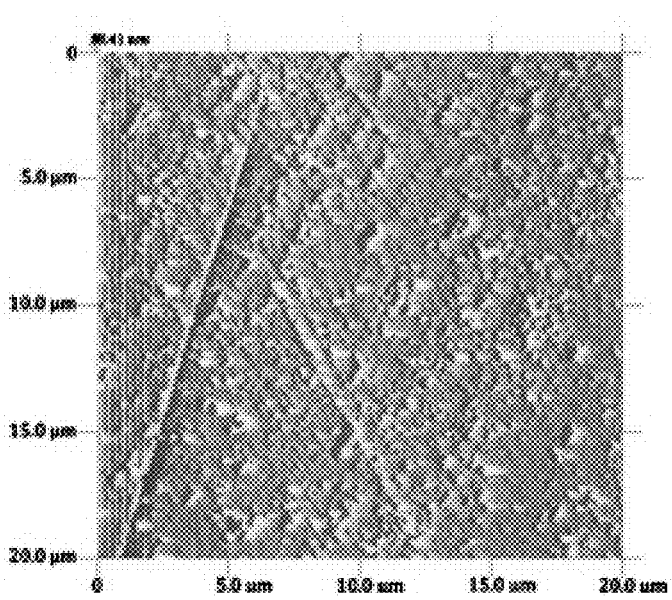

AFM characterization of Cu deposition: AFM characterization of soft-landed surfaces is used to validate the presence of deposited clusters and/or self assembly on the landing surface. AFM images 20×20 μm² were taken with a Quesant Q-Scope (Ambios Technology, Santa Cruz, Calif.) operating in wave mode with a Si cantilever. FIG. 6 is comprised of a set of four AFM images a blank FIG. 6A and three (FIGS. 6B, 6C, and 6D) of the soft-landed surface. Upon landing on the surface, any charge the ion has will migrate to the surface in an attempt to become stable. Since the landing energy is sub-eV once on the surface the ions have little mobility along the surface and will tend to deposit in bands of conductivity along the mica surface due to K, Fe or Mg present within the lattice, but the exact composition of the conductivity band depends on the mica's origin (mica varies from source to source). After the initial landing on the surface, subsequent ions will land on previously landed Cu allowing the ions to migrate their charge more readily through Cu than it is for the ion to find a new spot to land on the surface of the mica. AFM images (FIG. 6C) of the landing surface show a heteroepitaxial growth in a columnar/striation fashion from soft landing clusters on the surface. The blank mica AFM image in FIG. 6A exhibits the 001 surface previously characterized by XRD meaning the deposition and assembly of the Cu in columnar fashion is due to the SL on the surface. Another factor may be chemical. Since the system is at low vacuum, the surface of the mica may have absorbed water on the surface from the atmosphere after cleaving, which may contribute to the deposition as well.[38,39] The images in FIGS. 6B and 6D show the bridging of a defect on the surface of the mica. In the lower left corner of the image, it is observed the Cu clusters actually bridge across the defect and not fill in the defect as one would observe with energetic deposition such as physical vapor deposition (PVD) and chemical vapor deposition. The tendency with high energy species (ions and molecules) is for them to be deposited on the surface, move around finding and filling in the defects causing a uniform heteroepitaxial growth to occur as all the defects are continuously filled in. In contrast, SL with its low energy deposition (<1 eV), will experience growth and assembly in a columnar fashion as the ions, once deposited, do not have the energy necessary to be mobile along the surface. A comparison and verification of the soft-landed deposition is required to ensure that SL is different from that of PVD. A freshly cleaved muscovite surface was taken and placed in a deposition chamber and pumped out to a pressure of $4\times10^{-6}$ Torr, with a piece of 99.99% pure oxygen free Cu that is to be deposited. The deposition duration was timed for a period of 25 s with a thickness monitor reporting a deposition of 2.3 nm on the surface. AFM images were taken of the surface for a comparison between PVD and SL (FIGS. 7A and 7B). FIG. 7A shows the SL surface while the FIG. 7B shows the PVD surface. The PVD surface image shows a uniform deposition has taken place and begins to form across the surface, and a cross hatch pattern is seen along the surface as well. Comparing the two images, the alignment and direction of the Cu columns from SL become more apparent, justifying the soft-landed deposition is different from that of PVD. Though the SL deposition of Cu onto the mica substrate has been shown, the exact mechanism of deposition and assembly of the surface is not yet understood. The unique columns and growth may lead to the growth of nanowires for use in microelectromechanical systems.

The present invention describes the design and implementation of a drift tube SL. The characterization of soft-landed metal ion clusters using laser ablation in the presence of He has been tested herein and shown as viable source for the preparative production of a metal ion clusters. The outfitting of this instrument with different types of ionization sources will allow it to be a versatile SL instrument ranging from the SL of biomaterials, to the formation of new or rare materials for isolation and characterization. The present inventors have shown that drift tube SL is a novel technique for the SL of ions. The emergence of new high pressure ion optic components and higher resolution drift tubes will allow us greater control and separation of the ion beam for SL purposes.

Example 2. Nanoparticle Deposition Workstation for the Mass Spectrometry Imaging of Fingerprints for the Enhancement of Intelligence and Forensic Data Gathering Advancements in the characterization of latent fingerprints are crucial to the improvement of accurate criminal identification. While fingerprint characterization has been the fundamental basis of criminal histories worldwide, the continuous growth of the human population has resulted in exponential numbers of fingerprints for comparison and analysis. In 1999, the Integrated Automated Fingerprint Identification System (IAFIS) was launched by the Federal Bureau of Investigation (FBI), and today it houses the fingerprint information for more than 70 million individuals along with their corresponding criminal histories, mug shots, scars, and other distinguishing physical characteristics. Importantly, but frequently overlooked is that locked within the ridges of the fingerprints there also exists a vast amount of chemical information that could improve the identification of criminals, enhance the forensic evidence found during criminal investigations, and increase the information gathered from crime scenes.

According to the FBI's 2015 Crime Clock statistics, a violent crime occurs every 26.3 seconds in the United States. Investigations of these crimes are often dependent on personal accounts and eyewitness statements, which can be biased or misleading. While the fingerprint of someone under investigation may be present in the forensic evidence or at the crime scene, it does not necessarily provide concrete evidence that physical contact occurred. The method, developed here, is a new chemical method for fingerprint analysis that moves beyond obtaining only ridge pattern characterizations, but it also allows for analyzing the chemical composition located within the fingerprint ridge patterns. The endogenous species found within fingerprints, such as lipids and fatty acids, may be able to provide details about the individual's health and lifestyle. In contrast, the exogenous compounds within the fingerprint can also provide information regarding the environmental elements of the individual's contact with drugs, explosives, or other foreign materials. Adding such information to the history of an individual identified can aid greatly to the forensic evidence of a criminal investigation, especially physical assaults. Due to the physical contact that occurs within an assault, sebaceous oils that are naturally secreted by the human body can be transferred. These oils can not only help determine if the assault took place, but also provide a possible map as to what areas of contact were present in the assault.

Figure 8:
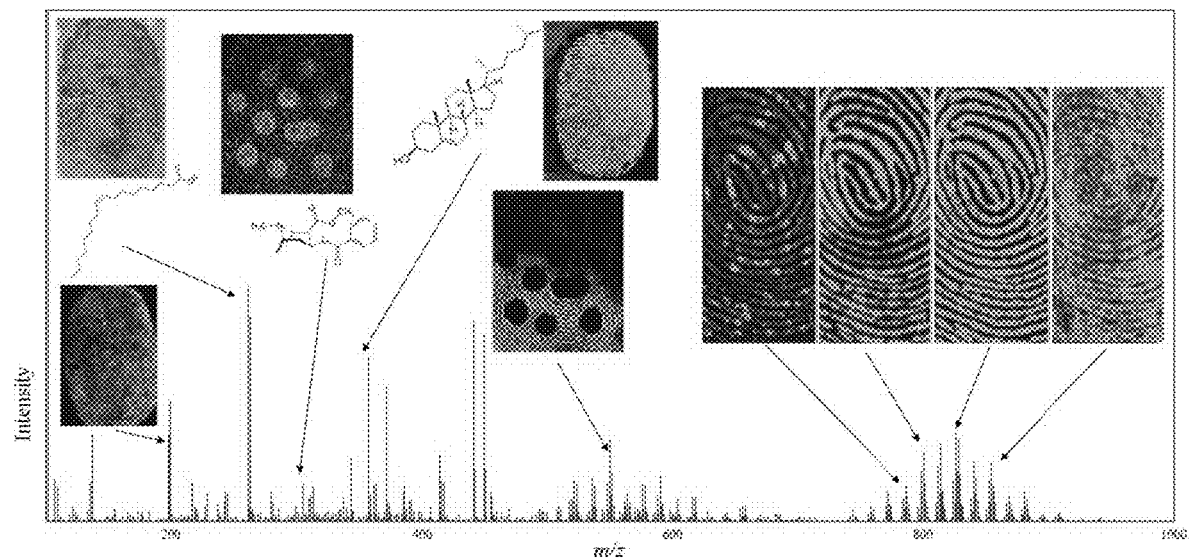
FIG. 8 shows a visual representation of a general mass spectrum, with the generated distribution images of specific peaks that result in the image of a fingerprint as well as the localization dependent on the intensity of the compounds correspondent to a particular signal peak.

Methods have been implemented for the imaging of latent fingerprints through the usage of various analytical tools, such as matrix-assisted laser desorption/ionization mass spectrometry (MALDI-MS). These methods, however, have significant drawbacks, such as low molecular weight interference and displacement of analyte with organic solvent matrix deposition. Our current method for MALDI imaging, which utilizes the deposition of silver nanoparticles (Ag-NPs) as a MALDI matrix replacement, reduces matrix interferences, images the fingerprint, and records a mass spectrum for each pixel in the image, which provides detailed chemical information from the print. One limitation to advancing our research understanding is that our current technology is based on fingerprints deposited onto stainless steel slides. To investigate fully practical applications relevant for criminal justice and health policy, various surfaces of different shapes and compositions must be tested. An additional limitation of the current method is that the transportation of the slides containing the fingerprints is performed outside of the instrument. An attached chamber to the MALDI-MS (mass spectrometry) system that is capable of depositing the silver nanoparticles onto the slides, while also being capable of moving the sample into the MALDI chamber, would reduce the potential problems with sample handling and cross-contamination. FIG. 8 provides a visual representation of the chemical data that is capable of being analyzed through the method of the present invention. The images shown in FIG. 8 exhibit the ability for the AgNPs to generate an MS image without the use of organic matrices and with the ability to provide intricate detail of the chemistry present within the fingerprint itself. This vast amount of chemical data could help push the rate of false positives/false negatives to near-zero.

The ability to obtain such a wealth of chemical information from the fingerprints of an individual also means that there are inevitable legal ramifications of the technology: right to privacy vis-à-vis confidentiality of medical health records and the rights of the criminally accused. While fingerprints are used for identification purposes by the criminal justice system, physical prints can contain personal information about each individual within the chemistry present, including gender and drug metabolites[1]. Protected Health Information (PHI) generally includes any part of a patient's medical record and carries with it particular rules regulating who has access to said information as protected by the Health Information and Patient Protection Act (HIPPA) including sanctions for those who violate the confidentiality provisions. Special protocols would be necessary to ensure that any medical information obtained from fingerprints complies with all state and federal privacy laws related to health care.

The present invention has the ability to analyze metabolites from the body making it possible to obtain evidence to a crime not involved in the primary analysis of the fingerprints or the circumstances surrounding the reasonable suspicion and probable cause for fingerprinting the person under investigation. It is here that there are greater concerns about Fourth Amendment issues related to warrantless search and seizure. Obtaining this information, even if passively obtained, may be considered "fruit of the poisonous tree" doctrine and subject to the exclusionary rule (any evidence obtained illegally or without a warrant may be ruled inadmissible in court). District attorneys, forensic scientists, and judges may also be bound by the "sugar bowl" maxim, which places limitations on evidence used for criminal prosecution that was collected during the search. Generally, the only evidence exempt from this rule is for any evidence, which is in plain view, but other exceptions have been made regarding searches incident to arrest and whether the government has special needs justifying the intrusion. Here the courts consider whether public safety or exigent circumstances exist, or if the alleged suspect has the capability to destroy evidence. Moving forward with this instrumentation will require a careful analysis about the lawful uses of the data obtained so that it is in compliance with the U.S. Constitution's Fourth Amendment prohibitions on unlawful search and seizures and so that it follows the mandates for exceptions allowed to the warrant requirement.

Since its inception, MALDI has characterized a great number of molecules, from organics to proteins[2-7]. While MALDI is one of the most widely used ionization techniques in mass spectrometry, it is not utilized without challenges. Crystal homogeneity is important to the reproducibility of spectra from sample to sample, as well as consistent signal[8]. Another big concern is the interference of matrix in portions of the mass spectra that could overshadow the analyte of interest[9]. Traditional organic matrices include a variety of aromatic compounds such as derivatives of cinnamic and benzoic acids[3-5, 7, 10]. These varying derivatives have proven to be more beneficial depending on the type of analyte present. The development of alternative matrices has become increasingly popular due to the aforementioned problems along with limited applicability of solvent based matrices[8, 10-15]. Some improvements in MALDI have been achieved by employing porous silicon surfaces or silicon films[16-18], metallization of surfaces (with or without organic matrix) by sputtering or evaporation[14, 19-20], carbon nanotubes[21-22], graphite[23], graphene[24], titanium oxide nanoclusters[25], and various metallic nanoparticles[26-33] as matrices. It has been demonstrated that energy absorption is independent of wavelength for nanoparticles, which makes them an interesting potential matrix. Increased particles size could lead to increased absorption[26]. Nanoparticles also have the tendency to be more flexible in terms of sample preparation (pH, solvents, salts, etc)[26].

Figure 9:
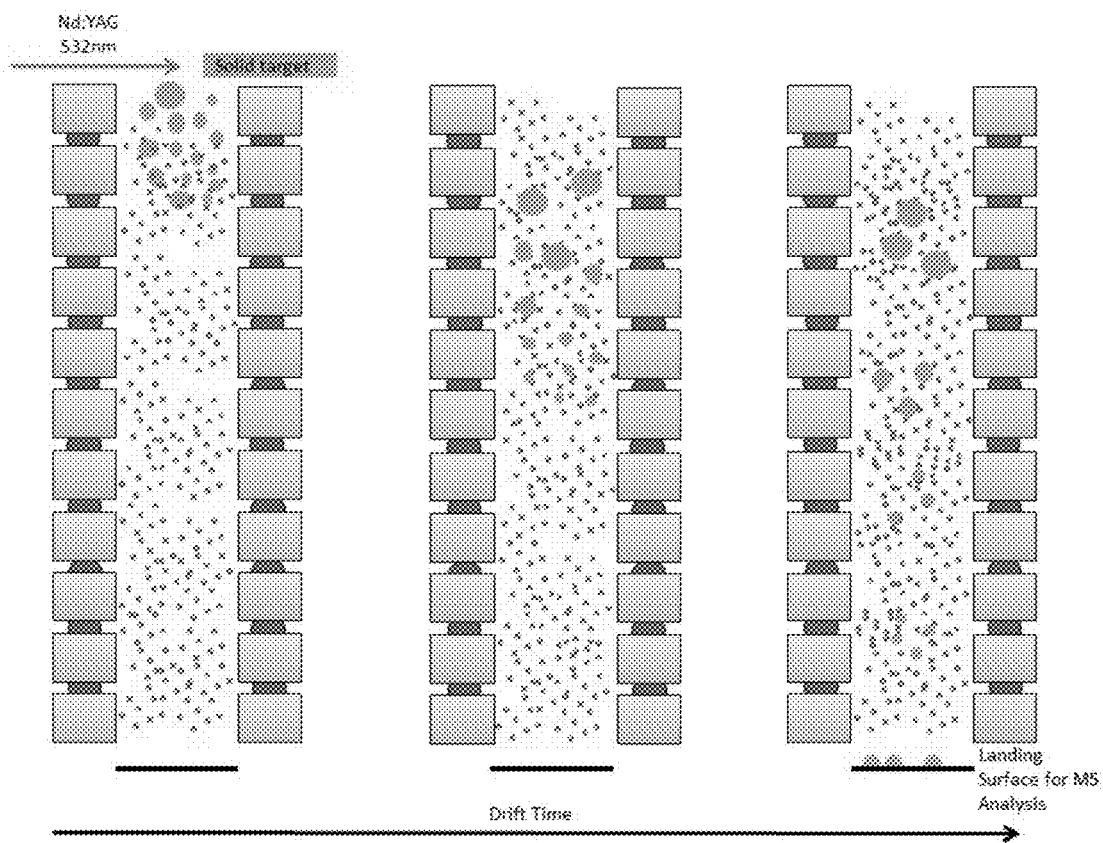
FIG. 9 shows a schematic of soft-landing ion mobility deposition, using a laser ablation and a resistively coupled ion mobility cell for the creation and deposition of metal clusters.

Chemical-Free Nanoparticles. The most common synthesis for nanoparticles is a solution based process. However, chemicals required for the synthesis often rely on reducing agent, antioxidants, and/or other materials that are harmful. Therefore, in order to minimize sample preparation for MALDI, the ability to produce nanoparticles and deposit material directly onto analytes of interest is essential. Pulsed laser deposition has gained popularity to grow films with a variety of properties[34]. Besides thin films, laser ablation has also proven to produce clusters of ions when aided by the presence of a background gas of at least 1 Torr[34-40]. Ion mobility adds the potential capability to select clusters with the use of split rings that can control ion direction towards or away from the landing surface. Combination of cluster formation via laser ablation with the technique of soft-landing ion mobility allows for the creation and deposition of intact ion clusters onto a substrate. FIG. 9 depicts the soft-landing deposition onto a surface for further characterization.

Common MALDI organic matrix is applied to samples in the liquid phase using a droplet over-layer method; the method taught herein eliminates the need for a solution-based matrix, limiting sample preparation time. This is critical for samples that may be prone to degradation in ambient conditions, as both sample and matrix would require time to dry. Another advantage to the SLIM matrix deposition is its lack of low mass interference in the mass spectra commonly seen with organic matrices. These advantages make SLIM deposition a possible technique for forensic applications, in particular fingerprint imaging. Fingerprints have been analyzed using several different methods including secondary ion mass spectrometry (SIMS), infrared spectroscopy (IR), x-ray photoelectron spectroscopy (XPS), gas-chromatography (GC-MS), high-performance liquid chromatography (HPLC) and MALDI-MS[41-44]. All of these methods can provide information, but each has drawbacks of either time restraints or sample preparation methods. MALDI analysis typically was done using spray coating of traditional matrices[1, 43, 45], or a "dry-wet" method where a solid is dusted over the print and then solution is applied[46-47]. Most of these methods are destructive to the fingerprint, making it useless after analysis. Although there has been some work to show that MALDI with organic matrix deposition is non-destructive[41], it requires washing of the print after mass analysis to perform additional investigation. While this method would remove the leftover matrix and leave some of the endogenous lipid content on the surface, it might still remove other soluble material that is of interest.

Figure 10A:
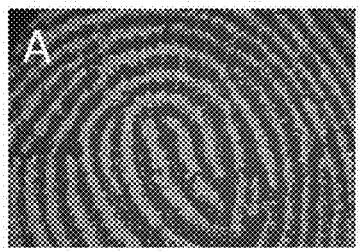
FIGS. 10A to 10H show, respectively.
Figure 10B:
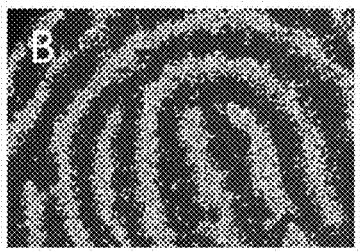
Figure 10C:
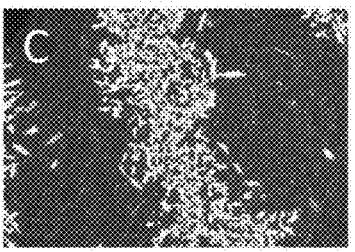
Figure 10D:
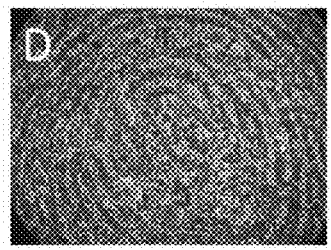
Figure 10E:
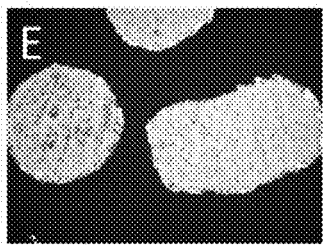
Figure 10F:
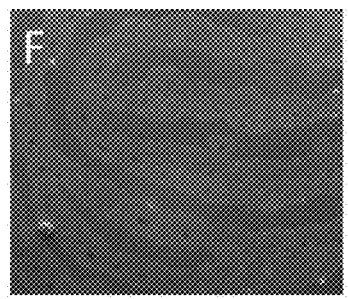
Figure 10G:
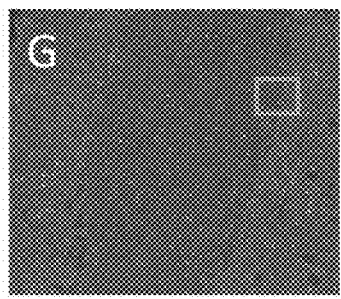
Figure 10H:
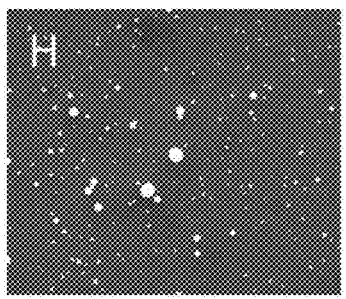

Treatment of Fingerprints. The method taught herein allows for deposition and analysis without damaging the print, allowing for further analyses such as specific site extraction with a manipulator[48] and powder developing without needing to wash away extra matrix. FIG. 10A is a micrograph of a fingermark treated with a common organic matrix through the spray method, FIG. 10B is a zoomed micrograph of spray-treated fingermark, FIG. 10C is a zoomed micrograph of spray-treated fingermark showing the agglomeration of matrix crystals on ridges, FIG. 10D is a micrograph of a "dry-wet" matrix deposition method on a fingermark, FIG. 10E is a micrograph spotted with a matrix solution, FIG. 10F is a scanning electron micrograph (SEM) image showing the undisturbed fingermark post deposition of AgNPs via soft-landing, FIG. 10G is a micrograph showing a zoomed SEM image showing the wide distribution of NPs evenly distributed between ridges and valleys of the fingermark, FIG. 10H is a micrograph of a zoomed section from FIG. 10G, where a distribution of various sized NPs can be seen. Furthermore, the process by which the AgNPs are generated in the method taught herein has the major advantage of being chemical free, therefore no solvents or any major chemical process is required. In a time when green chemistry and/or other factors of environmental friendly processes are sought out, the method allows for the production of these AgNPs to be generated without becoming a concern to the community, or environment.

Deposition of Silver Nanoparticles via Soft-Landing Ion Mobility. Soft-landing (SL) is a technique most commonly used for the purification, isolation, and characterization of ionized compounds[49-53]. Ion-surface interactions are commonly studied via SL followed by some type of analysis to observe any self-assembly or aggregation that occurs at kinetic energies between 10-100 eV. Typical instruments have a mass spectrometer component that allows for the separation of ions; however, the instrument built and used here is composed of a drift tube that works to thermalize ions and ion clusters as they travel towards the landing substrate[54]. This instrumentation allows for the landing of species at kinetic energies below 1.0 eV, eliminating fragmentation of soft-landed species. Ion deposition occurring over this energy regime also allows for the deposition of ions onto unmodified surfaces with limited (if any) translational motion across the surface[54].

Figure 11B:
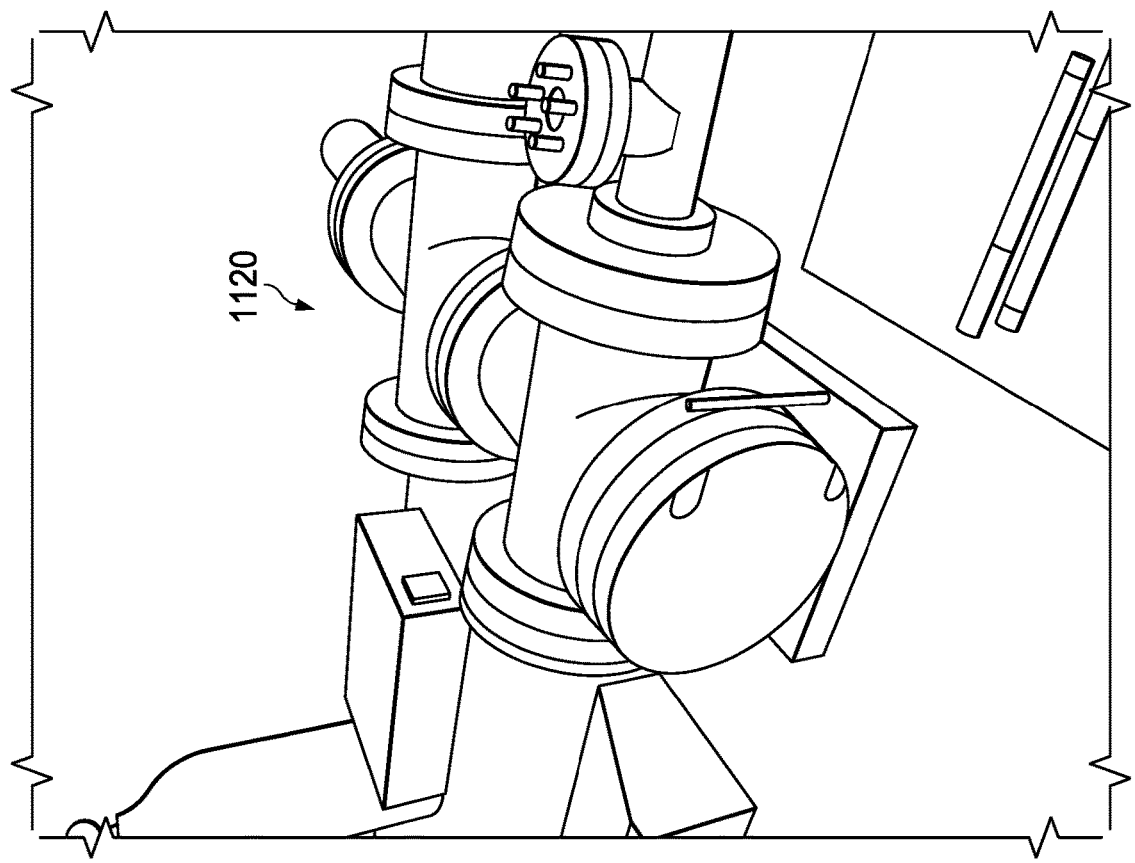
FIGS. 11A and 11B show a Soft-Landing Ion Mobility (SLIM) system of the present invention.
Figure 11A:
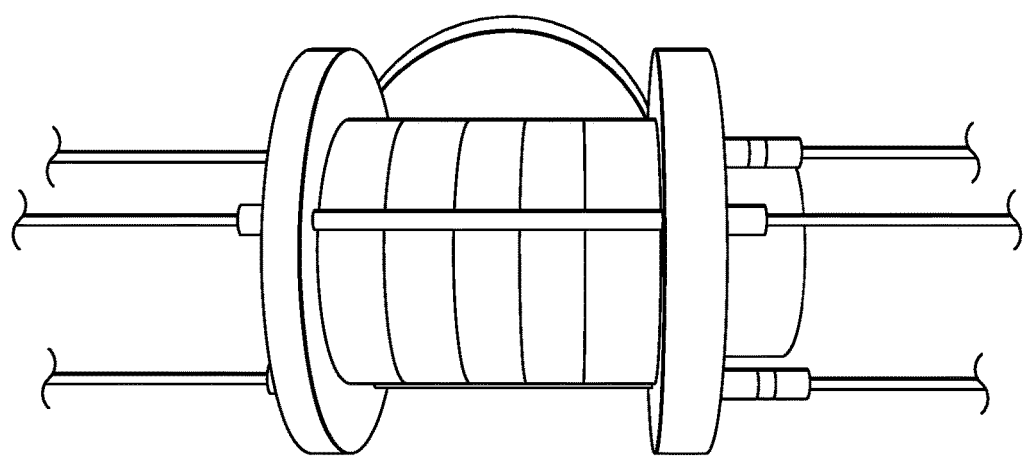

The soft-landing ion mobility (SLIM) instrument used for deposition is composed of 5 concentric stainless steel rings, which are resistively coupled together. Each ring has an outer diameter measuring 2.0" and an inner diameter measuring 1.25", connected by 5 MΩ vacuum compatible resistors (Caddock Electronics, Riverside, Calif.). The mobility cell is held together between two guard rings, with 0.05" spacing between rings provided by sapphire spheres. The whole assembly is housed in a vacuum chamber equipped with the laser ablation ionization source. A 3N silver rod is placed at the end of the mobility cell in front of an ion deflector plate held at a constant voltage to repel ions forward into the drift region. The chamber is equipped with two 6" ConFlat quick doors to allow access to the landing region to easily insert and remove samples. Also with this configuration, multiple types and sizes of surfaces can be used. A variety of deposition parameters, such as pressure, deposition time, and laser power, were initially studied to determine the optimal conditions for particle deposition[36, 38, 40]. Pressure was varied between 1-10 Torr, deposition time 1-60 minutes, and 6.25 mJ-18.75 mJ laser power. FIGS. 11A and 11B show the current instrumentation design of the present invention. FIG. 11A shows a platform for the slim system showing the "short" cell 1110. FIG. 11B shows a vacuum chamber 1120 housing the slim system shown in FIG. 11A.

The workstation of the present invention is simple, yet its implementation into forensic labs around the globe would be of major benefit. Its ease of operation is another subject of interest, since laboratory procedures in forensics labs would benefit from analysis and sample preparation that requires minimum parameter setting. Since in many cases the purchasing of a new instrument may not be within the means of the laboratory funding, this workstation would be an attachment that could be capable of being modified to fit to various MALDI instrumentation. Additionally, the ability to select single ions for Single Ion Monitoring (SIM) could assist forensic scientists with the legal issues of evidence collection; selecting only one ion means that no extraneous information is gathered, and therefore no other evidence needs to be of concern.

A workstation combining SLIM and MALDI-MS for analysis and imaging of fingerprints is shown herein. The device of the present invention is equipped to deposit, e.g., silver, and analyze/image without any other preparatory methods. This will include laser for ablation, surface metal (silver), vacuum hardware, manipulation for MALDI coverage and ablation, and safety housing keeping the laser as a Class 4 with all safety interlocks to protect the user. The goal is to acquire an image of fingerprints and any trace chemistry located within a print, while not creating any visible damage to the print. The inventors will also identify new analytes of interest to couple to the biometric data for information to better identify the individuals of suspect (disease, metabolism, work environment, etc.).

Figure 12:
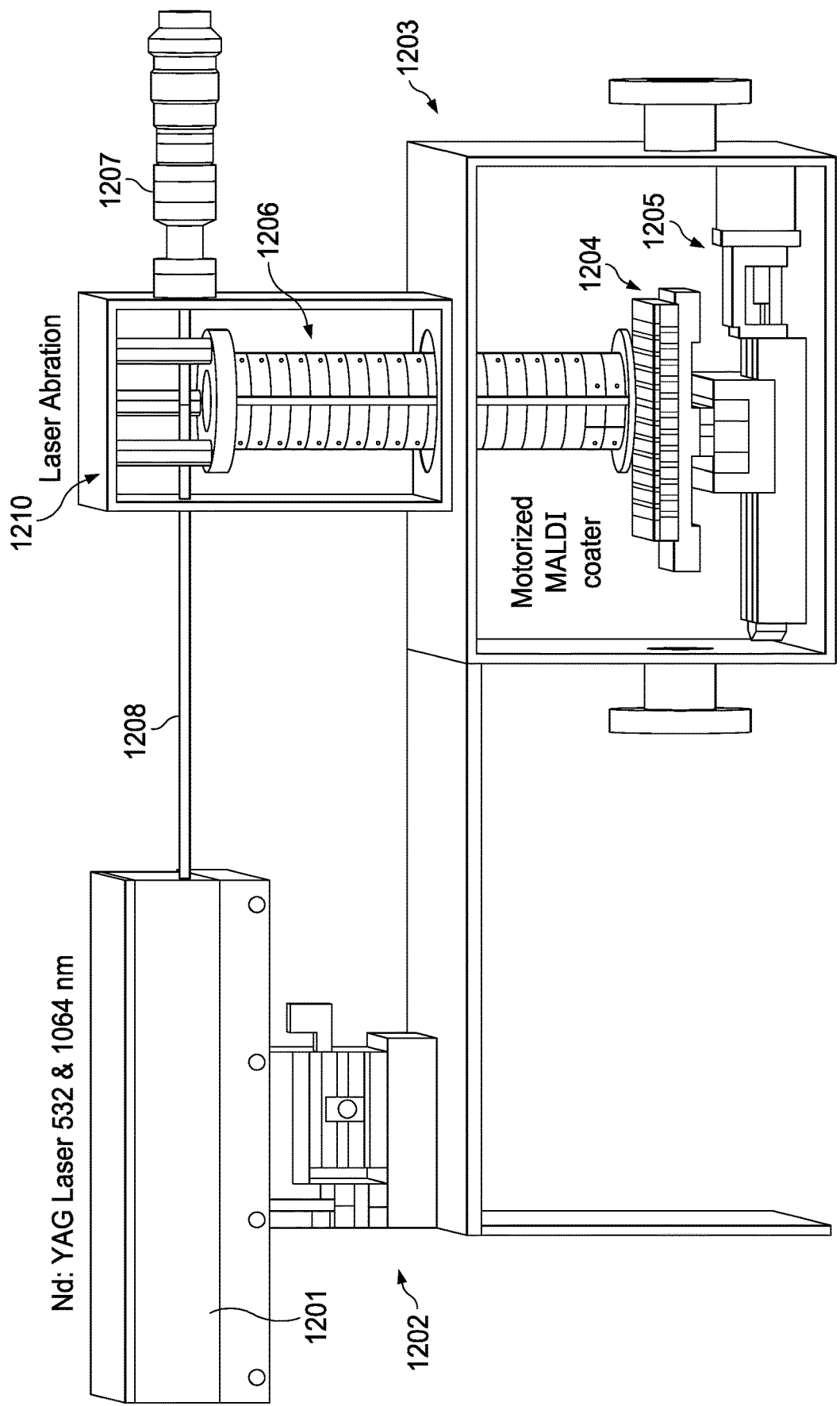
FIG. 12 shows a CAD Image of Final Deliverable Product for Nanoparticle Deposition for SLIM-MALDI-MS Imaging.

FIG. 12 shows a device of the present invention that includes a Nd:YAG laser 1201 that can be a Nd:YAG laser 532 and 1064 nm, which is controlled and positioned by a laser motor 1202, which is shown in relation to the SLIM vacuum chamber 1203. In the slim vacuum chamber 1203, the soft landing target 1204 is shown in relation to the landing stage motor 1205. A mobility region 1206 is also depicted the SLIM system in relation to the landing stage motor 1205 that will move the MALDI plates. Also depicted in relation to the laser beam 1207 is the metal rod manipulator 1207. The device will achieve an even coating of nanoparticles onto the analyte, which will then be transferred into the MALDI chamber for analysis. Individual systems, such as the laser ablation chamber 1210, will have to be focused and calibrated in order to find optimal working conditions. The electronics provide the potentials to the rings in the SLIM system will have to be installed, and the enclosures of all chambers, as well as a covering for the laser, will need to be done in order to safely operate the instrument. Any operators of the instrument will undergo extensive laser safety training before testing the system, as well as evidence handling and management for those materials that are able to be tested from the field. Once all the parameters have been adjusted and optimized, testing of the system will be performed. This includes but is not limited to laser alignment, laser energy optimization, electronic optimization, and stage movement (among X, Y, and Z axes).

Next, methods for fingerprint imaging of different surfaces such as glass and other materials, including often illusive substrates are developed. The initial method involves depositing silver nanoparticles via laser ablation of a silver rod with a 532 nm Nd:YAG laser (Minilite, Continuum, Santa Clara, Calif.). The pressures at which laser ablation occurs will be at 1 and 2 Torr with He buffer gas for varying deposition times of 30, 60, and 120 minutes. Deposition carried out in this manner is most similar to the two-layer (double layer) method,[55-56] which is a combination of the dried droplet[57], crushed crystal[58], and fast evaporation methods.[59] However, the analyte samples spotted here do not include any organic matrix, as the silver nanoparticle matrix is dry-deposited on top of the sample.

Fingerprints are deposited on stainless steel slides after touching the faces and necks of their persons to ensure sebaceous oil transfer and to imitate real-world assault situations.

Figure 13:
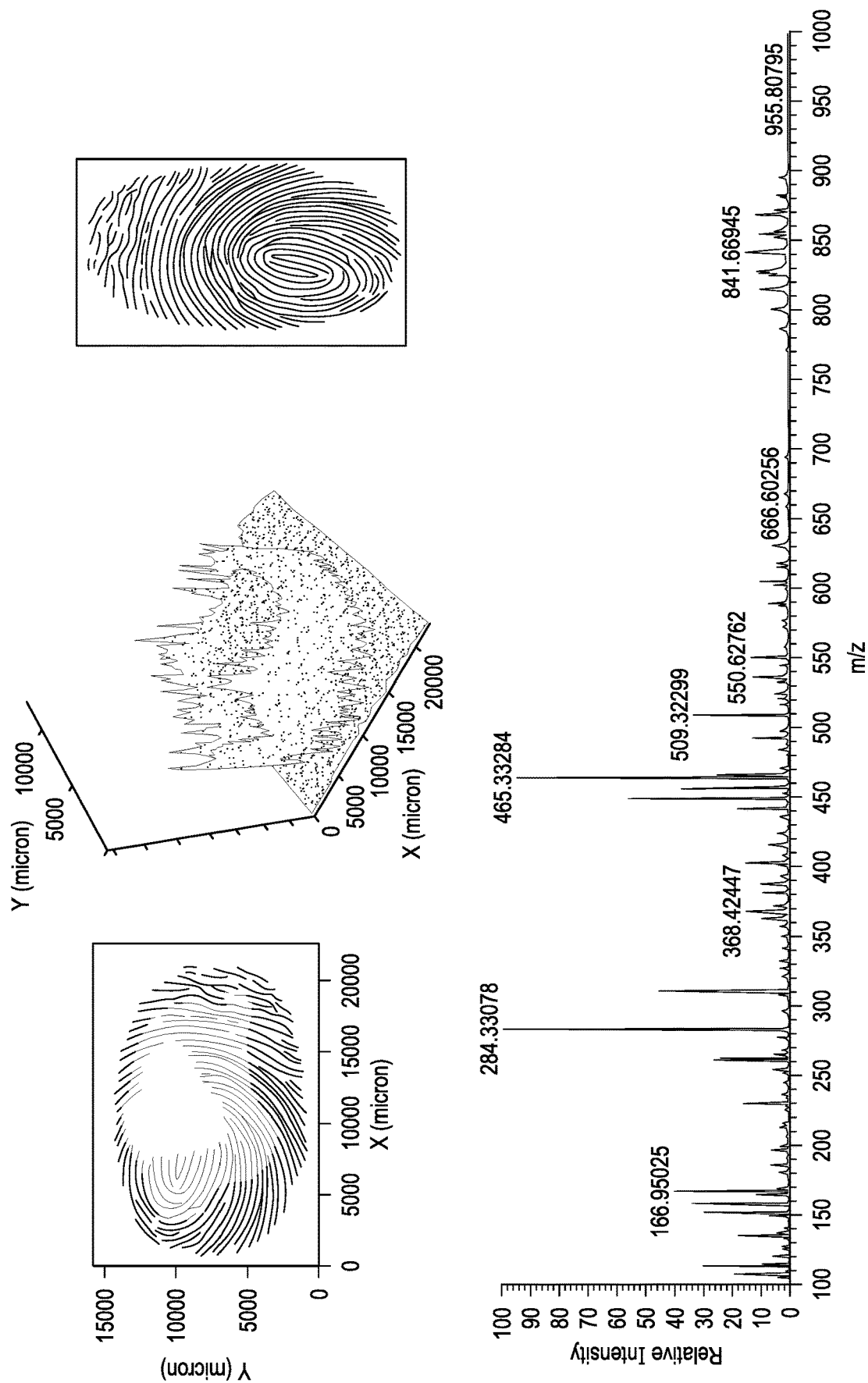
FIG. 13 shows several examples of the information such as chemical localization, ridge pattern configuration, and mass spectrum analysis including TAG profiles.

After landing, slides will be analyzed using a Thermo MALDI LTQ Orbitrap XL (Thermo Fisher Scientific San Jose Calif.), in which a nitrogen laser (334 nm, 60 Hz) is used for the desorption and ionization process. The MALDI laser will be operated between 5-40 dependent on optimizing the mass spectrum obtained from the prints. Each collection of mass spectra will contain 1 microscan/step, and a 100 μm step size, with the final number of scans dependent on fingerprint size. Spectra are capable of being collected in both positive and negative mode from m/z 50-4000 to encompass multiple classes of endogenous biomolecules, such as lipids and cholesterols, as well as exogenous illicit or unique chemistry. Spectra will then be analyzed using Xcalibur (Thermo Fisher Scientific, San Jose, Calif.), and images processed using ImageQuest Software (Thermo Fisher Scientific, San Jose, Calif.). FIG. 13 shows the available information and its resulting visuals that are capable with, e.g., Imagequest software.

"Doping" the fingerprints is also a variable that will be tested. The doping of fingerprints is a method in which fingerprints are collected after the individuals have dipped their fingers into known solutions or dry powders to mimic real-world situations such as melatonin, tryptamine, and caffeine.

Physical transfer of chemicals due to physical altercations is tested thoroughly with this system. Any other form of fingerprinting protocol in which two individuals will be fingerprinted after a simulated assault can also be used with the present invention. Once their prints have been collected, the SLIM-MALDI analysis will take place, providing not only fingerprint characterization but chemical evidence of an assault.

A major advantage that this instrument will allow for is the ability to perform further analysis on lifted fingerprints that may already be in storage, or are simply the only prints capable of being collected due to the nature of placement in which they are found. While there is a factor of sample contamination depending on the prolonged exposure to the adhesive on the tape, there is still a vast amount of information that can be gathered with the method described here. Various fingerprints, both doped and undoped will be collected at various concentrations, placements, and developing times in order to attain a variety of conditions to which the instrumentation taught herein can be tested.

Figure 14:
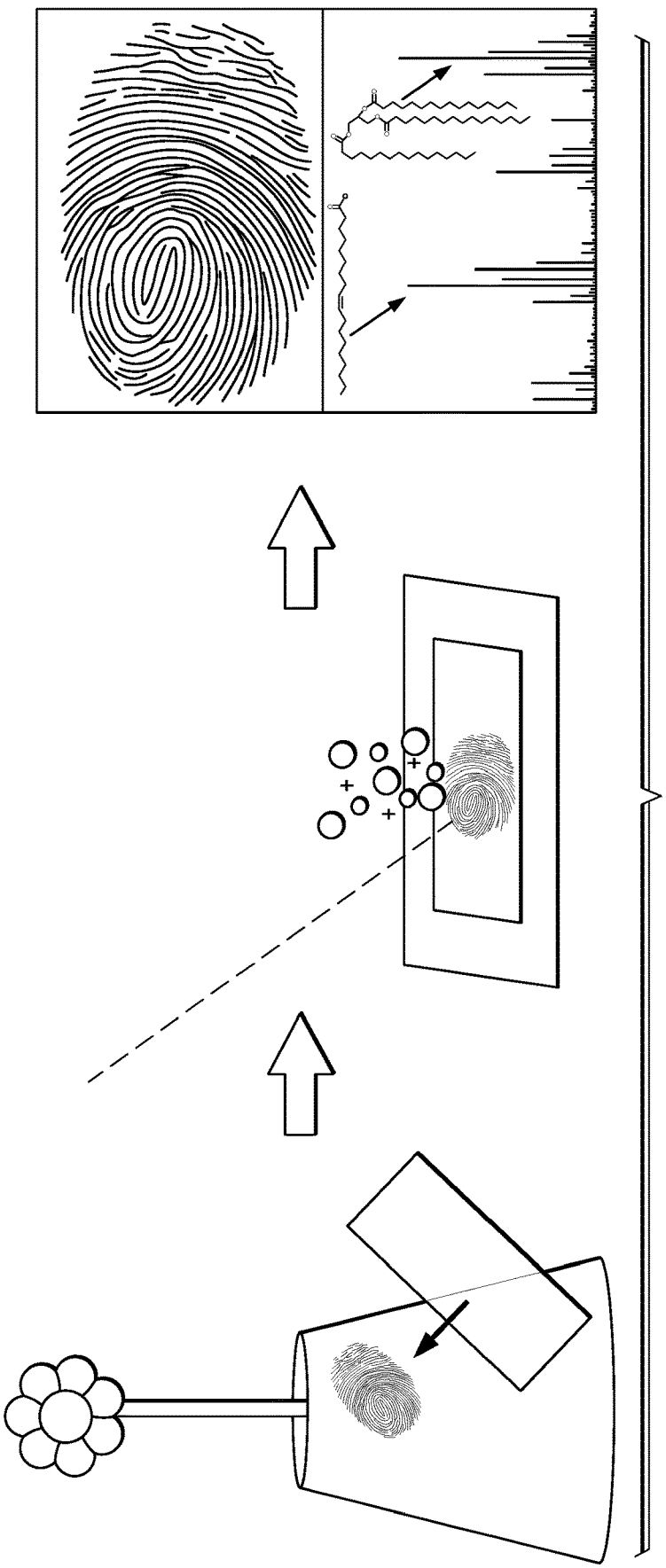
FIG. 14 shows a schematic for lifting a print, laser ablation event for MALDI, and the resulting print image and mass spectrum.

The collection of the prints will be done in the same matter as any other common fingerprint lift method, in which a fingerprint is dusted with a powder (most commonly black granular, black magnetic and aluminum flakes), and then lifted with an adhesive tape. If achievable, fingerprints will be attempted to be lifted without the usage of powder as a control group. The lifted tape can then be adhered to a MALDI plate for silver nanoparticle deposition and MALDI-MS imaging and mass analysis (FIG. 14). To further remove background signal caused from the adhesives in the tape and the dusting powder, a control mass spectrum will be obtained to determine ion signals consistently present stemming from background noise for each type of surface. This same method of background subtraction may be implemented to chemical development techniques if required. Prints will be collected and analyzed from a variety of common surface materials including glass, ceramics, metals, and plastics in order to mimic real-world scenarios of surfaces in which fingerprints are often found. Proper evidence handling in situations where fingermarks were needed to be lifted would be important in order to preserve rules of evidence.

Finally, a chemical transfer from an assault can be detected and imaged even after using the print lifted method. This will include imitating a physical assault, with the assailant printing on common surfaces such as a coffee cup or cell phone touch screen. The prints will then be lifted and scanned for the assaulted victim's chemical profile. The success of this method would greatly advance existing forensic analyses, and further aid in the confirmation of a possible match in criminal cases.

Figure 15A:
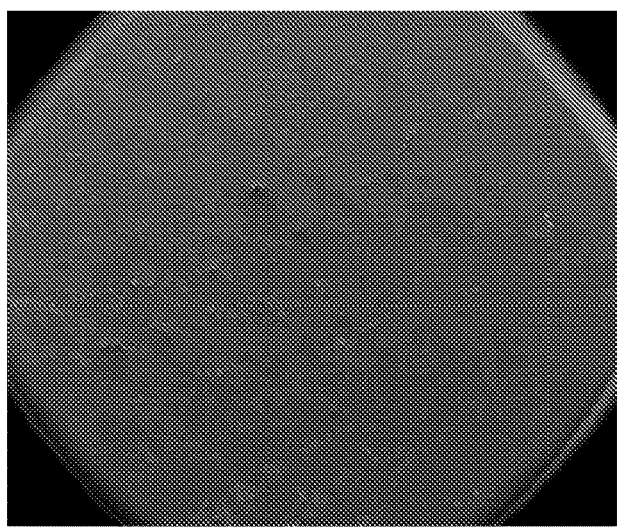
FIGS. 15A and 15B, show the following.
Figure 15B:
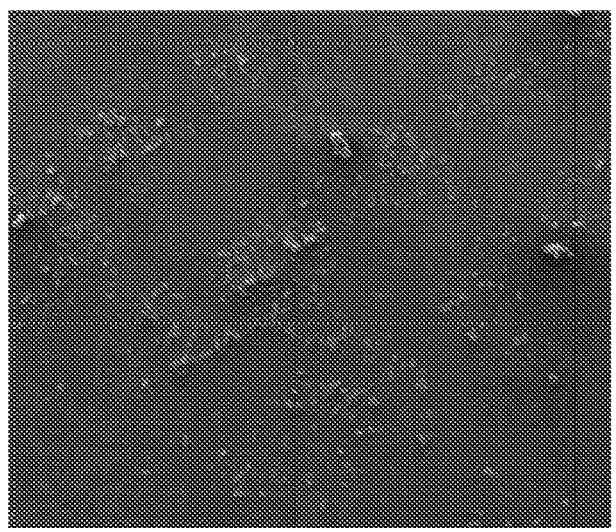

The present inventors contemplate the usage of other metal clusters aside from silver, such as molybdenum, nickel, and gold, that can be tested to optimize matrix deposition and resulting mass spectrum. The deposited metal nanoparticles can be further analyzed with the usage of a FEI Quanta scanning electron microscope (SEM) (FEI Hillsboro Oreg.), in which detailed images of the nanoparticles and prints will be produced (FIGS. 15A and 15B). The simplicity of the instrument and method allows for different metals and alloys to be used for the formation of nanoparticles without major modification to the system. In addition, physical characterization of nanoparticles will be performed by energy-dispersive X-ray spectroscopy (EDS) within the SEM to confirm particle composition.

Materials.

Melatonin (Sigma-Aldrich, St. Louis, Mo.) has been chosen for the initial work to establish SLIM-MALDI as a viable technique for the analysis of low molecular weight compounds due to interest in illicit drug and pharmacological applications. Solvents and additives that will be used include acetonitrile (Sigma-Aldrich, St. Louis, Mo.), trifluoroacetic acid (Sigma-Aldrich, St. Louis, Mo.), and 18.2 MΩ Millipore water (Millipore, Billerica, Mass.). Solutions are spotted on stainless steel and glass MALDI slides (Thermo Fisher, San Jose Calif.). Silver nanoparticles are created from a silver rod (99.999% purity, SPI Supplies, West Chester, Pa.). Slides can also be prepared using a 2.5-5 mg/mL solution of α-cyano-4-hydroxycinnamic acid (CHCA) as the matrix (1:1, (v:v) ACN/0.1-1% TFA in H2O), which is spotted in a 1:1 ratio with the sample of interest. Tryptamine (Sigma-Aldrich, Sigma-Aldrich, St. Louis, Mo.) and caffeine (Alfa Aesar, Ward Hill, Mass.), along with melatonin are used as dopants for fingerprint analysis.

Instrumentation. Thermo MALDI LTQ Orbitrap XL (Thermo Fisher Scientific San Jose Calif.) with a 334-nm nitrogen laser. FEI Quanta scanning electron microscope (SEM) (FEI Hillsboro Oreg.). Thermo MALDI LTQ Orbitrap XL in Hickory 001.

Thus, the present invention includes an all-in-one workstation for metal (e.g., silver) matrix deposition and subsequent imaging of, e.g., forensic evidence, such as fingerprints. The combination of SLIM and MALDI-MS will allow for non-destructive application of a matrix substitute while resulting in a removal of interference from traditional matrix in mass spectra.

Example 3. Atmospheric Soft Landing Ion Mobility Instrument for the Deposition of Silver Nanoparticles on Cancerous Tissues Nanobiotechnology is an emerging field of nanoscience in which nanobased systems are utilized for biomedical applications. Nanoparticles (NPs), which are properly defined as particles within the range of 1 to 100 nanometers (but can be larger), have become of interest in the nanobiotechnology field. The unique physiochemical properties displayed by materials on the nano-scale have opened the doors to many novel and revolutionary approaches in the bio applications of NPs in the diagnosis and treatment of human cancers. Factors such as metal composition, size, and shape play vital roles in the implementation of NPs in biomedical applications[1-5]. The rapid expansion of nanotechnology has increased the number of available Food and Drug Administration (FDA) approved products available for the advancement of clinical research and care, in what is expected to be a promising and further growing market.

Silver products, have an extensive history of medical uses ranging back thousands of years. More recently, silver nanoparticles (AgNPs) have become of major interest, due to their abilities to possess distinctive morphologies, as well as characteristics related to their antimicrobial potential. In recent studies, AgNPs have shown to possess antimicrobial activity against viruses such as but not limited to Herpes[6], HIV[7], and Hepatitis B[8]. Such biological activity of silver has been attributed to the presence of the $Ag^+$ ion[9] and its capability of actively binding to the negatively charged proteins DNA and RNA, to inhibit cell replication. It is due to such unique properties and therapeutic potentials in treating various diseases, with addition of AgNPs showing to possess intrinsic cytotoxicity activity towards cancerous tissues[10, 11] that makes them suitable for tumor treating materials.

While many of the approaches in the emerging usage of nanoparticles for cancer treatments may be evolutionary, the effects are not yet fully understood. It is also due to the rapid progress in nanotechnology and the early acceptance of NPs in such evolutionary treatments, that there has not been enough specific concern in the possible adverse side effects, such as toxicity cause-effects due to long exposure with a range of various concentrations in humans.

While reports on the toxicity of AgNPs are available, a solid understanding of the entire mechanism that occurs from the effects of AgNPs on cancer cells is still not entirely understood. Factors such as AgNP size[13] have been researched, but are limited due to the lack of quantitative analysis regarding the amounts taken in by the cancerous tissues. In fact, work by Chithrani et al[14] demonstrated a method of obtaining a quantity of spherical gold NPs taken in by HeLa cells through inductively coupled plasma atomic emission spectroscopy (ICP-AES). However, this method has failed to show in more published literature, possibly due to the inability for the synthesis methods of AgNPs to maintain one simple and close distribution of AgNP size, where then the calculation of AgNP volume becomes almost impossible to accurately determine. Therefore, results that are shown within publications are based on the reactivity of the cells dependent on AgNP solution concentrations, without any regards of the actual amounts of AgNPs taken into the cell.

Another concern when dealing with AgNPs is their various synthesis processes. These processes such as chemical, biological and physical all vary in methods, and result in AgNPs of different shapes and sizes. However, hazardous chemical waste, time-consuming methods, and secondary steps for stabilization often followed by the majority of these various methods. A large push for the development of green synthesis methods have led to the development of various methods within the past few years, however there is still no correlation made between the AgNP created and the intake of said AgNPs into the cells[10, 15-24].

Furthermore, the localized deposition of AgNPs directly onto tumors has never been successfully achieved before, since current application of AgNPs rely on solution addition processes. In previous studies[15-24], the chemical and biological responses of AgNPs on cancer tissues have relied on solution addition methods, meaning that chemical solutions containing various amounts, shapes and sizes of AgNPs are created and mixed into the cultivations of cancer tissues that are to be analyzed. As different concentrations of AgNPs solutions are used, so are various anti-oxidants such as N-acetyl-cysteine, which are needed in order to increase the stability of the NPs, other methods such as capping[25] with Poly(ethylene glycol) or PEG are used in order to minimize unnecessary oxidation of the AgNPs, as the oxidative species are less efficient and can in fact increase unwanted oxidative stress on healthy cells. It must be mentioned again, that while a correlation of size and concentration could be determined by these results, there was no clear data presenting the amount of AgNPs that were taken in by the cells.

As mentioned before, the introduction of such AgNPs in the tissues also plays a vital role in the studies, and currently there is a lack of a single method capable of being used the same way for various cancerous tissues. Methods of AgNP intake that are being researched involve processes by which anticancer drugs are attached to AgNPs in order to overcome both non-cellular and cellular based mechanisms of resistance in order to increase the selectivity of cancer cells, all while reducing toxicity towards normal tissues[26]. However, these processes rely on the accumulation of the injected nanoparticles onto cancer tissues through the passive diffusion across tumor vasculature after traveling though the body. This is largely in part to cancerous cells being more sensitive to AgNPs due to their lack of base excision repair (BER) mechanism that allows for the excretion of the AgNPs. Injection of AgNPs into the bloodstream possesses its own setbacks, since immediately after injection; blood proteins begin to adhere to the surface of the NP, therefore critically reducing its probability to reach the target tumor, even injection of the AgNPs directly onto the tumor can result in poor results due to the sluggish and intermittent flow commonly found in tumor vasculature. A further example by Kovvuru et al.[27] showed that the oral ingestion of silver nanoparticles induces DNA damage, permanent genome alterations, while also modulating DNA repair gene expression. Such experiments were carried due to the lack of information on AgNP toxicity on in vivo studies.

The mechanism of AgNP induced apoptosis is theorized to begin when the AgNPs are absorbed into the cell by either passive diffusion or endocytosis. In passive diffusion, the slightly negative charge from the cells allows for the positively charged NPs to pass through the cell membrane, while in endocytosis the AgNPs are absorbed into the cell. Once inside the cell, it is theorized that ATP depletion due to mitochondrial dysfunction begging to take effect result in the increased production of reactive oxygen species (ROS) within the cell, therefore affecting the secretion of pro and anti-inflammatory molecules that regulate the various steps within the lifecycle of cancer. With the increased production of ROS, the cytotoxicity of the cell begins in increase and therefore unsuitable environments for the cell to continue its cell cycle. Meanwhile the $Ag^+$ ions are able to cross into the nucleus, where chromosomal aberrations or DNA damage begin to take place. All eventually leading to apoptosis[4].

Therefore, a chemical free method for the creation of AgNPs is necessary in order to fully understand the mechanism between the cytotoxicity of AgNPs and cancer. Being capable of controlling the size and distribution of said AgNPs is also a major asset to this study since it is known that size of NPs play a vital role in the cytotoxicity of cancer tissues[26,28]. This approach is different than any other in the sense that the direct localized deposition of AgNPs directly onto tumors without any other form of prior preparation has been never been done. Most, if not all of prior analyses are based on solution addition delivery methods, by which the amount of AgNPs obtained by the cell are dependent on concentration of the solutions containing AgNPs.

The present invention includes the design and development of a Soft-landing Ion Mobility (SLIM) system capable of deposition of AgNPs at atmospheric pressures in order to analyze dosage based responses of spherical silver nanoparticles (AgNPs) on various types of cancer tissues. Information obtained using the present invention can include the mechanisms that occur within cancer cells in the presence of AgNPs based on cellular responses such as cellular shrinkage, deformation, enlargement, as well as chemical changes within the cell. This instrument will be capable of creating chemical free AgNPs through a laser ablation method; the AgNPs will then travel through the mobility region, by which the isolation of AgNPs of particular size can occur, and finally deposition of the AgNPs onto tissues of interest.

Ion Mobility Spectrometry (IMS) refers to the principles, methods, and instrumentation for characterization of chemical substances on the basis of velocity of gas-phase ions in an electric field[29]. Packets of ions are created and placed into an electric field under the presence of a buffer gas. Once inside the electric field, ions are separated based on their drift times experienced inside the mobility cell. The mobility of an ion is an individual property, but it is dependent on interactions between the buffer gas (aka collisional cross sections) and the ionized molecules. Therefore, different ionized structures of various sizes will experience different drift times according to factors such as electric field and gas pressure. The instrument taught herein is capable of separating ion clusters of various sizes that are created from the laser ablation method. Traditional IMS devices, which in many instances are capable of operating at atmospheric pressures, are commonly used for the detection of significant chemicals such as warfare agents, explosives, and illegal drugs[30].

Soft Landing (SL) is a technique in which deposition of ionized molecules occurs in kinetic energies below 100 eV. Through this method, ionized compounds such as polymers[31], metal ligand complexes[32], and nanoclusters[33] are isolated and landed on substrates without inducing structural changes or fragmentation within the incident ions. Common SL instrumentation utilizes quadrupoles[34], rectilinear ion traps[35], and sectors[36]. However, the kinetic energy (KE) experienced by the ions from these instrument ranges from 10 to 100 eV, furthermore they require high vacuum conditions in order to operate. Until recently, the utilization of ion mobility as a soft landing device, also known as Soft Landing Ion Mobility (SLIM) opened new doors to SL techniques. In the SLIM system, the thermalization of ions is associated with the collisional cooling as they travel through a uniform electric field at reduced pressures, allowing for the kinetic energies of said ions to be lowered to the sub-1 eV energies[33].

Figure 16A:
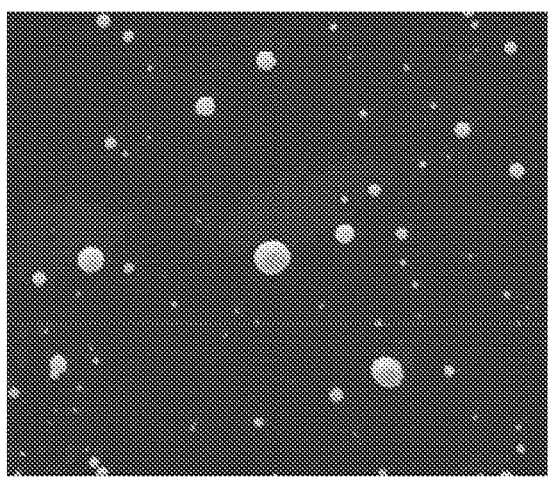
FIGS. 16A and 16B show the following.
Figure 16B:
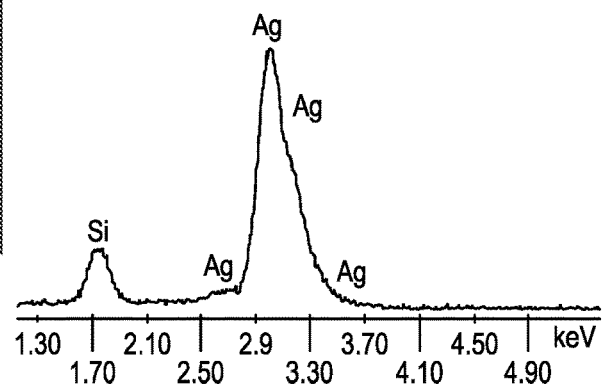

Previous work by the present inventor[33, 37-39] has shown AgNPs that have been soft-landed on substrates without fragmentation. Such production and deposition of AgNPs have also shown no signs of oxidation even months after deposition[37]. FIG. 16A shows an SEM image of the soft-landed AgNPs onto a silicone substrate, while the image of FIG. 16B shows the energy-dispersive X-ray spectroscopy (EDX) spectra of said AgNPs, showing no presence of oxygen with the metal NPs. The lack of presence of an oxygen signal is of great interest for the invention since various publications[9, 12, 23, 40] have shown that AgNP toxicity on cancer tissues may be traced to the formation of reactive oxygen species (ROS), which induce apoptosis, the formation of ROS may be better controlled if the oxidation of a AgNP can be controlled or be kept at a minimum. It has also been seen that uncoated AgNPs have a higher effect on cancer tissues than the more common polyvinylpyrrolidone (PVP) coated AgNPs at lower concentrations[41]. Therefore making the SLIM method a suitable experimental approach for the physical means of creating stable as well as uncoated AgNPs free of hazardous reducing agents as well as antioxidants for the study of dosage dependent analysis of AgNPs on cancer tissues. In the method of the present invention a time dependent dosages can be applied, since the ablation time can be controlled, while also being capable controlling the size of said AgNPs that make it into the sample.

The present invention also includes the isolation and quantification of AgNPs of interest based on size and concentrations at atmospheric pressures. The Atmospheric Soft Landing Ion Mobility (ASLIM) system of the present invention can be optimized based on, e.g., fine tuning parameters such as voltages, buffer gas composition, and deposition times in order to analyze the effects of various dosage-responses on different cancerous tissues. FIG. 9, in Example 2 hereinabove, shows the process that includes the creation of AgNPs via laser ablation, the separation of AgNPs based on size, and the deposition of AgNPs at ambient operations Production of Nanoclusters.

NPs are clusters of metallic atoms in the nanoscale range. An array of various methods exists for the production of NPs through means of physical, chemical, and biological processes. Chemical synthesis of AgNPs is a simple procedure, but the process employs chemical reducing agents such as citrate, borohydride, and other organic chemicals that are known to be toxic to living organisms[40]. One of the most common methods out there is through the usage of excess amounts of reducing agents, such as sodium citrate[42] or $NaBH_4$[43]. Some methods rely on aqueous solutions of poly(ethylene glycol) (PEG)[25] to produce AgNPs, while others rely in the simple reduction of metallic salts in dry ethanol[44]. While these methods are known and have been used for some time, they can result in hazardous waste that deters them from becoming suitable for biological applications. Other various solution reaction systems require numerous steps that can result in failures or expensive missteps. It must also be mentioned, that antioxidants such as N-acetyl-cysteine are used as well in order to reduce the reactive oxygen species that are known to increase the cytotoxicity of AgNPs. Arora et al.[45] saw that NP mediated cytotoxicity mechanisms were mostly due to ROS inducting into Glutathione (GSH), which is an important antioxidant that aids in the prevention of cellular damage.

Biological synthesis of AgNPs has been reported, but it involves the formation of such nanoparticles by means of enzymatic reduction[46, 47]. However, while the AgNPs constructed show great stability, they are not monodispersed and can become difficult to extract AgNPs of particular size. Also, the rate at which these synthesis methods work is slow and cost rendering, making them an unlikely process of AgNPs synthesis for fast and repetitive analysis.

With the method taught herein, the production of AgNPs is by direct physical means through pulsed-laser ablation. It is through this method that not only would synthesis time be reduced, but it would also create gas phase AgNPs free of chemical residue and possible toxic side products. A 1062 nm Nd:YAG laser is focused through a quartz window into a chamber containing a solid metal target at the entrance of the ion mobility cell. Previous work[37, 48, 49] has shown that the variations between pressures, laser intensity, fluency, buffer gas temperature, and deposition time can affect the size of the AgNPs produced. By contrast, the chamber of the present invention operates at atmospheric pressures; therefore, changes in buffer gas composition, laser intensity, laser fluence and deposition times can be used to optimize the conditions that produce a proper amount of AgNPs while also staying within a desired size range.

Figure 17:
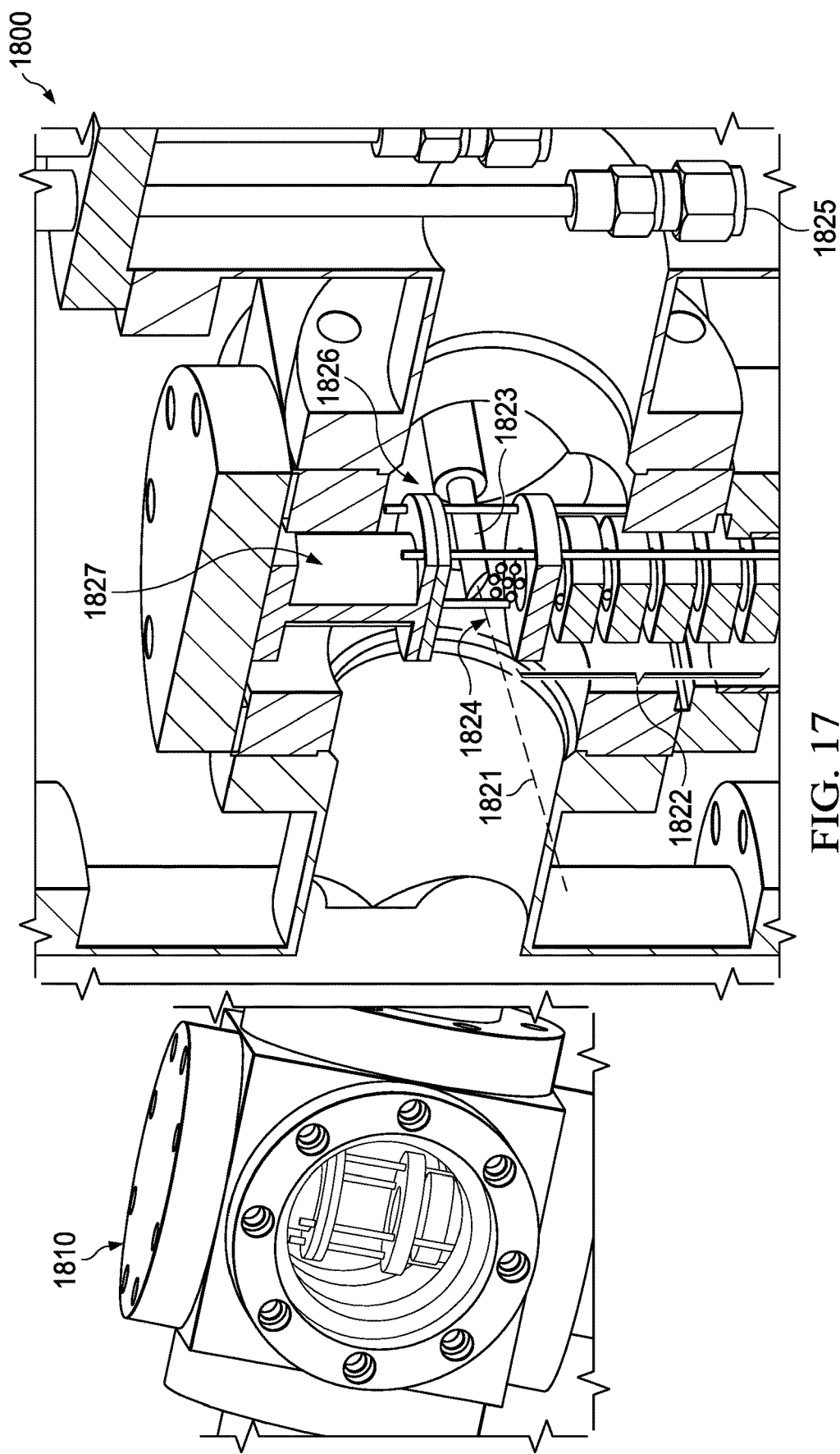
FIG. 17 shows a schematic CAD drawing of laser-ablation ionization region for Atmospheric Soft Landing Ion Mobility (ASLIM) system.
Figure 18A:
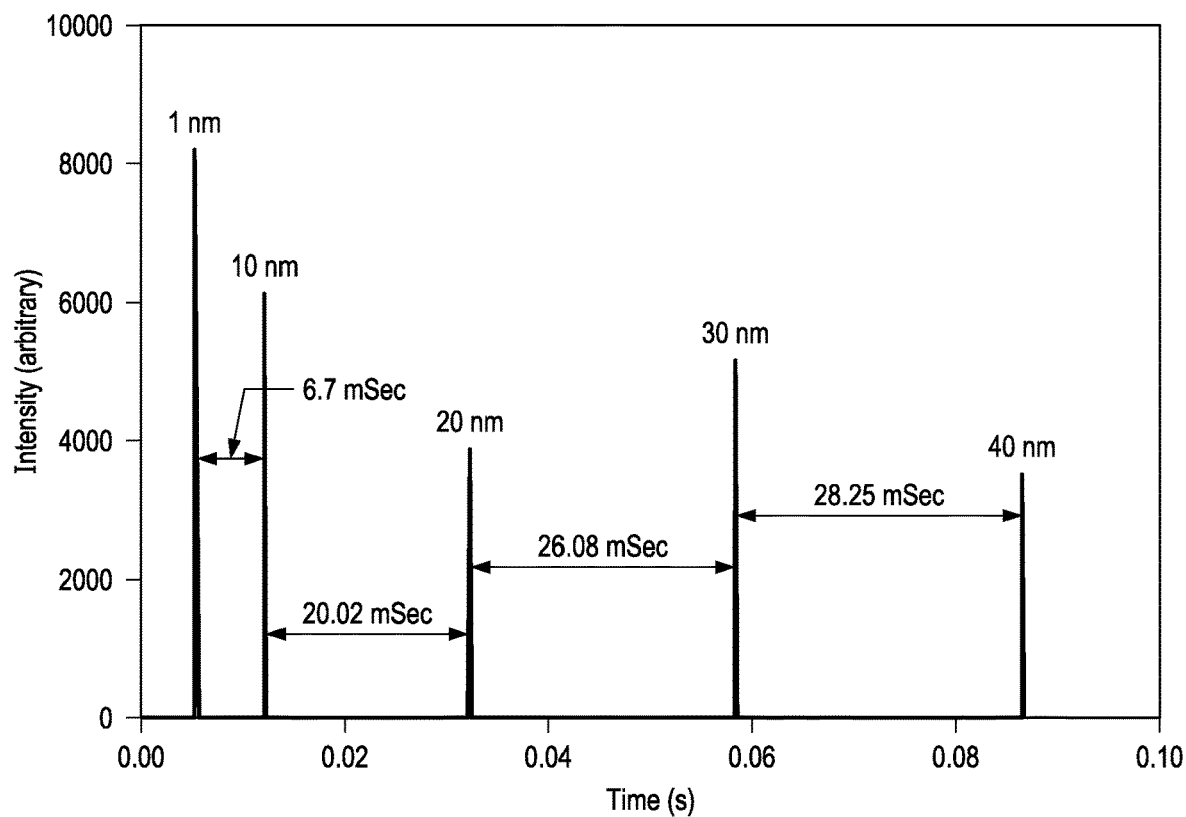
FIGS. 18A and 18B shows simulated spectra for the ASLIM at 760 Torr (FIG. 18A), and 380 Torr (FIG. 18B).
Figure 18B:
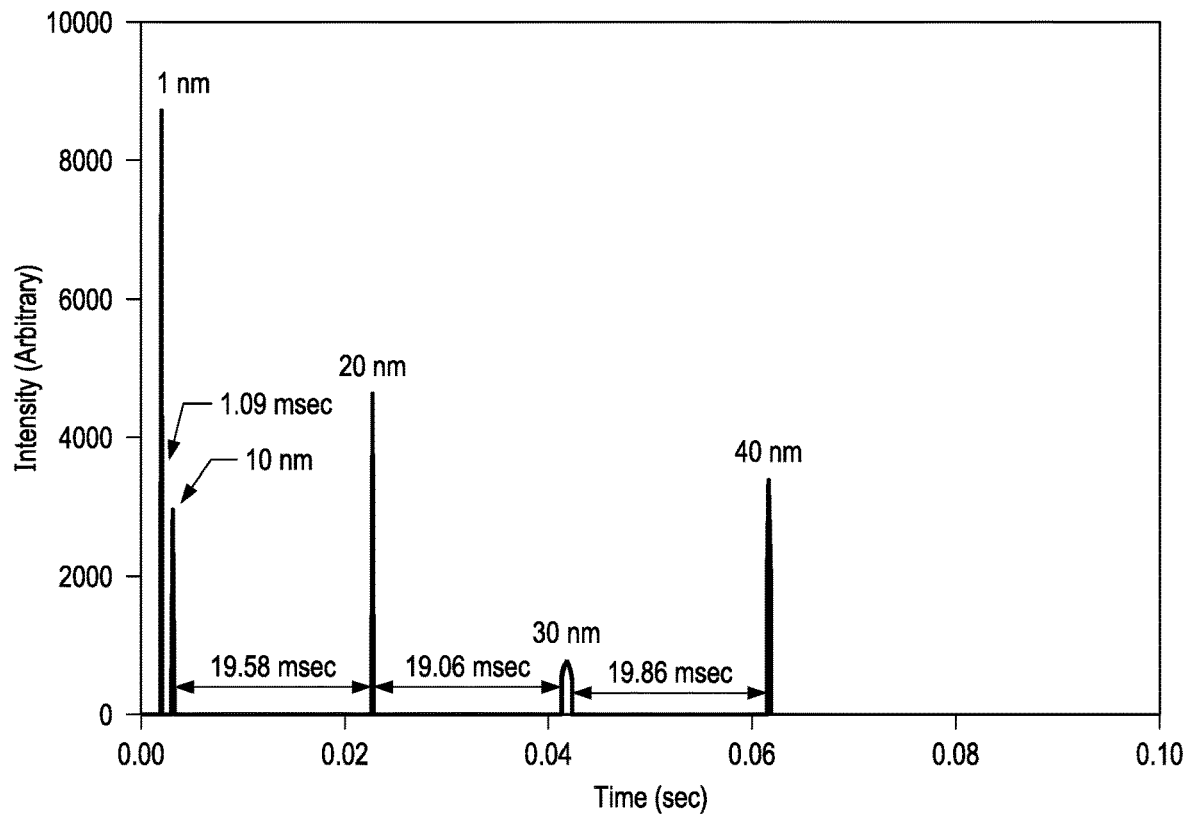

FIG. 17 shows a representation of the laser ablation using the Atmospheric Soft Landing Ion Mobility (ASLIM) system 1800. The ASLIM 1800 includes a front 1810 of the ASLIM system where the viewport allows for laser beam to pass in order to ablate the metal rob 1823. This CAD drawing shows the laser-ablation ionization region for the ASLIM system 1800. The laser beam 1821 is depicted in relation to the mobility region 1822 below the region in which the laser bean 1821 contacts the metal rod 1823. Ionized metal nanoparticles 1824 produced by the laser ablation event are shown entering the mobility region 1822. The buffer gas inlets are shown at 1825, with the back-plate 1826, and the ceramic ASLIM holder 1827.

Previous studies done in a similar system[37] have shown that that even months after deposition, the AgNPs retain their chemical state and show no considerable oxidation. This is particularly of use for cancer tissue analysis since oxidized NPs increase the cytotoxicity of the metallic compounds, while also adding oxidizing agents to the cancer tissues themselves, which can result in cellular damage to even the healthy cells. NP size and shape is also of importance, since previous analysis have proven that the size plays a critical part in the interaction of cells and the AgNPs present, the system will be limited on spherical AgNPs since previous work has shown to produce such shapes, however the size and amount are conditions that can be controlled. After the ablation event, the glomeration of the atomic particles result in a variation of clusters of different sizes.

While the entire mechanism behind the production of AgNPs though the pulsed laser ablation method is not entirely understood, the 3 most important parameters are: (1) the pressure in which the ablation is taking place, (2) the fluence of the laser, and (3) the exposure time on the metal surface. There exist simulations that can aid in the understanding of the events that occur within the surface of the metal at the moment of the ablation, but the process in which the NPs are made is as stated before, not entirely understood. What is known however, is that through pulsed laser ablation an intense pulse of focused light is placed upon the surface of a metal. This causes the material to be locally vaporized, once this hot plume is ejected from the surface it begins to be quenched by the inert gas surrounding it. It is through this cooling that atomic clusters begin to form, and consequently atomic clusters begin to agglomerate, producing NPs. While there are similar methods for the production of AgNPs such as gas aggregation and electron sputtering, pulsed laser ablation is capable to produce the clusters in both cationic and anionic ionized forms, which are important to the deposition method, since they will be guided and separated via an electrical field. Several findings have also shown that at higher pressures (such as atmospheric), can result in a distribution of larger NPs (>100 nm). However, by changing the laser fluence, and exposure time of the laser beam results in smaller NP sizes[51-53].

Separation, Manipulation, and Reaction of Gas-Phase Ions. The isolation of ions of interest for the quantification of molecules is important for analytical studies. The ability of an instrument to select a particular ion of specific mass is dependent on the capabilities of the instrument itself; such instruments must contain a sufficient mass range while also being capable of separating and isolating particular ions. While mass spectrometer SL instruments are capable of mass selecting via usage of an RF frequency, they operate in high vacuum environments. The Atmospheric Soft Landing Ion Mobility (ASLIM) instrument of the present invention relies on the usage of drift time experienced by the ion through a series of collisions with a buffer gas in an electric field for the isolation of AgNPs of interest.

Ion mobility Spectroscopy (IMS) is a technique in which packets of ions are introduced into a drift region; this drift region is composed of a linear electrical field, and a buffer gas. In traditional IMS, ions are slowly thermalized via collisions with the buffer gas as they follow the electrical field, as an ion experiences each collision the kinetic energy of the ion is lowered, eventually becoming capable of reaching the thermal region. The thermalization of ions is dependent on several factors, such as pressure, gas density, and collisional cross section. Ambient pressure IMS (APIMS) has a history of being a stand-alone analytical instrument for the separation and detection of various chemicals such as explosives, drugs, and chemical warfare agents[30]. Most commonly, the drift cell construction is made up of a number of concentric rings resistively coupled and evenly spaced from each other via alumina spacers. The linear field applied to the drift cell comes from a direct DC voltage applied to the rings, it is imperative that the field remains linear, as any variation, destabilization or imperfection of the material can result in irregularities in the field and therefore changing the ion trajectory. In this method, different ionized metal clusters of various sizes experience different collisions the differentiation in collisions will result in various drift times based on size i.e. bigger AgNPs will experience more collisions, resulting in longer drift times while smaller AgNPs will have less collisions and will in return have lower drift times.

The mobility of an ion (K) can be calculated through the usage of equation 1.

$$K = \frac{3}{16} \frac{ze}{N} \left( \frac{1}{M} + \frac{1}{m} \right)^{1/2} \left( \frac{2\pi}{k_b T} \right)^{1/2} \left( \frac{1}{\Omega_0} \right) \quad (1)$$

In which the charge of the ion (z), number density of the gas inside the instrument (N), field strength (E), collisional cross section with a buffer gas (f), ion mass (m) and mass of buffer gas (M) are all parameters that can be changed in order to calculate ion mobility while maintaining temperature (T) at ambient numbers and other constants such as Boltzmann's constant ($k_b$), and elementary charge (e).

The usage of increased pressure and electrical fields allow for the higher performance in resolution for the ASLIM. In FIGS. 20A and 20B it is shown that the increased pressure allows for the separation of various AgNPs sizes to be more detailed and therefore easier for isolation. Due to the different drift times experienced by the NPs throughout the mobility cell, it is possible to isolate specific size NPs. Resolution measurements in the low-field region have been described before. However, when compared to other analytical techniques it becomes difficult to determine the resolution due to the two dominant parameters being that of mass and shape. As suggested by Rokushika and Hatano[54], the resolution (R) for an Ion Mobility instrument in the low field region can be determined as:

$$R = \frac{t}{W_0} = \frac{L}{W_0 KE} \quad (3)$$

In which (t) corresponds to the drift time of the ion, ($W_0$) is the initial ion pulse width, (L) is the length of the drift tube, (K) is mobility, and (E) is the electrical field. It can be noticed in the equation, that at the low-field regime, the resolution is no longer dependent on the drift time, but more of a matter for drift tube length and electrical field present. This plays a vital role in the capability to separate specific size NPs, since parameters such as the length and electrical field may be adjusted in order to obtain better separations for desired cluster sizes.

Figure 19:
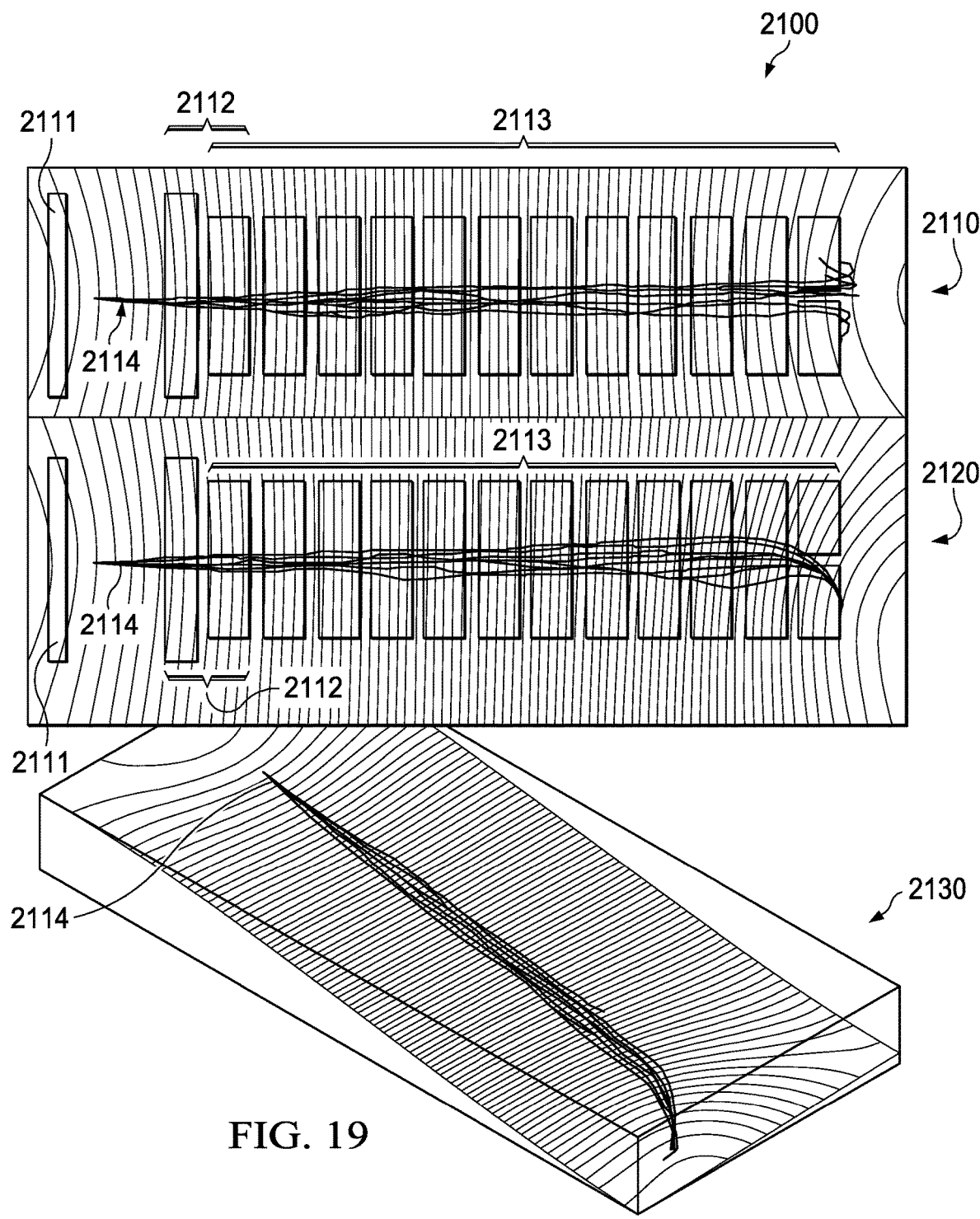
FIG. 19 shows simulated trajectories of ions with an equal potential on the split rings in line with the mobility cell (top), and a lower potential (middle). The bottom displays the potential energy view, as experienced by the ions.

The drift time differences experienced by the various sizes of AgNPs and the resolution of drift times are critical in the sense that through the usage of an ion mobility spectra, combined with calculated drift times, the system is capable of determining the composition cluster size that has traveled through the mobility cell. Knowing the drift times of the ions traveling down the drift tube will allow for time frames to be created in order to activate the split rings to isolate particular AgNPs of interest and soft land them onto the target of interest. Optimizing this method will allow for the size distribution of AgNPs created through this system to remain close and uniform. FIG. 19 shows the simulated path of a silver ion as it travels through the drift region as well as when a potential difference is applied to the split ring system. Briefly, the simulated trajectories 2100 of ions are first depicted at 2110 when an equal potential is applied on the split rings is shown in line with the mobility cell. The back plate 2111 is depicted in relation to the simulated ion trajectories for ions 2114, which are showing crossing the initiation ring mobility region 2112 and the mobility region 2113. In simulation 2120, which shows simulated trajectories for ions when different potentials are applied on the split rings, the path of the simulated ion trajectories for ions 2114 is also shown, which cross the initiation ring mobility region 2112 and the mobility region 2113 but end in different paths. Finally, simulation 2130 is a potential energy view, as experienced by the ions 2114.

Through the use of SimIon, the inventors were able to get averaged calculated drift times under the same parameters in order to determine if the isolation of specific NP sizes would be possible through simple pulse generators to apply to the split rings located at the end of the mobility cell. It must be mentioned, that while the calculated values of the nanoparticles are based on exact sphere models, variations in cluster shapes can attribute to a change in their collisional cross section, and therefore affecting its drift time, however factors such as shape differentiation are also able to be identified depending on the parameters of the laser ablation event, which is where the NPs are generated.

TABLE 1

Calculated masses, collisional cross sections, and drift times of specific AgNP sizes.

| | Mass (amu) | Ω | Avg. Cal. DT (s) |
|---|---|---|---|
| 1 nm | 16628.19 | 3.34E−18 | 0.005428 |
| 2 nm | 133025.5 | 1.3E−17 | 0.004536 |
| 3 nm | 448961.1 | 2.89E−17 | 0.003945 |
| 4 nm | 1064204 | 5.1E−17 | 0.004332 |
| 5 nm | 2078524 | 7.95E−17 | 0.005221 |
| 6 nm | 3591689 | 1.14E−16 | 0.006319 |
| 7 nm | 5703469 | 1.55E−16 | 0.00764 |
| 8 nm | 8513633 | 2.03E−16 | 0.008982 |
| 9 nm | 12121950 | 2.56E−16 | 0.010315 |
| 10 nm | 16628189 | 3.16E−16 | 0.012126 |
| 20 nm | 1.33E+08 | 1.26E−15 | 0.032329 |
| 30 nm | 4.49E+08 | 2.83E−15 | 0.058411 |
| 40 nm | 1.06E+09 | 5.03E−15 | 0.086663 |

Once the AgNPs have successfully been separated, their deposition via soft landing will occur. SL is defined to be deposition that occurs within the translational kinetic energy that preludes the fragmentation of the incident species[38]. The two translational kinetic energy regions are the hyperthermal regime, which belongs to 100 eV to 1 eV region, and the thermal regime, which falls under 1 eV. At these translational energies, great amount of information from ion-surface interactions can be achieved without concern of sample fragmentation. Various experiments have been done in standard drift time ion mobility mass spectrometers (DTI-MS) at atmospheric pressures[55-60]. While having a drift time in the atmospheric pressure region simplifies the gas and vacuum conditions than its counterparts, relatively higher electrical fields are needed in order to successfully propel ions through the buffer gas. This is due to the higher concentration of collisions at higher pressures. However, by remaining in the low electrical field region[61] ($<2V\ cm^{-1}\ Torr^{-1}$) for the mobility cell the inventors are still capable of getting a close determination of the calculated final kinetic energy ($K_E$) of the ions so as to maintain kinetic energies suitable for soft landing at sub 1 eV energies through the usage of equation 2.

$$K_E = \frac{18\pi z^2 e^2 R^2}{512 k_b N^2} \times \left(\frac{E^2 T}{P^2 \Omega^2}\right) \times \left(1 + \frac{m}{M}\right) \quad (2)$$

Figure 20:
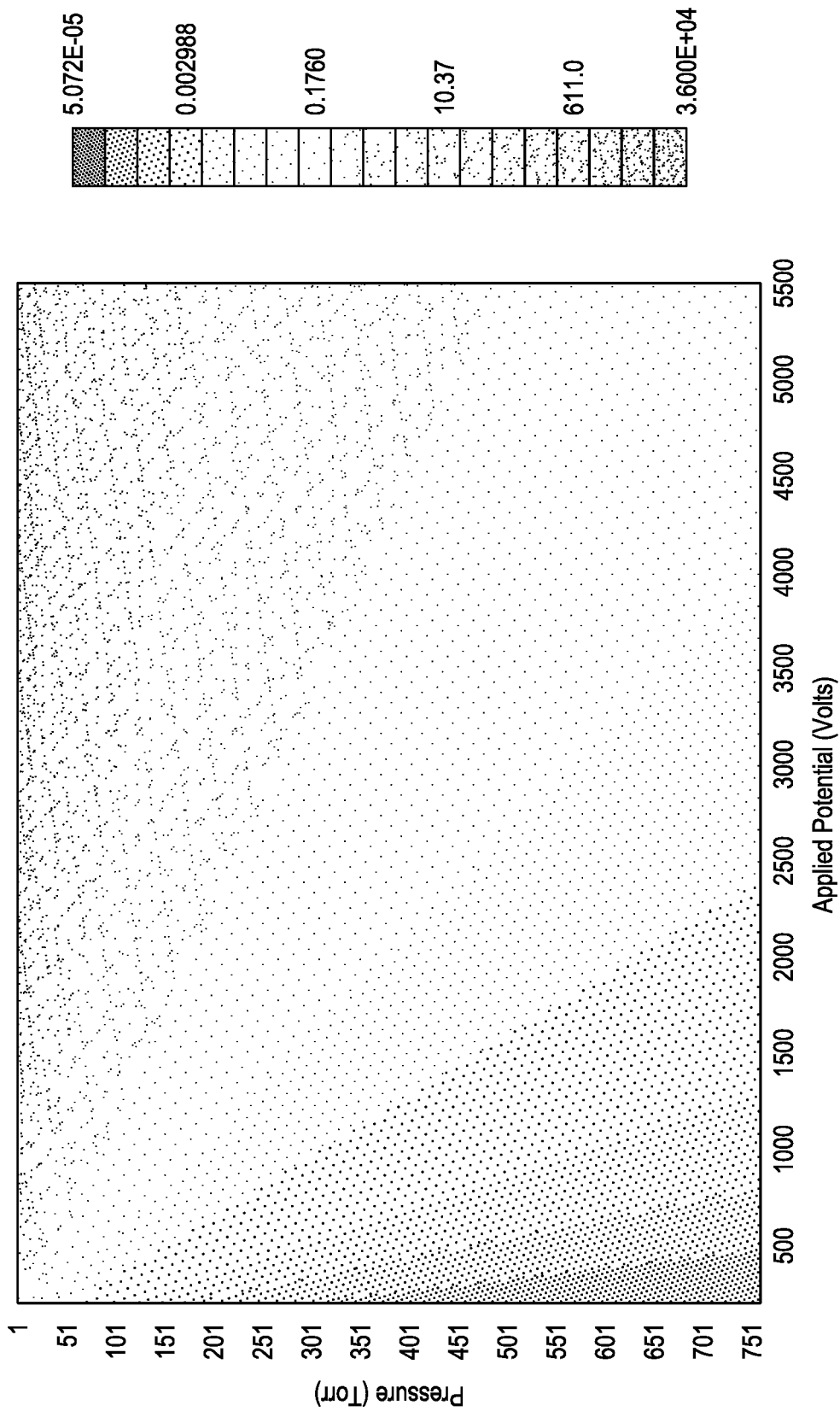
FIG. 20 shows a Kinetic Energy contour plot of electric potential (E) vs pressure (P).

However, it must be noted that the field strength (E), will have a less impact on the energy of the ion due to the higher concentration of collisions at atmospheric pressures[33, 62]. By using equation 2, the inventors are able to change the applied potential to the mobility cell in order to determine the kinetic energy of the ion and maintain it in the soft-landing region. FIG. 20 shows a contour plot of the kinetic energies experienced by the ions at various pressures and applied potentials.

It can be seen through FIG. 20, that while the resulting kinetic energy can be manipulated with the parameters of pressure and applied potential, other ranges aside from the sub-eV can be reached. Briefly, in these views the kinetic energy contour plot of applied (E) v. pressure (P) is shown based on the static collision cross-section (Ω) of $Ag^+$. When viewed with a gray scale contour plot.

Validation and Characterization of Nanostructures.

Due to the lack of a mass selective detector in the ASLIM instrument, the validation of soft landed AgNPs onto surfaces can be carried out outside of the system. A JY triple grating Raman spectrometer, which is capable of analyzing surface morphologies of different substrates as well as different materials in which deposition has occurred, was used with the present invention. Also, a Varian 820 inductively coupled plasma mass spectrometer (ICP-MS) system would provide trace analysis of AgNPs in different soft landed materials, or if a continuation of the work requires the analysis of various other metals.

Dosage Dependent Analysis. Cells. Firstly, a cultivation of healthy and cancerous tissues will be required for this project. Seven examples of cell lines can include, e.g., a normal. differentiated 3T3-L1 murine adipocyte cell line; a normal epithelial breast cell line, MCF-10A for control; and five breast cancer cell lines representing the five molecular classifications described by Holiday and Speirs; ER+ Luminal A, ER+ Luminal B, Basal, Claudin-low, and HER2. The corresponding cell lines are MCF-7, ZR-75-1, MDA-MB-468, MDA-MB-231, and MDA-MB-53, respectively. These cell lines were chosen due to their genetic diversity and the wide range of in vivo breast cancers that they represent[63].

Tissues. Tissue samples can be used for, e.g., the analysis of dosage dependent studies will be performed. While there is a lack of studies that involve the physical reactions of a full tumor, the instrument will be capable of accommodating for various cancer tissues of specific mass. Therefore, once the soft-landing of AgNPs is performed, the usage of various microscopy techniques can be utilized in order to determine physical changes within the overall tumor. Raman spectroscopy can be utilized in order to determine chemical changes within the surface of the tumor, also allowing for the surface of the tumor to be imaged though RAMAN imaging. If the AgNPs remain within the outside of the tumor tissue, those would provide an enhancement in the RAMAN signal.

The present invention can be used with a nanomanipulation workstation also developed by the present inventors, which provides even greater spatial resolution than micromanipulation, it has also shown to be used for sub-cellular analysis within a single cell[64-66]. The workstation is capable of utilizing up to eight nanopositioners, performing microgripping of individual cells, low impedance electrical characterization, nanomanipulation, and nanoextraction. The combination of multiple nanopositioner probes enables simultaneous experiments to be performed on individual or multiple cells. The nanomanipulator has precise positioning capabilities that can quantify and qualify localized chemistry of healthy or diseased state cultures and tissues.

Figure 21:
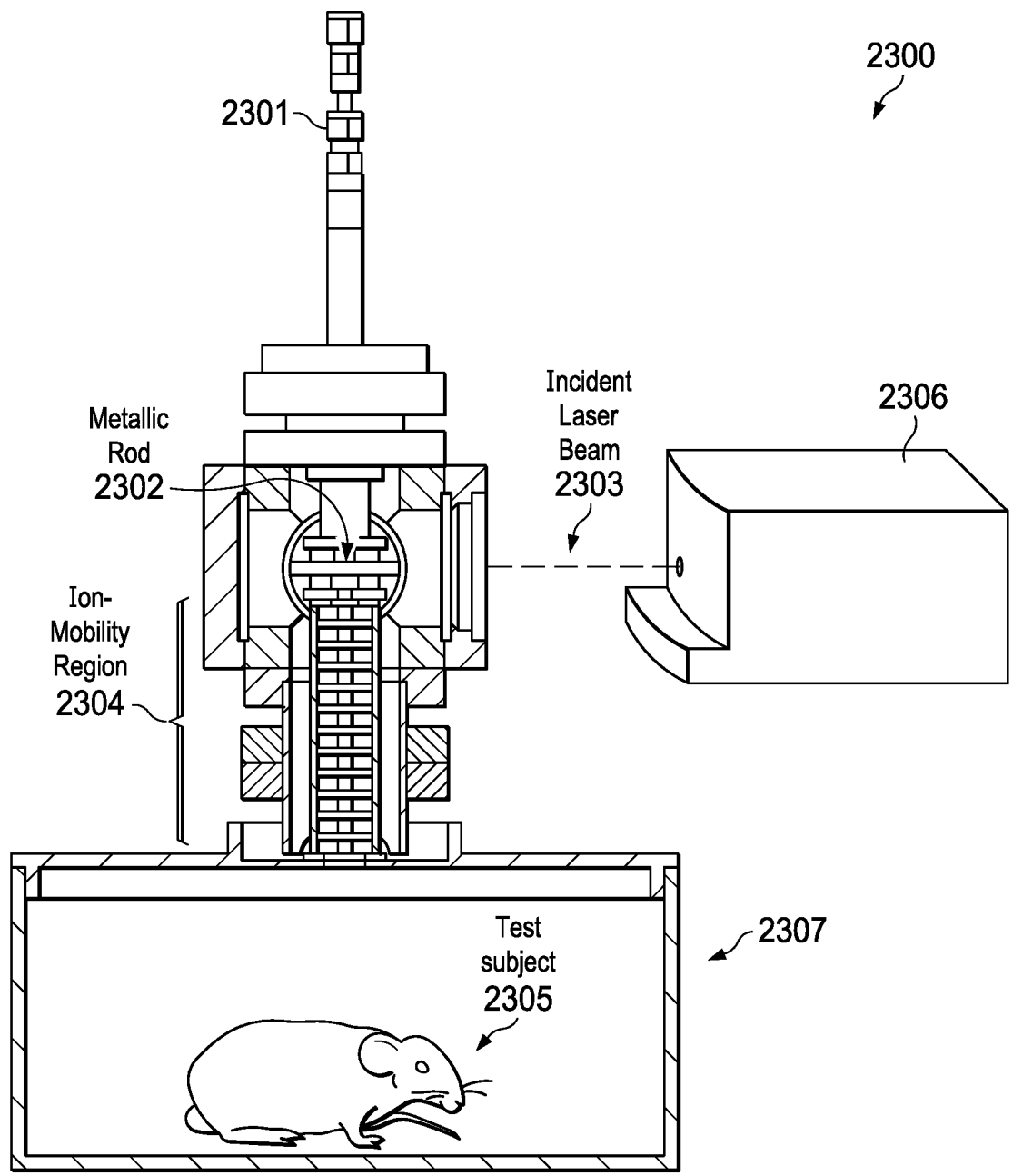
FIG. 21 shows a schematic presentation of the ASLIM system on a container with a biological test subject.

FIG. 21 shows a schematic presentation of the ASLIM system on a container with a biological test subject 2300. Briefly, the buffer gas inlet 2301 is depicted in relation to the metal rod 2302. The metal rod 2302 is contacted by the laser beam 2303, and the ions created from the ablation of nanoparticles from the metal rod 2302 by the laser beam 2303, originating from the laser 2306, enter the mobility region 2304. The test subject 2305 is depicted in the atmospheric landing/target chamber 2307.

In Vivo Tests. The ease of construction and utilization of the instrument taught herein, allows for the instrument to be easily applied onto containers that can hold within them various living organisms such as plants[67] and animals[68,69]. The ability to generate chemical free AgNPs and introduce them into a container without the concern of other physical factors, makes this a great candidate for the exploration of exposure studies onto living organisms. Through this method the inventors would be able to monitor the side effects of exposure onto living organism through the direct intake, exposure, and or inhalation of nanoparticles. Furthermore, due to the controlled environment that this process allows for, the inventors would be able to improve upon the current literature that is available, as the inventors can test the resulting intake from in vivo subjects by analyzing the concentration as well as the effects that nanoparticles induce in organism when they enter their system.

Quantification of AgNPs Taken In. Mass spectrometry can also be utilized for this study, since the chemical changes can be analyzed though the extraction of individual cells or single organelles from the cells themselves. Matrix Assisted Laser-Desorption/Ionization (MALDI) imaging could be unitized in order to truly get a chemical understanding of surfaces or specific sections of the tumor. The ICP-MS located in the lab would be capable of providing quantitative data on AgNPs taken by the cancerous tissues following a method similar to Chithrani et al[14]. Furthermore, chemical differences inside the cancer tissues can be analyzed in pre and post soft landing cancer tissues via many of the different mass spectrometers located inside the LIMS when coupled to our nanomanipulator.

Figure 22:
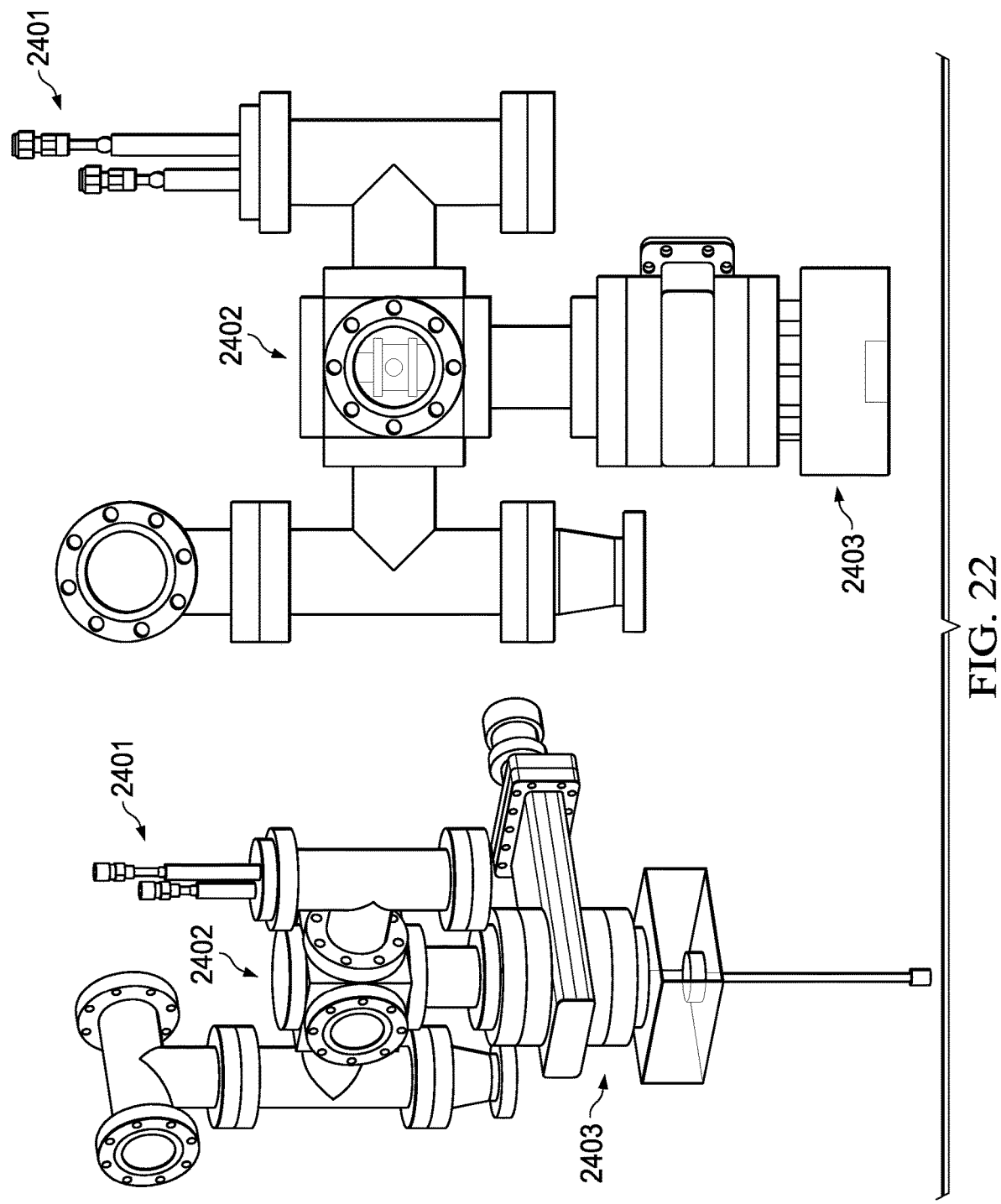
FIG. 22 shows a CAD drawing of ASLIM instrument.

The instrument includes three different components: the ionization region, the ion mobility region, and the soft landing area. FIG. 22 shows a CAD drawing of an instrument of the present invention that shows gas inlets 2401, with the laser-ion rod interaction chamber 2402, with the landing area 2403.

For this particular embodiment the ionization source can use laser ablation. A customized holder for the silver rod is fixed on a conflat flange, both the sample and the holder will be facing directly across from a view port, which accommodates for the laser shot created by, e.g., a 1064 nm Nd:YAG laser. The ablated sample is located at the entrance of the mobility cell just in front of a small plate located parallel to the sample. A potential higher than the mobility cell is applied to this back plate in order to encourage ion motion towards the mobility cell. The mobility cell can include, e.g., 1, 2, 3, 4, 5, 6, 7, 8, 19, 10, 11, 12, 13, 14, 15, 16, 17, 18, 19, 20, 25, 30 or more concentric stainless steel rings resistively coupled to each other.

The ASLIM cell construction will be similar to that of common IM instruments in which a series of concentric stainless steel rings separated via sapphire spheres, the rings are compressed together by all thread rods isolated by ceramic or polymer spacers, will compose the mobility cell; these rings will be resistively coupled to one another by 5MΩ resistors.

An ion optic split-ring assembly can be placed at the end of the drift tube, where a potential on one of the halves of the rings is applied in line with that of the drift tube and the other halves of the two rings are pulsed down to a lower voltage for a set time period corresponding to a peak based on the drift tube spectra. This gating allows us to select the specific size cluster and deposit it on the substrate.

A Bradbury Nielson Gate may also be applied instead of the split-ring assembly, by which an electric potential is applied to it, and the corresponding electrical field works against the motion of the ions, therefore halting their path. The mobility cell will then be electrically isolated via Kapton film in order to minimize electrical breakdown, then the entire cell will be enclosed in a stainless steel housing. The mobility cell will be operated at standard ambient conditions (760 Torr, and 294 K) by which the desired pressure will be regulated by a constant flow of buffer gas and maintained through a series of valves, a pressure gauge will be used in order to confirm desired pressure has been attained. The buffer gas will be introduced into the mobility cell to allow for the collisions to occur through. As the NPs are created via laser ablation, they will be introduced into the mobility cell; collisions with the buffer gas molecules will thermalize the ions, resulting in the decrease in kinetic energy.

Figure 23:
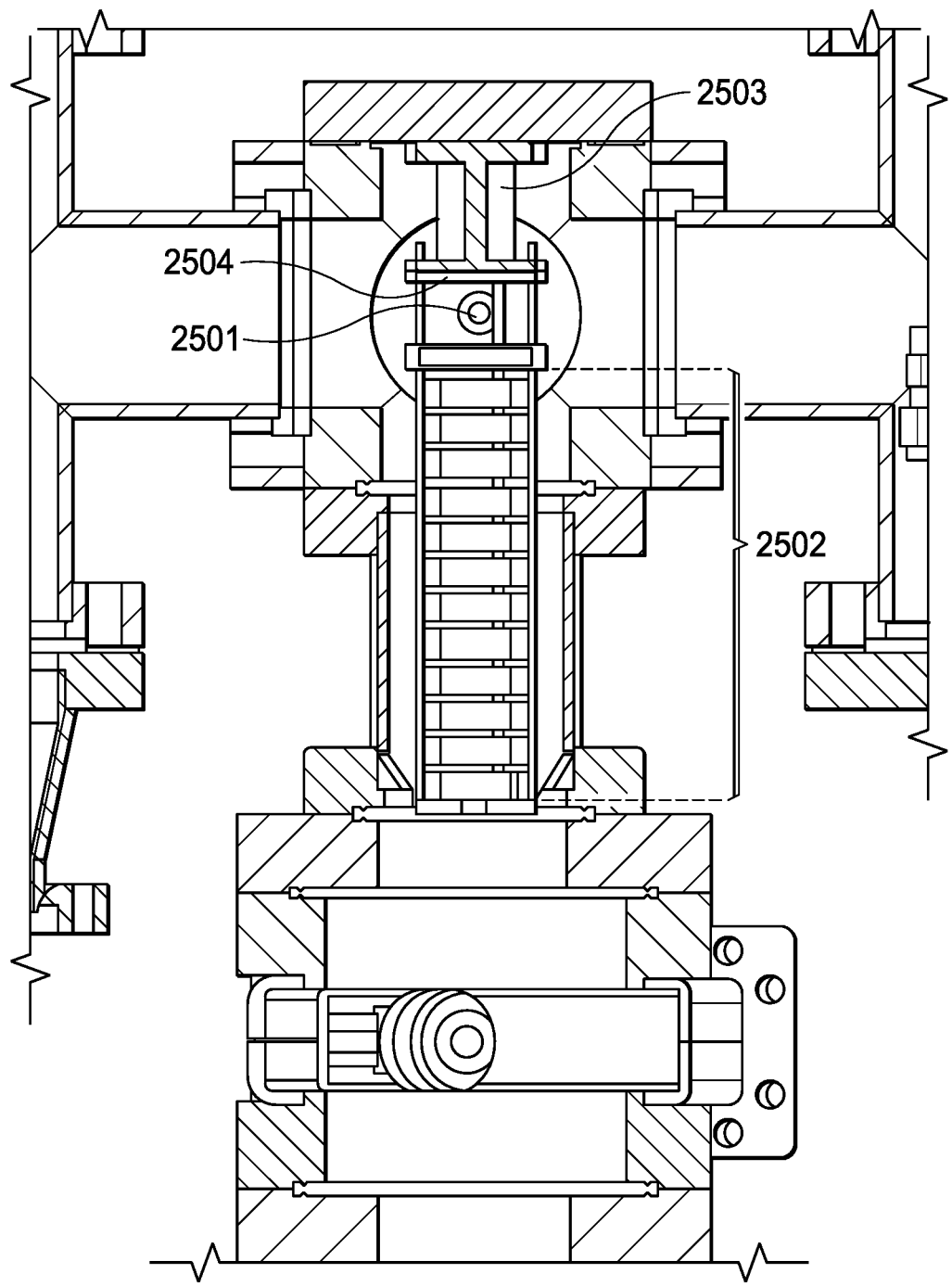
FIG. 23 shows a cross-sectional CAD drawing of mobility cell region in ASLIM system.

Initially, a Quartz Crystal Microbalance (QCM) can be placed at the end of the mobility cell in order to determine the dosages of AgNPs soft-landed on the surface based on deposition times, this approach will allow for a guideline to be created in order to determine dosage times. FIG. 23 provides a cross section view of the ASLIM instrument, showing the mobility cell showing the rod 2501, the mobility region 2502, the ceramic ASLIM holder 2503, and the back plate 2504.

Figure 24:
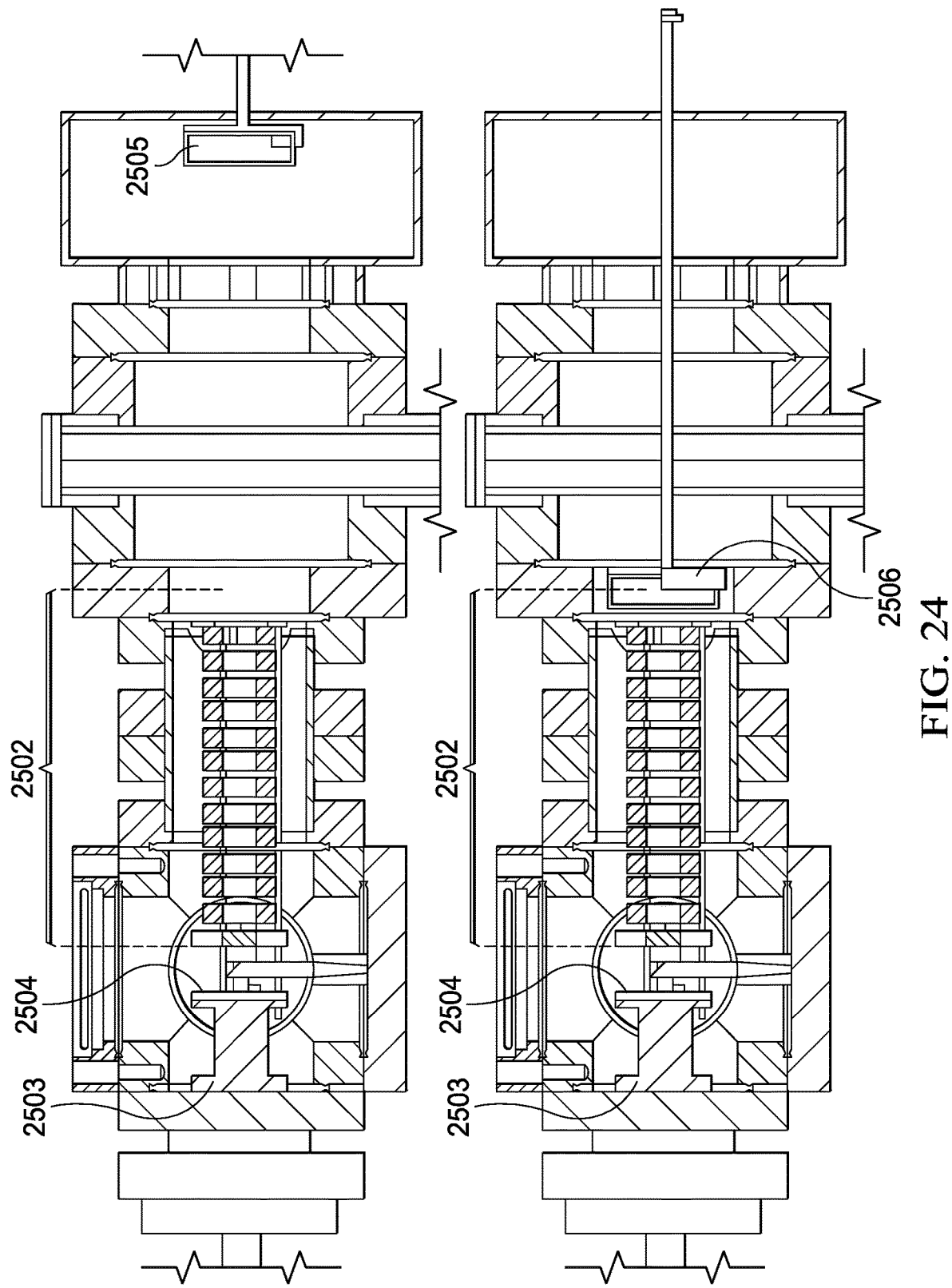
FIG. 24 shows a cross-section CAD drawing of landing chamber prior to landing (top) and during landing (bottom) position.

The third section of the instrument will be the landing chamber; this chamber will be capable of being built from a non-conducting polymer since no vacuum conditions will be present, therefore outgassing will not be a concern. The landing chamber will be lightweight and capable of being re-used with little prior preparation. The chamber will be capable of maintaining a preferable environment for cancer tissues in order to minimize contamination, which could result in damage of the tissues and therefore making them unsuitable for analysis. A simple gate valve located between the end of the mobility cell and the landing chamber will maintain the chamber isolated until the ASLIM chamber has been pressurized to ideal conditions for operation. FIG. 24 shows a gate valve mechanism prior to and during deposition for the ASLIM system, showing the mobility region 2502, the ceramic ASLIM holder 2503, the back plate 2504, and two different landing locations 2505 (top) and 2506 (bottom).

Once the AgNPs have traveled down the mobility cell, isolated, and landed; analysis on the landed substrates will take place. Due to the lack of a mass selective detector on the instrument, confirmation and analysis of the AgNPs will take place outside the instrument. Initially, surfaces other than cancerous tissues will be tested in order to calibrate deposition energy, and amounts. Once all parameters have been optimized, AgNPs will be landed on cancer tissues and chemical changes within the tissues can be analyzed both physically and chemically.

A SLIM instrument was utilized for studies such as the preparative production of soft-landed copper ion clusters on mica surfaces[33], analysis of AgNPs for Matrix Assisted Laser Desorption Ionization (MALDI) matrices[38], as well as MALDI-MS and imaging of latent fingerprints[37]. Various pressures ranging between 1 and 100 Torr, as well as buffer gases ($H_2$, He, Ar, and $N_2$) have been tested. Analysis though SEM, AFM, and ICP-MS were used in order to determine the assemblies of copper clusters and AgNPs.

Figure 25C:
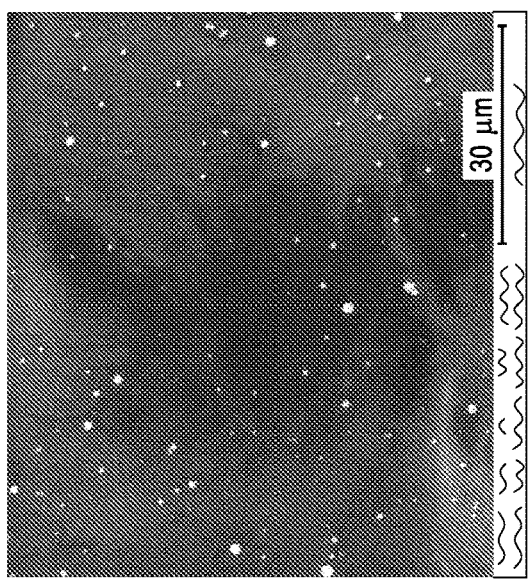
FIGS. 25A to 25C show SEM images showing the overall tissue (FIG. 25A), a zoomed section showing AgNP distribution after 20 mins (FIG. 25B), and a zoomed image showing the adhesion of some AgNPs onto the tissue (FIG. 25C).
Figure 25B:
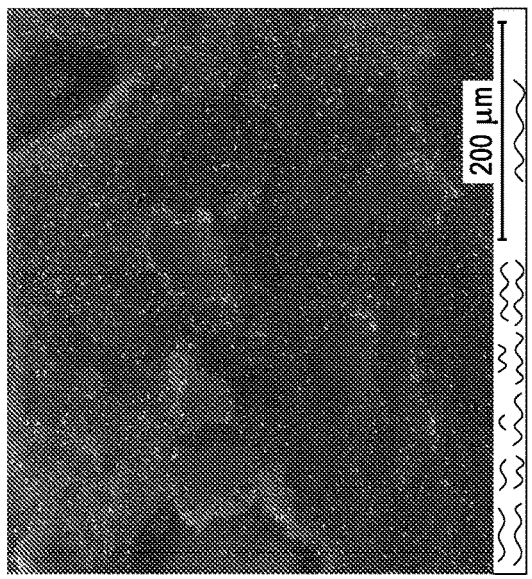
Figure 25A:
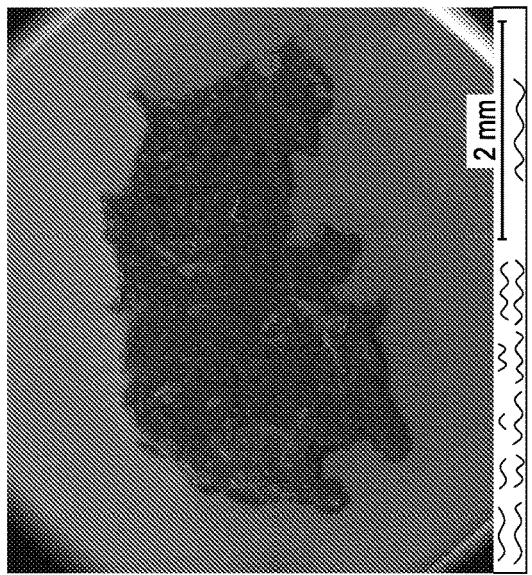

The soft-landing of AgNPs at reduced pressures was achieved onto cow liver tissues in order to determine if the AgNPs would adhere to tissues even at such low kinetic energies. FIGS. 25A to 25C shows a series of SEM images showing the overall tissue (FIG. 25A), a zoomed section showing AgNP distribution after 20 mins (FIG. 25B), and a zoomed image showing the adhesion of some AgNPs onto the tissue (FIG. 25C).

It is contemplated that any embodiment discussed in this specification can be implemented with respect to any method, kit, reagent, or composition of the invention, and vice versa. Furthermore, compositions of the invention can be used to achieve methods of the invention.

It will be understood that particular embodiments described herein are shown by way of illustration and not as limitations of the invention. The principal features of this invention can be employed in various embodiments without departing from the scope of the invention. Those skilled in the art will recognize, or be able to ascertain using no more than routine experimentation, numerous equivalents to the specific procedures described herein. Such equivalents are considered to be within the scope of this invention and are covered by the claims.

All publications and patent applications mentioned in the specification are indicative of the level of skill of those skilled in the art to which this invention pertains. All publications and patent applications are herein incorporated by reference to the same extent as if each individual publication or patent application was specifically and individually indicated to be incorporated by reference.

The use of the word "a" or "an" when used in conjunction with the term "comprising" in the claims and/or the specification may mean "one," but it is also consistent with the meaning of "one or more," "at least one," and "one or more than one." The use of the term "or" in the claims is used to mean "and/or" unless explicitly indicated to refer to alternatives only or the alternatives are mutually exclusive, although the disclosure supports a definition that refers to only alternatives and "and/or." Throughout this application, the term "about" is used to indicate that a value includes the inherent variation of error for the device, the method being employed to determine the value, or the variation that exists among the study subjects.

As used in this specification and claim(s), the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, AB, BBC, AAABCCCC, CBBAAA, CABABB, and so forth. The skilled artisan will understand that typically there is no limit on the number of items or terms in any combination, unless otherwise apparent from the context.

All of the compositions and/or methods disclosed and claimed herein can be made and executed without undue experimentation in light of the present disclosure. While the compositions and methods of this invention have been described in terms of preferred embodiments, it will be apparent to those of skill in the art that variations may be applied to the compositions and/or methods and in the steps or in the sequence of steps of the method described herein without departing from the concept, spirit and scope of the invention. All such similar substitutes and modifications apparent to those skilled in the art are deemed to be within the spirit, scope and concept of the invention as defined by the appended claims.

REFERENCES—EXAMPLE 1

U.S. Pat. No. 5,948,703: Method of Soft-Landing Gate Etching to Prevent Gate Oxide Damage.

U.S. Patent Application No. 20090011953: Methods and Apparatuses for Preparing A Surface to Have Catalytic Activity.

U.S. Pat. No. 7,081,617: Gas-Phase Purification of Biomolecules by Ion Mobility for Patterning Microarrays and Protein Crystal Growth.

1(a) Smith, L. P; Parkins, W. E.; Forrester, A. T. Phys. Rev 11 (1947) 989. (b) Love, L. O. Science 182 (1973) 343. (c) Yergey, A. L., Yergey, A. K. J. Am. Soc. Mass Spetrom. 8 (1997) 943.

2 Abbet, S.; Judai, K.; Klinger, L.; Heiz, U. Pure Appl. Chem. 74 (2002) 1527.

3(a) Cooks, R. G; Jo, S. C.; Green, J. App. Surf. Sci. 231-232 (2004) 13. (b). Ouyang, Z.; Takats, Z.; Blake, T. A.; Gologan, B.; Guyman, A. J.; Wiseman, J. M.; Oliver, J. C.; Davisson, V. J.; Cooks, R. G. Science 301 (2003) 1351. (c). Blake, T. A.; Ouyang, Z.; Wiseman, J. M.; Takats, Z.; Guymon, A. J.; Kothari, S.; Cooks, R. G. Anal. Chem. 76 (2004) 6293. (d) Volny, M.; Elam, W. T.; Branca, A; Ratner, B. D.; Turecek, F. Anal. Chem. 77 (2005) 4890. (e) Mayer, P. S.; Turecek, F.; Lee, H. N.; Scheidemann, A. A.; Olney, T. N.; Schumacher, F.; Strop, P.; Smrcina, M; Patek, M; Schirlin, D. Anal. Chem. 77 (2005) 4378.

4 Jacobson, D. B.; Freiser, B. S. J. Am. Chem. Soc. 106 (1984) 4623.

5 S. Nagaoka, T. Matsumoto, K. Ikemoto, M. Mitsui, and A. Nakajima, J. Am. Chem. Soc. 129, 1528 (2007).

6 M. B. J. Wijesundara, E. Fuoco, and L. Hanley, Langmuir 17, 5721 (2001).

7 X. Yang, P. S. Mayer, and F. Ture, J. Mass Spectrom. 41, 256 (2006).

8 V. Franchetti, B. H. Solka, W. E. Baitinger, J. W. Amy, and R. G. Cooks, Int. J. Mass Spectrom. Ion Phys. 23, 29 (1977).

9 L. Hanley and S. B. Sinnott, Surf. Sci. 500, 500 (2002).

10 W.-P. Peng, M. P. Goodwin, Z. Nie, M. Volny, Z. Ouyang, and R. G. Cooks, Anal. Chem. 80, 6640 (2008).

11 O. Hadjar, P. Wang, J. H. Futrell, Y. Dessiaterik, Z. Zhu, J. P. Cowin, M. J. Iedema, and J. Laskin, Anal. Chem. 79, 6566 (2007).

12 B. Gologan, J. R. Green, J. Alvarez, J. Laskin, and R. G. Cooks, Phys. Chem. Chem. Phys. 7, 1490 (2005).

13 P. S. Mayer, F. Turecek, H.-N. Lee, A. A. Scheidemann, T. N. Olney, F. Schumacher, P. Strop, M. Smrcina, M. Patek, and D. Schirlin, Anal. Chem. 77, 4378 (2005).

14 J. Alvarez, R. G. Cooks, S. E. Barlow, D. J. Gaspar, J. H. Futrell, and J. Laskin, Anal. Chem. 77, 3452 (2005).

15 J. Laskin, E. V. Denisov, A. K. Shukla, S. E. Barlow, and J. H. Futrell, Anal. Chem. 74, 3255 (2002).

16 E. W. McDaniel and J. T. Moseley, Phys. Rev. A 3, 1040 (1971).

17 E. A. Mason and E. W. McDaniel, Transport Properties of Ions in Gases (Wiley, New York, 1988).

18 H. E. Revercomb and E. A. Mason, Anal. Chem. 47, 970 (1975).

19 G. H. Wannier, Bell Syst. Tech. J. 32, 85 (1953).

20 G. A. Eiceman and Z. Karpas, Ion Mobility Spectrometry, 2nd ed. (Taylor and Francis, Boca Raton, 2005).

21 S. Rokushika, H. Hatano, M. A. Bairn, and H. H. Hill, Anal. Chem. 57, 1902 (1985).

22 G. R. Asbury and H. H. Hill, Jr., J. Microcolumn September 12, 172 (2000).

23 P. Watts and A. Wilders, Int. J. Mass Spectrom. Ion Process. 112, 179 (1992).

24 G. F. Verbeck, B. T. Ruotolo, K. J. Gillig, and D. H. Russell, J. Am. Soc. Mass Spectrom. 15, 1320 (2004).

25 H. H. Hill, W. F. Siems, and R. H. St. Louis, Anal. Chem. 62, 1201A (1990).

26 J. A. Hornbeck and G. H. Wannier, Phys. Rev. 82, 458 (1951).

27 J. A. Mclean, D. H. Russell, and J. A. Schultz, U.S. Pat. No. 7,081,617 B2 (25 Jul. 2006).

28 D. E. Powers, S. G. Hansen, M. E. Geusic, D. L. Michalopoulos, and R. E. Smalley, J. Chem. Phys. 78, 2866 (1983).

25 R. E. Leuchtner, A. C. Harms, and J. A. W. Castleman, J. Chem. Phys. 92, 6527 (1990).

30 P. R. Kemper and M. T. Bowers, J. Phys. Chem. 95, 5134 (1991).

31 J. P. K. Doye and D. J. Wales, Chem. Phys. Lett. 247, 339 (1995).

32 V. G. Grigoryan, D. Alamanova, and M. Springborg, Phys. Rev. B 73, 115415 (2006).

33 S. Gafner, S. Kosterin, and Y. Gafner, Phys. Solid State 49, 1558 (2007).

34 P. Dugourd, R. R. Hudgins, and M. F. Jarrold, Chem. Phys. Lett. 267, 186 (1997).

35 T. Yoshida, S. Takeyama, Y. Yamada, and K. Mutoh, Appl. Phys. Lett. 68, 1772 (1996).

36 Z. Pászti, Z. E. Horváth, G. Petö, A. Karacs, and L. Guczi, Appl. Surf. Sci. 109-110, 67 (1997).

37 D. B. Geohegan, Appl. Phys. Lett. 60, 2732 (1992).

38 N. Matsuki, T.-W. Kim, J. Ohta, and H. Fujioka, Solid State Commun. 136, 338 (2005).

39 G. Oosterhout, Acta Crystallogr. 13, 932 (1960).

REFERENCES—EXAMPLE 2

1. Bailey, M. J.; Bradshaw, R.; Francese, S.; Salter, T. L.; Costa, C.; Ismail, M.; P. Webb, R.; Bosman, I.; Wolff, K.; de Puit, M., Rapid detection of cocaine, benzoylecgonine and methylecgonine in fingerprints using surface mass spectrometry. Analyst 2015, 140 (18), 6254-6259.

2. Karas, M.; Bachmann, D.; Hillenkamp, F., Influence of the wavelength in high-irradiance ultraviolet laser desorption mass spectrometry of organic molecules. Analytical Chemistry 1985, 57 (14), 2935-2939.

3. Beavis, R. C.; Chait, B. T.; Fales, H. M., Cinnamic acid derivatives as matrices for ultraviolet laser desorption mass spectrometry of proteins. Rapid Communications in Mass Spectrometry 1989, 3 (12), 432-435.

4. Strupat, K.; Karas, M.; Hillenkamp, F., 2,5-Dihydroxybenzoic acid: a new matrix for laser desorption-ionization mass spectrometry. International Journal of Mass Spectrometry and Ion Processes 1991, 111 (0), 89-102.

5. Fitzgerald, M. C.; Parr, G. R.; Smith, L. M., Basic matrixes for the matrix-assisted laser desorption/ionization mass spectrometry of proteins and oligonucleotides. Analytical Chemistry 1993, 65 (22), 3204-3211.

6. Beavis, R. C.; Chait, B. T.; Standing, K. G., Matrix-assisted laser-desorption mass spectrometry using 355 nm radiation. Rapid Communications in Mass Spectrometry 1989, 3 (12), 436-439.

7. Beavis, R. C.; Chaudhary, T.; Chait, B. T., α-Cyano-4-hydroxycinnamic acid as a matrix for matrixassisted laser desorption mass spectromtry. Organic Mass Spectrometry 1992, 27 (2), 156-158.

8. Gusev, A. I.; Wilkinson, W. R.; Proctor, A.; Hercules, D. M., Improvement of signal reproducibility and matrix/comatrix effects in MALDI analysis. Anal. Chem. 1995, 67 (6), 1034-1041.

9. Guo, Z.; Zhang, Q.; Zou, H.; Guo, B.; Ni, J., A Method for the Analysis of Low-Mass Molecules by MALDI-TOF Mass Spectrometry. Analytical Chemistry 2002, 74 (7), 1637-1641.

10. Zenobi, R.; Knochenmuss, R., Ion formation in MALDI mass spectrometry. Mass Spectrometry Reviews 1998, 17 (5), 337-366.

11. Marie, A.; Fournier, F.; Tabet, J. C., Characterization of Synthetic Polymers by MALDI-TOF/MS: Investigation into New Methods of Sample Target Preparation and Consequence on Mass Spectrum Finger Print. Analytical Chemistry 2000, 72 (20), 5106-5114.

12. Hankin, J.; Barkley, R.; Murphy, R., Sublimation as a method of matrix application for mass spectrometric imaging. Journal of the American Society for Mass Spectrometry 2007, 18 (9), 1646-1652.

13. Trimpin, S.; Rouhanipour, A.; Az, R.; Rader, H. J.; Milllen, K., New aspects in matrix-assisted laser desorption/ionization time-of-flight mass spectrometry: a universal solvent-free sample preparation. Rapid Communications in Mass Spectrometry 2001, 15 (15), 1364-1373.

14. Prabhakaran, A.; Yin, J.; Nysten, B.; Degand, H.; Morsomme, P.; Mouhib, T.; Yunus, S.; Bertrand, P.; Delcorte, A., Metal condensates for low-molecular-weight matrix-free laser desorption/ionization. International Journal of Mass Spectrometry 2012, 315 (0), 22-30.

15. Knochenmuss, R., Ion formation mechanisms in UV-MALDI. Analyst 2006, 131 (9), 966-986.

16. Wei, J.; Buriak, J. M.; Siuzdak, G., Desorption—ionization mass spectrometry on porous silicon. Nature 1999, 399, 243-246.

17. Go, E. P.; Prenni, J. E.; Wei, J.; Jones, A.; Hall, S. C.; Witkowska, H. E.; Shen, Z.; Siuzdak, G., Desorption/Ionization on Silicon Time-of-Flight/Time-of-Flight Mass Spectrometry. Analytical Chemistry 2003, 75 (10), 2504-2506.

18. Cuiffi, J. D.; Hayes, D. J.; Fonash, S. J.; Brown, K. N.; Jones, A. D., Desorption-Ionization Mass Spectrometry Using Deposited Nanostructured Silicon Films. Analytical Chemistry 2001, 73 (6), 1292-1295.

19. Delcorte, A.; Bour, J.; Aubriet, F.; Muller, J. F.; Bertrand, P., Sample Metallization for Performance Improvement in Desorption/Ionization of Kilodalton Molecules: Quantitative Evaluation, Imaging Secondary Ion MS, and Laser Ablation. Analytical Chemistry 2003, 75 (24), 6875-6885.

20. Chen, L. C.; Mori, K.; Hori, H.; Hiraoka, K., Au-assisted visible laser MALDI. International Journal of Mass Spectrometry 2009, 279 (1), 41-46.

21. Pan, C.; Xu, S.; Hu, L.; Su, X.; Ou, J.; Zou, H.; Guo, Z.; Zhang, Y.; Guo, B., Using oxidized carbon nanotubes as matrix for analysis of small molecules by MALDI-TOF MS. Journal of the American Society for Mass Spectrometry 2005, 16 (6), 883-892.

22. Xu, S.; Li, Y.; Zou, H.; Qiu, J.; Guo, Z.; Guo, B., Carbon Nanotubes as Assisted Matrix for Laser Desorption/Ionization Time-of-Flight Mass Spectrometry. Analytical Chemistry 2003, 75 (22), 6191-6195.

23. Sunner, J.; Dratz, E.; Chen, Y.-C., Graphite surface-assisted laser desorption/ionization time-of-flight mass spectrometry of peptides and proteins from liquid solutions. Analytical Chemistry 1995, 67 (23), 4335-4342.

24. Dong, X.; Cheng, J.; Li, J.; Wang, Y., Graphene as a Novel Matrix for the Analysis of Small Molecules by MALDI-TOF MS. Analytical Chemistry 2010, 82 (14), 6208-6214.

25. Guan, B.; Lu, W.; Fang, J.; Cole, R., Characterization of synthesized titanium oxide nanoclusters by MALDI-TOF mass spectrometry. Journal of the American Society for Mass Spectrometry 2007, 18 (3), 517-524.

26. McLean, J. A.; Stumpo, K. A.; Russell, D. H., Size-Selected (2-10 nm) Gold Nanoparticles for Matrix Assisted Laser Desorption Ionization of Peptides. Journal of the American Chemical Society 2005, 127 (15), 5304-5305.

27. Sherrod, S. D.; Diaz, A. J.; Russell, W. K.; Cremer, P. S.; Russell, D. H., Silver Nanoparticles as Selective Ionization Probes for Analysis of Olefins by Mass Spectrometry. Anal. Chem. 2008, 80 (17), 6796-6799.

28. Gholipour, Y.; Giudicessi, S. L.; Nonami, H.; Erra-Balsells, R., Diamond, Titanium Dioxide, Titanium Silicon Oxide, and Barium Strontium Titanium Oxide Nanoparticles as Matrixes for Direct Matrix-Assisted Laser Desorption/Ionization Mass Spectrometry Analysis of Carbohydrates in Plant Tissues. Analytical Chemistry 2010, 82 (13), 5518-5526.

29. Shariatgorji, M.; Amini, N.; Ilag, L., Silicon nitride nanoparticles for surface-assisted laser desorption/ionization of small molecules. Journal of Nanoparticle Research 2009, 11 (6), 1509-1512.

30. Wu, H.-P.; Yu, C.-J.; Lin, C.-Y.; Lin, Y.-H.; Tseng, W.-L., Gold Nanoparticles as Assisted Matrices for the Detection of Biomolecules in a High-Salt Solution through Laser Desorption/Ionization Mass Spectrometry. J. Am. Soc. Mass. Spectrom. 2009, 20 (5), 875-882.

31. Hua, L.; Chen, J.; Ge, L.; Tan, S. N., Silver Nanoparticles as matrix for laser desorption/ionization mass spectrometry of peptides. Journal of Nanoparticle Research 2007, 9, 1133-1138.

32. Su, C.-L.; Tseng, W.-L., Gold Nanoparticles as Assisted Matrix for Determining Neutral Small Carbohydrates through Laser Desorption/Ionization Time-of-Flight Mass Spectrometry. Analytical Chemistry 2007, 79 (4), 1626-1633.

33. Tanaka, K.; Waki, H.; Ido, Y.; Akita, S.; Yoshida, Y.; Yoshida, T.; Matsuo, T., Protein and polymer analyses up to m/z 100 000 by laser ionization time-of-flight mass spectrometry. Rapid Communications in Mass Spectrometry 1988, 2 (8), 151-153.

34. Lowndes, D. H.; Geohegan, D. B.; Puretzky, A. A.; Norton, D. P.; Rouleau, C. M., Synthesis of Novel Thin-Film Materials by Pulsed Laser Deposition. Science 1996, 273 (5277), 898-903.

35. Park, S. M.; Chae, H.; Wee, S.; Lee, I., Anomalous enrichment of $C_2^+$ ions by laser ablation of graphite in Ar jet. The Journal of Chemical Physics 1998, 109 (3), 928-931.

36. Becker, M. F.; Brock, J. R.; Cai, H.; Henneke, D. E.; Keto, J. W.; Lee, J.; Nichols, W. T.; Glicksman, H. D., Metal nanoparticles generated by laser ablation. Nanostruct. Mater. 1998, 10 (5), 853-863.

37. Ganeev, R. A.; Chakravarty, U.; Naik, P. A.; Srivastava, H.; Mukherjee, C.; Tiwari, M. K.; Nandedkar, R. V.; Gupta, P. D., Pulsed laser deposition of metal films and nanoparticles in vacuum using subnanosecond laser pulses. Applied Optics 2007, 46 (8), 1205-1210.

38. Yoshida, T.; Takeyama, S.; Yamada, Y.; Mutoh, K., Nanometer-sized silicon crystallites prepared by excimer laser ablation in constant pressure inert gas. Applied Physics Letters 1996, 68 (13), 1772-1774.

39. Xu, C.; de Beer, E.; Arnold, D. W.; Arnold, C. C.; Neumark, D. M., Anion photoelectron spectroscopy of small indium phosphide clusters ($In_xP^-_y$; x,y=1-4). The Journal of Chemical Physics 1994, 101 (6), 5406-5409.

40. Wood, R. F.; Leboeuf, J. N.; Chen, K. R.; Geohegan, D. B.; Puretzky, A. A., Dynamics of plume propagation, splitting, and nanoparticle formation during pulsed-laser ablation. Applied Surface Science 1998, 127-129 (0), 151-158.
41. Wolstenholme, R.; Bradshaw, R.; Clench, M. R.; Francese, S., Study of latent fingermarks by matrix-assisted laser desorption/ionisation mass spectrometry imaging of endogenous lipids. Rapid Communications in Mass Spectrometry 2009, 23 (19), 3031-3039.
42. Camera, E.; Ludovici, M.; Galante, M.; Sinagra, J.-L.; Picardo, M., Comprehensive analysis of the major lipid classes in sebum by rapid resolution high-performance liquid chromatography and electrospray mass spectrometry. Journal of Lipid Research 2010, 51 (11), 3377-3388.
43. Bailey, M. J.; Bright, N. J.; Croxton, R. S.; Francese, S.; Ferguson, L. S.; Hinder, S.; Jickells, S.; Jones, B. J.; Jones, B. N.; Kazarian, S. G.; Ojeda, J. J.; Webb, R. P.; Wolstenholme, R.; Bleay, S., Chemical Characterization of Latent Fingerprints by Matrix-Assisted Laser Desorption Ionization, Time-of-Flight Secondary Ion Mass Spectrometry, Mega Electron Volt Secondary Mass Spectrometry, Gas Chromatography/Mass Spectrometry, X-ray Photoelectron Spectroscopy, and Attenuated Total Reflection Fourier Transform Infrared Spectroscopic Imaging: An Intercomparison. Analytical Chemistry 2012, 84 (20), 8514-8523.
44. Croxton, R. S.; Baron, M. G.; Butler, D.; Kent, T.; Sears, V. G., Variation in amino acid and lipid composition of latent fingerprints. Forensic Science International 2010, 199 (1-3), 93-102.
45. Bradshaw, R.; Rao, W.; Wolstenholme, R.; Clench, M. R.; Bleay, S.; Francese, S., Separation of overlapping fingermarks by Matrix Assisted Laser Desorption Ionisation Mass Spectrometry Imaging. Forensic Science International 2012, 222 (1-3), 318-326.
46. Ferguson, L.; Bradshaw, R.; Wolstenholme, R.; Clench, M.; Francese, S., Two-Step Matrix Application for the Enhancement and Imaging of Latent Fingermarks. Analytical Chemistry 2011, 83 (14), 5585-5591.
47. Ferguson, L. S.; Creasey, S.; Wolstenholme, R.; Clench, M. R.; Francese, S., Efficiency of the dry-wet method for the MALDI-MSI analysis of latent fingermarks. Journal of Mass Spectrometry 2013, 48 (6), 677-684.
48. Clemons, K.; Wiley, R.; Waverka, K.; Fox, J.; Dziekonski, E.; Verbeck, G. F., Direct Analyte-Probed Nanoextraction Coupled to Nanospray Ionization-Mass Spectrometry of Drug Residues from Latent Fingerprints. Journal of Forensic Sciences 2013, 58 (4), 875-880.
49. Franchetti, V.; Solka, B. H.; Baitinger, W. E.; Amy, J. W.; Cooks, R. G., Soft landing of ions as a means of surface modification. International Journal of Mass Spectrometry and Ion Physics 1977, 23 (1), 29-35.
50. Volný, M.; Elam, W. T.; Branca, A.; Ratner, B. D.; Tureček, F., Preparative Soft and Reactive Landing of Multiply Charged Protein Ions on a Plasma-Treated Metal Surface. Analytical Chemistry 2005, 77 (15), 4890-4896.
51. Alvarez, J.; Cooks, R. G.; Barlow, S. E.; Gaspar, D. J.; Futrell, J. H.; Laskin, J., Preparation and in Situ Characterization of Surfaces Using Soft Landing in a Fourier Transform Ion Cyclotron Resonance Mass Spectrometer. Analytical Chemistry 2005, 77 (11), 3452-3460.
52. Tong, X.; Benz, L.; Kemper, P.; Metiu, H.; Bowers, M. T.; Buratto, S. K., Intact Size-Selected Aun Clusters on a TiO2(110)-(1×1) Surface at Room Temperature. Journal of the American Chemical Society 2005, 127 (39), 13516-13518.
53. Peng, W.-P.; Goodwin, M. P.; Nie, Z.; Volny, M.; Ouyang, Z.; Cooks, R. G., Ion Soft Landing Using a Rectilinear Ion Trap Mass Spectrometer. Analytical Chemistry 2008, 80 (17), 6640-6649.
54. Davila, S. J.; Birdwell, D. O.; Verbeck, G. F., Drift tube soft-landing for the production and characterization of materials: Applied to Cu clusters. Rev. Sci. Instrum. 2010, 81 (3), 034104-6.
55. Dai, Y.; Whittal, R. M.; Li, L., Confocal Fluorescence Microscopic Imaging for Investigating the Analyte Distribution in MALDI Matrices. Analytical Chemistry 1996, 68 (15), 2494-2500.
56. Dai, Y.; Whittal, R. M.; Li, L., Two-Layer Sample Preparation: A Method for MALDI-MS Analysis of Complex Peptide and Protein Mixtures. Analytical Chemistry 1999, 71 (5), 1087-1091.
57. Karas, M.; Hillenkamp, F., Laser desorption ionization of proteins with molecular masses exceeding 10,000 daltons. Analytical Chemistry 1988, 60 (20), 2299-2301.
58. Xiang, F.; Beavis, R. C.; Ens, W., A method to increase contaminant tolerance in protein matrix-assisted laser desorption/ionization by the fabrication of thin protein-doped polycrystalline films. Rapid Commun. Mass Spectrom. 1994, 8 (2), 199-204.
59. Vorm, O.; Roepstorff, P.; Mann, M., Improved Resolution and Very High Sensitivity in MALDI TOF of Matrix Surfaces Made by Fast Evaporation. Analytical Chemistry 1994, 66 (19), 3281-3287.

REFERENCES—EXAMPLE 3

1. M. Rai, A. Yadav, and A. Gade, Silver nanoparticles as a new generation of antimicrobials. Biotech. Adv., 2009, 27 (1), 76-83.
2. J. Kim, E. Kuk, K. N. Yu, J. H. Park, S. J. Park, S. H. Kim, Y. K. Park, Y. H. Park, C. Y. Hwang, Y. K. Kim, Y. S. Lee, D. H. Jeong, and M. H. Cho, Antimicrobial effects of silver nanoparticles. Nanomed., 2007, 3 (1), 95-101.
3. W. Cai, T. Gao, H. Hong, and J. Sun, Applications of gold nanoparticles in cancer nanotechnology. Nanotechnol. Sci. Appl., 2008, 1, 17-32. PMCID: PMC3808249
4. P. V. AshaRani, G. L. K. Mun, M. P. Hande, and S. Valiyaveettil, Cytotoxicity and genotoxicity of silver nanoparticles in human cells. Nano., 2009, 3, 279-290. PMID: 19236062
5. I. H. El-Sayed, X. Huang, and M. A. El-Sayed, Surface Plasmon Resonance Scattering and Absorption of anti-EGFR Antibody Conjugated Gold Nanoparticles in Cancer Diagnostics: Applications in Oral Cancer. Nano Lett., 2005, 5 (5), 829-834.
6. D. Baram-Pinto, S. Shukla, N. Perkas, A. Gedanken, and R. Sarid, Inhibition of herpes simplex virus type 1 infection by silver nanoparticles capped with mercaptoethane sulfonate. Bioconjugate Chem., 2009, 20 (8), 1497-1502.
7. H. Lara, N. Ayala-Nuñez, L. Ixtepan-Turrent, and C. Rodriguez-Padilla, Mode of antiviral action of silver nanoparticles against HIV-1. J. Nanobiotechnol., 2010, 8:1.
8. L. Lu, R. W. Sun, R. Chen, C. K. Hui, C. M. Ho, J. M. Luk, G. K. Lau, and C. M. Che, Silver nanoparticles inhibit hepatitis B virus replication. Antivir. Ther., 2008, 13(2), 253-262.
9. S. Bhattacharyya, R. A. Kudgus, R. Bhattacharya, and P. Mukherjee, Inorganic nanoparticles in cancer therapy. Pharm. Res., 2011, 28(2), 237-259. PMCID: PMC3072278

10. S. Gurunathan, J. W. Han, V. Eppakayala, M. Jeyaraj, and J. Kim, Cytotoxicity of Biologically Synthesized Silver Nanoparticles in MDA-MB-231 Human Breast Cancer Cells. Biomed. Res. Int., 2013, 2013, 535796. PMCID: PMC3722883

11. D. J. Bharali, M. Khalil, M. Gurbuz, T. M. Simone, and S. A. Mousa, Nanoparticles and cancer therapy: a concise review with emphasis on dendrimers. Int. J. Nanomed., 2009, 4, 1-7. PMCID: PMC2720735

12. K. C. Nguyen, V. L. Seligy, A. Massarsky, T. W. Moon, P. Rippstein, J. Tan, and A. F. Tayabali, Comparison of toxicity of uncoated and coated silver nanoparticles. J. Phys.: Conf. Ser., 2013, 429(1), 012025.

13. W. Jiang, B. Y. S. Kim, J. T. Rutka, and W. C. W. Chan, Nanoparticle-mediated cellular response is size-dependent. Nat. Nanotechnol., 2008, 3, 145-150.

14. B. D. Chithrani, A. A. Ghazani, and W. C. W. Chan, Determining the size and shape dependence of gold nanoparticle uptake into mammalian cells. Nano Lett., 2006, 6:4, 662-668.

15. E. A. Thompson, E. Graham, C. M. MacNeill, M. Young, G. Donati, E. M. Wailes, B. T. Jones, and N. H. Levi-Polyachenko, Differential response of MCF7, MDA-MB-231, and MCF 10A cells to hyperthermia, silver nanoparticles and silver nanoparticle-induced photothermal therapy. Int. J. Hyperthermia., 2014, 30(5), 312-323.

16. A. El-Hussein, I. Mfouo-Tynga, M. Abdel-Harith, and H. Abrahamse, Comparative study between the photodynamic ability of gold and silver nanoparticles in mediating cell death in breast and lung cancer cell lines. J. Photochem. Photobiol. B: Bio., 2015, 153, 67-75.

17. H. çiftçi, M. Türk, U. Tamer, S. Karahan, Y. Menemen, Silver nanoparticles: cytotoxic, apoptotic, and necrotic effects on MCF-7 cells. Turk. J. Biol., 2013, 37, 573-581.

18. A. A. Kajani, A.-K. Bordbar, S. H. Zarkesh Esfahani, A. R. Khosropour, and A. Razmjou, Green synthesis of anisotropic silver nanoparticles with potent anticancer activity using *Taxus baccata* extract. RCS Adv., 2014, 4, 61394-61403.

19. M. A. Franco-Molina, E. Mendoza-Gamboa, C. A. Sierra-Rivera, R. A. Gómez-Flores, P. Zapata-Benavides, P. Castillo-Tello, J. M. Alcocer-González, D. F. Miranda-Hernandez, R. S. Tamez-Guerra, and C. Rodriguez-Padilla, Antitumor activity of colloidal silver on MCF-7 human breast cancer cells. J. Exp. Clin. Canc. Res., 2010, 29:148.

20. M. Jannathul Firdhouse, and P. Lalitha, Apoptotic efficacy of biogenic silver nanoparticles on human breast cancer MCF-7 cell lines. Prog. Biomater., 2015, 4, 113-121. PMCID: PMC4636515

21. M. Abul Farah, M. Ajmal Ali, S.-M. Chen, Y. Li, F. M. Al-Hemaid, F. M. Abou-Tarboush, K. M. Al-Anazi, and J. Lee, Silver nanoparticles synthesized from *adenium obesum* leaf extract induced DNA damage, apoptosis and autophagy via generation of reactive oxygen species. Colloid. Surface. B., 2016, 141, 158-169.

22. B Gajendran, A. Chinnasamy, P. Durai, J. Raman, and M. Raman, Biosynthesis and characterization of silver nanoparticles from *Datura inoxia* and its apoptotic effect on human breast cancer cell line MCF7. Mater. Lett., 2014, 122, 98-102.

23. S. Gurunathan, J. W. Han, A. A. Dayem, V. Eppakayala, J. H. Park, S.-G. Cho, K. J. Lee, and J.-H. Kim, Green synthesis of anisotropic silver nanoparticles and its potential cytotoxicity in human breast cancer cells (MCF-7). J. Ind. Eng. Chem., 2013, 19, 1600-1605.

24. M. I. Sriram, S. B. M. Kanth, K. Kalishwaralal, S. Gurunathan, Antitumor activity of silver nanoparticles in Dalton's Lymphoma ascites tumor model. Int. Jour. Nanomed., 2010, 5, 753-762. PMCID: PMC2962271

25. L. Longenberger, and G. Mills, Formation of Metal Particles in Aqueous Solutions by Reactions of Metal Complexes with Polymers. J. Phy. Chem., 1995, 99 (2), 475-478.

26. S. D. Steichen, M. Caldorera-Moore, and N. A. Peppas. A review of current nanoparticle and targeting moieties for the delivery of cancer therapeutics. Eur. J. Pharm. Sci. 2013, 48, 416-427. PMCID: PMC3619023

27. R. Kovvuru, P. E. Mancilla, A. B. Shirode, T. M. Murray, T. J. Begley, and R. Reliene, Oral ingestion of silver nanoparticles induces genomic instability and DNA damage in multiple tissues. Nanotoxicology., 2015, 9(2), 162-171.

28. L. Shang, K. Nienhaus, and G. U. Nienhaus, Engineered nanoparticles interacting with cells: size matters. J. Nanobiotech., 2014, 12:5

29. G. A. Eiceman and Z. Karpas, Ion Mobility Spectrometry, CRC Press, Boca Raton, 2 edn., 2005.

30. C. S. Creaser, J. R. Griffiths, C. J. Bramwell, S. Noreen, C. A. Hill, and C. L. Paul Thomas, Ion mobility spectrometry: a review. Part 1. Structural analysis by mobility measurement. Analyst., 2004, 129, 984-994.

31. M. B. J. Wijesundara, E. Fuoco, and L. Hanley, Preparation of Chemical Gradient Surfaces by Hyperthermal Polyatomic Ion Deposition: A New Method for Combinatorial Materials Science. Langmuir., 2001, 17, 5721-5726.

32. S. Nagaoka, T. Matsumoto, K. Ikemoto, M. Mitsui, and A. Nakajima, Soft-Landing Isolation of Multidecker V2(benzene)3 Complexes in an Organic Monolayer Matrix: An Infrared Spectroscopy and Thermal Desorption Study. J. Am. Chem. Soc. 2007, 129(6), 1528-1529.

33. S. J. Davila, D. O. Birdwell, and G. F. Verbeck, Drift-tube softlanding for the production and characterization of materials: Applied to Cu clusters. Rev. Sci. Inst. 2010, 81, 034104.

34. O. Hadjar, P. Wang, J. H. Futrell, Y. Dessiaterik, Z. Zhu, J. P. Cowin, M. J. Iedema, and J. Laskin, Design and Performance of an Instrument for Soft Landing of Biomolecular Ions on Surfaces. Anal. Chem., 2007, 79, 6566-6574.

35. W. P. Peng, M. P. Goodwin, Z. Nie, M. Volny, Z. Ouyang, and R. G. Cooks, Ion Soft Landing Using a Rectilinear Ion Trap Mass Spectrometer. Anal. Chem., 2008, 80, 6640-6649.

36. P. S. Mayer, F. Turecek, H.-N. Lee, A. A. Scheidemann, T. N. Olney, F. Schumacher, P. Strop, M. Smrcina, M. Patek, and D. Schirlin, Preparative Separation of Mixtures by Mass Spectrometry. Anal. Chem. 2005, 77(14), 4378-4384.

37. B. L. Walton, and G. F. Verbeck, Soft-landing ion mobility of silver clusters for small-molecule matrix-assisted laser desorption ionization mass spectrometry and imaging of latent fingerprints. Anal. Chem., 2014, 86, 8114-8120.

38. G. Verbeck, W. Hoffmann, and B. Walton, Soft-Landing preparative mass spectrometry: Critical Review. Analyst 2012, 137, 4393-4407.

39. W. Hoffmann, and G. Verbeck, Toward a Reusable SERS Substrate by Soft-Landing Ion-Mobility. App. Spect. 2013, 67, 6, 656.

40. M. M. Kemp, A. Kumar, S. Mousa, T. J. Park, P. Ajayan, N. Kubotera, S. A. Mousa, and R. J. Linhardt. Synthesis of gold and silver nanoparticles stabilized with glycosaminoglycans having distinctive biological activities. Biomacromolecules 2009, 10, 589-595. PMCID: PMC2765565
41. R. Bhattacharya, and P. Mukherjee. Biological properties of "naked" metal nanoparticles. Adv. Drug Deliv. Rev. 2008, 60, 1289-1306.
42. P. C. Lee, and D. Meisel, Absorption and Surface-Enhanced Raman of Dyes on Silver and Gold Sols. J. Phys. Chem., 1982, 86, 3391-3395.
43. J. A. Creighton, C. G. Blatchford, and M. G. Albrecht, Plasma resonance enhancement of Raman scattering by pyridine absorbed on silver or gold sol particles of size comparable to the excitation wavelength. J. Chem. Soc., Faraday Trans. 2, 1979, 75, 790-798.
44. S. Ayyappan, G. R. Srinivasa, G. N. Subbanna, and C. N. R. Rao, Nanoparticles of Ag, Au, Pd, and Cu produced by alcohol reduction of the salts. J. Mater. Res., 1997, 12, 398-401.
45. S. Arora, J. Jain, J. M. Rajwade, and K. M. Paknikar, Cellular responses induced by silver nanoparticles: In vitro studies. Toxicol. Lett., 2008, 179, 93-100.
46. H. Schneidewind, T. Schiller, K. K. Strelau, K. Weber, D. Cialla, M. Diegel, R. Mattheir, A. Berger, R. Möller, and J. Popp. The morphology of silver nanoparticles prepared by enzyme-induced reduction. Beilstein J. Nanotechnol., 2012, 3, 404-414. PMCID: PMC3388365
47. H. Korbekandi, Z. Ashari, S. Iravani, and S. Abbasi, Optimization of biological synthesis of silver nanoparticles using *Fusarium oxysporum*. Iran. J. Pharm. Res., 2013, 12 (3): 289-298.
48. S.-B. Wen, X. Mao, R. Greif, and R. E. Russo, Experimental and theoretical studies of particle generation after laser ablation of copper with a background gas at atmospheric pressure. J. Appl. Phys., 2007, 12, 123105-123115.
49. D. B. Geohegan, A. A. Puretzky, G. Duscher, and S. J. Pennycook, Time-resolved imaging of gas phase nanoparticle synthesis by laser ablation. Appl. Phys. Lett., 1998, 72, 23.
50. S. Gilb, P. Weis, F. Furche, R. Ahlrichs, M. M. Kappes, Structures of small gold cluster cations (Aun+, n<14): Ion mobility measurements versus density functional calculations. J. Chem. Phys., 2002, 116, 4094.
51. A. Menéndez-Manjón, and S. Barcikowski, Hydrodynamic size distribution of gold nanoparticles controlled by repetition rate during pulsed laser ablation in water. Appl. Surf. Sci., 2011, 257, 4285-4290.
52. F. Bourquard, A. Loir, C. Donnet, and F. Garrelie, In situ giagnostic of the size distribution of nanoparticles generated by ultrashort pulsed laser ablation in vacuum. Appl. Phys. Lett., 2014, 104, 104101
53. A. Hahn, S. Barcikowski, and B. Chichkov, Influences on Nanoparticle Production during Pulsed Laser Ablation. J. Laser Micro/Nanoeng., 2008, 3, 2, 73-77.
54. S. Rokushika, and H. Hatano, Resolution measurement for ion mobility spectrometry. Anal. Chem., 1985, 57, 1902-1907.
55. J. D. Keelor, P. Dwivedi, and F. M. Fernandez, An Effective Approach for Coupling Direct Analysis in Real Time with Atmospheric Pressure Drift Tube Ion Mobility Spectrometry. J. Am. Soc. Mass Spec. 2014, 25, 1538-1548.
56. K. M. Roscioli, J. A. Tufariello, X. Zhang, S. X. Li, G. H. Goetz, G. Cheng, W. F. Siems, and H. H. Hill Jr., Desorption electrospray ionization (DESI) with atmospheric pressure ion mobility spectrometry for drug detection. Analyst, 2014, 139, 1740-1750.
57. X. Tang, J. E. Bruce, and H. H. Hill Jr., Design and performance of an atmospheric pressure ion mobility Fourier transform ion cyclotron resonance mass spectrometer. Rapid Comm. Mass Spec., 2007, 21, 1115-1122.
58. B. H. Clowers, P. Dwivedi, W. E. Steiner, H. H. Hill Jr., Separation of Sodiated Isobaric Disaccharides and Trisaccharides Using Electrospray Ionization-Atmospheric Pressure Ion Mobility-Time of Flight Mass Spectrometry. J. Am. Soc. Mass Spec., 2005, 16, 660-669.
59. A. Adamov, T. Mauriala, V. Teplov, J. Laakia, C. S. Pedersen, T. Kotiaho, and A. A. Sysoev, Characterization of a high resolution drift tube ion mobility spectrometer with a multi-ion source platform. Int. J. Mass Spec., 2010, 298, 24-29.
60. A. Sysoev, A. Adamov, J. Viidanoja, R. A. Ketola, R. Kostiainen, and T. Kotiaho, Development of an ion mobility spectrometer for use in an atmospheric pressure ionization ion mobility spectrometer/mass spectrometer instrument for fast screening analysis. Rapid Commun. Mass Spec., 2004, 18, 3131-3139.
61. G. Verbeck, B. Ruotolo, K. Gillig, and D. Russel, Resolution Equations for High-Field Ion Mobility. J. Am. Soc. Mass Spec., 2004, 15, 1320-1324.
62. H. E. Revercomb and E. A. Mason, Theory of plasma chromatography/gaseous electrophoresis. Review. Anal. Chem., 1975, 47, 970-983.
63. D. L. Holliday, and V. Speirs. Choosing the right cell line for breast cancer research. Breast Cancer Research 2011, 13 (215).
64. M. Phelps, D. Sturtevant, K. D. Chapman, K. D, and G. F. Verbeck. Nanomanipulation-Coupled Matrix-Assisted Laser Desorption/Ionization-Direct Organelle Mass Spectrometry: A Technique for the Detailed Analysis of Single Organelles. J. Am. Soc. Mass Spectrom., 2015, 27 (2), 187-193. PMID:26238327
65. M. Phelps, and G. F. Verbeck. A lipidomics demonstration of the importance of single cell analysis. Anal. Meth., 2015, 7, 3668-3670.
66. M. Phelps, J. Hamilton, and G. F. Verbeck. Nanomanipulation-coupled nanospray mass spectrometry as an approach for single cell analysis. Rev. Sci. Inst., 2014, 85, 124101.
67. D. K. Tripathi, S. Singh, S. Singh, R. Pandey, V. P. Singh, N.C. Sharma, S. M. Prasad, N. K. Dubey, and D. K. Chauhan. An Overview on Manufactured Nanoparticles in Plants: Uptake, translocation, accumulation and Phytotoxicity. Plant. Physiol. Bioch., 2017, 110, 2-12.
68. C. Sattler, F. Moritz, S. Chen, B. Steer, D. Kutschke, M. Irmler, J. Beckers, O. Eickelberg, P. Schmitt-Kopplin, H. Adler, and T. Stoeger. Nanoparticles Exposure Reactivates Latent Herpesvirus and Restores a Signature of Acute Infection. Part Fibre Toxicol., 2017, 14:2.
69. J. C. Boner. Nanoparticles as a Potential Cause of Pleural and Interstitial Lung Disease. Proc. Am. Thorac. Soc., 2010, 7(2), 138-141. PMID:20417587.

What is claimed is:
1. An apparatus comprising:
   an ionization region comprising a laser capable of releasing at least one of: metal ions, metal ion clusters, or metal nanoparticles, from a metal;
   an ion mobility region in communication with the metal comprising a plurality of electrically conductive concentric rings;

a soft landing area comprising a surface, wherein the soft landing area comprises a soft-landing ion mobility (SLIM) device or an atmospheric soft-landing ion mobility device; and a detector capable of detecting molecules, clusters or nanoparticles that land on the surface of the soft landing area.

2. The apparatus of claim 1, further comprising a safety housing to contain the laser or ions.

3. The apparatus of claim 1, wherein the apparatus is capable of operating at atmospheric pressure.

4. The apparatus of claim 1, wherein the ionization region comprises a laser is an incident beam laser, a pulsed laser, a Nd:YAG laser.

5. The apparatus of claim 1, wherein the metal is silver, gold, molybdenum, or nickel.

6. The apparatus of claim 1, wherein the apparatus is equipped to deposit the metal generated by laser ablation, vacuum hardware, and a manipulator for detector coverage.

7. The apparatus of claim 1, wherein a noble gas is introduced into at least one of: the ionization region, the ion mobility region or the movable soft landing area.

8. The apparatus of claim 1, wherein the detector is at least one of: secondary ion mass spectrometry (SIMS), infrared spectroscopy (IR), x-ray photoelectron spectroscopy (XPS), gas-chromatography (GC-MS), high-performance liquid chromatography (HPLC), or matrix-assisted laser desorption/ionization mass spectrometry (MALDI-MS).

9. The apparatus of claim 1, wherein the ion mobility region comprises a plurality of metal rings that are resistively coupled.

10. An apparatus comprising:
an ionization region comprising a laser capable of releasing at least one of: metal ions, metal ion clusters, or metal nanoparticles, from a metal;
an ion mobility region in communication with the metal comprising a plurality of electrically conductive concentric rings, wherein the ion mobility region comprises a plurality of metal rings that are resistively coupled;
a soft landing area comprising a surface; and
a detector capable of detecting molecules, clusters or nanoparticles that land on the surface of the soft landing area.

11. The apparatus of claim 10, further comprising a safety housing to contain the laser or ions.

12. The apparatus of claim 10, wherein the apparatus is capable of operating at atmospheric pressure.

13. The apparatus of claim 10, wherein the ionization region comprises a laser is an incident beam laser, a pulsed laser, a Nd:YAG laser.

14. The apparatus of claim 10, wherein the metal is silver, gold, molybdenum, or nickel.

15. The apparatus of claim 10, wherein the apparatus is equipped to deposit the metal generated by laser ablation, vacuum hardware, and a manipulator for detector coverage.

16. The apparatus of claim 10, wherein a noble gas is introduced into at least one of: the ionization region, the ion mobility region or the movable soft landing area.

17. The apparatus of claim 10, wherein the detector is at least one of: secondary ion mass spectrometry (SIMS), infrared spectroscopy (IR), x-ray photoelectron spectroscopy (XPS), gas-chromatography (GC-MS), high-performance liquid chromatography (HPLC), or matrix-assisted laser desorption/ionization mass spectrometry (MALDI-MS).

18. The apparatus of claim 10, wherein the soft landing area comprises a soft-landing ion mobility (SLIM) device or an atmospheric soft-landing ion mobility device.

* * * * *